US008547135B1

(12) United States Patent
Yarlagadda et al.

(10) Patent No.: US 8,547,135 B1
(45) Date of Patent: Oct. 1, 2013

(54) SELF-MODULATED VOLTAGE REFERENCE

(75) Inventors: Archana Yarlagadda, San Jose, CA (US); Dave Van Ess, Chandler, AZ (US); Jeffrey Dahlin, Kenmore, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/870,706

(22) Filed: Aug. 27, 2010

Related U.S. Application Data

(60) Provisional application No. 61/246,521, filed on Sep. 28, 2009, provisional application No. 61/237,802, filed on Aug. 28, 2009.

(51) Int. Cl.
*H03K 19/173* (2006.01)
*H03M 3/00* (2006.01)
*H03M 1/12* (2006.01)
*G05F 1/00* (2006.01)

(52) U.S. Cl.
USPC ............. 326/38; 323/281; 341/143; 341/155; 375/247

(58) Field of Classification Search
CPC ....... H03K 19/173; H03K 19/00; H03M 3/00; H04B 14/06
USPC ................ 326/37–41, 47, 101; 375/247, 36, 375/245; 341/143–155
See application file for complete search history.

(56) References Cited

U.S. PATENT DOCUMENTS

| 6,839,387 | B1 * | 1/2005 | Mittel ............................. 375/247 |
| 7,956,783 | B2 * | 6/2011 | Geen ............................. 341/143 |
| 7,994,817 | B2 * | 8/2011 | Rohe et al. ....................... 326/38 |
| 2008/0278360 | A1 * | 11/2008 | Koli ............................. 341/143 |
| 2008/0310221 | A1 * | 12/2008 | Baker ........................ 365/185.2 |
| 2009/0015304 | A1 * | 1/2009 | Yin et al. ....................... 327/162 |
| 2010/0052733 | A1 | 3/2010 | Yamamoto et al. |
| 2010/0066328 | A1 | 3/2010 | Shimizu et al. |
| 2010/0066330 | A1 | 3/2010 | Yamamoto et al. |
| 2010/0067294 | A1 | 3/2010 | Do |
| 2010/0079114 | A1 | 4/2010 | So et al. |
| 2010/0109761 | A1 | 5/2010 | Akiyama et al. |
| 2010/0109763 | A1 | 5/2010 | Naka et al. |
| 2010/0110060 | A1 | 5/2010 | Lin et al. |
| 2010/0123612 | A1 | 5/2010 | Zamprogno et al. |
| 2010/0188274 | A1 * | 7/2010 | Geen ............................. 341/131 |
| 2010/0244894 | A1 * | 9/2010 | Beal et al. ....................... 326/41 |
| 2011/0063930 | A1 * | 3/2011 | Baker ...................... 365/189.15 |

FOREIGN PATENT DOCUMENTS

WO    2009143760 A1    12/2009

* cited by examiner

*Primary Examiner* — Shawki Ismail
*Assistant Examiner* — Dylan White

(57) ABSTRACT

A self-modulated voltage reference circuit may generate a reference voltage by receiving an internal reference voltage of a programmable device at a first input of a comparator block of the programmable device, receiving a feedback voltage at a second input of the comparator block, generating a pulse density modulated (PDM) signal based on a difference between the reference voltage and the feedback voltage, outputting the PDM signal at a digital output pin of the programmable device, and filtering the PDM signal to generate the output reference voltage.

28 Claims, 46 Drawing Sheets

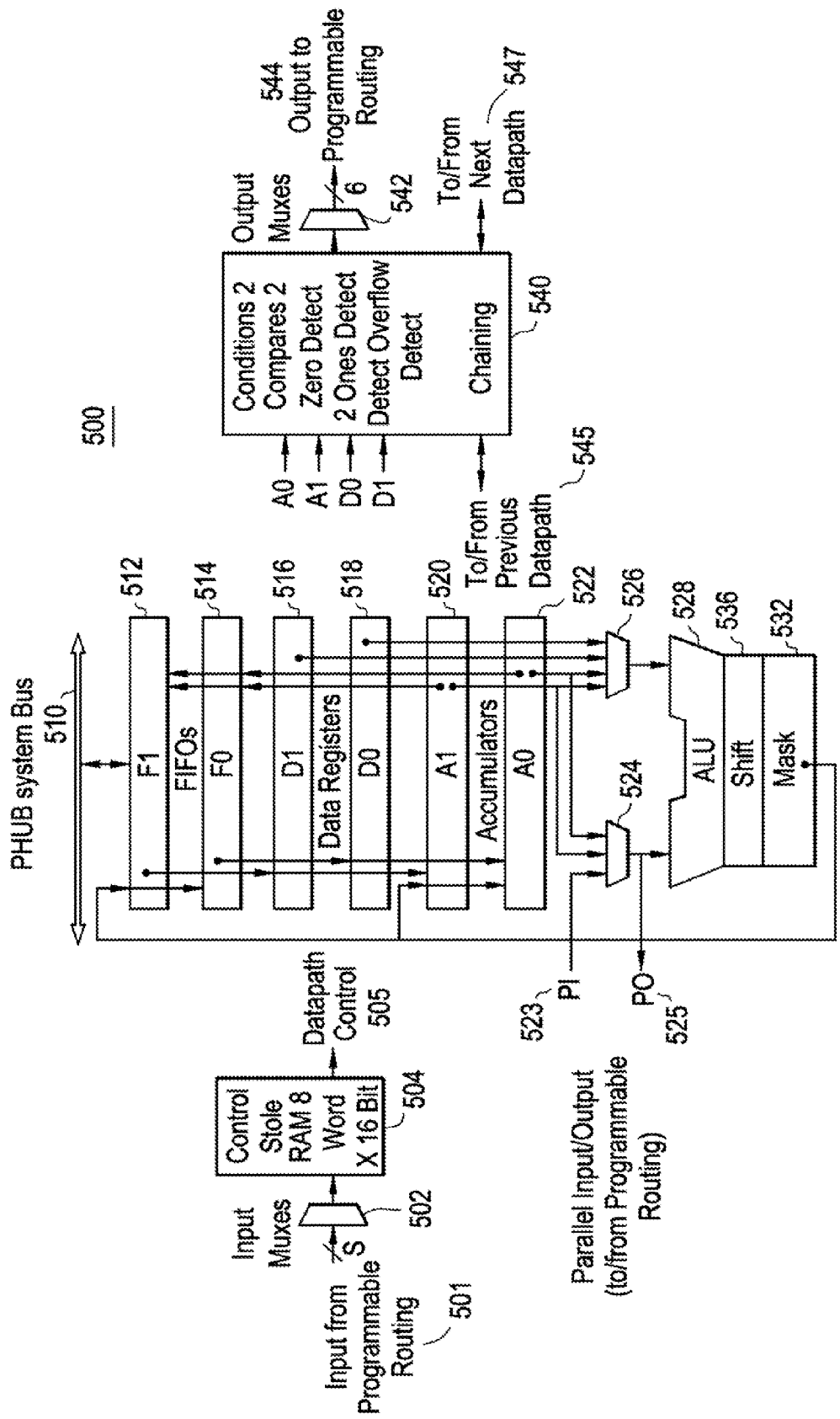

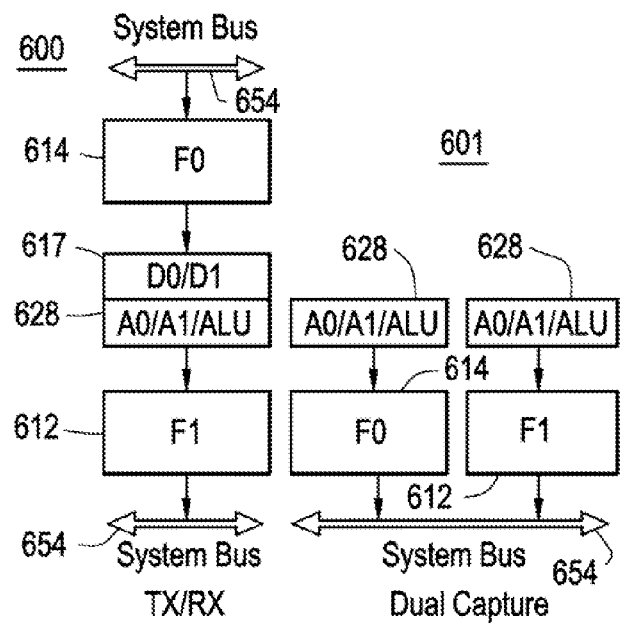
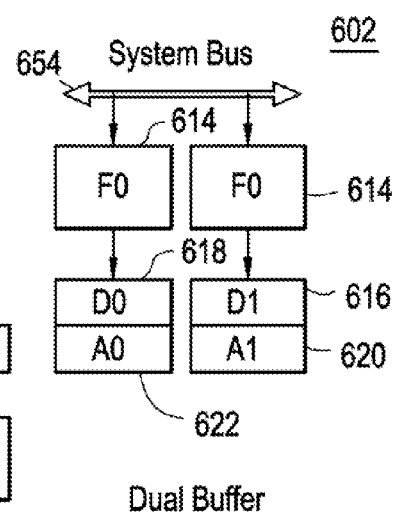
FIG. 6A FIG. 6B FIG. 6C
TX/RX  Dual Capture  Dual Buffer
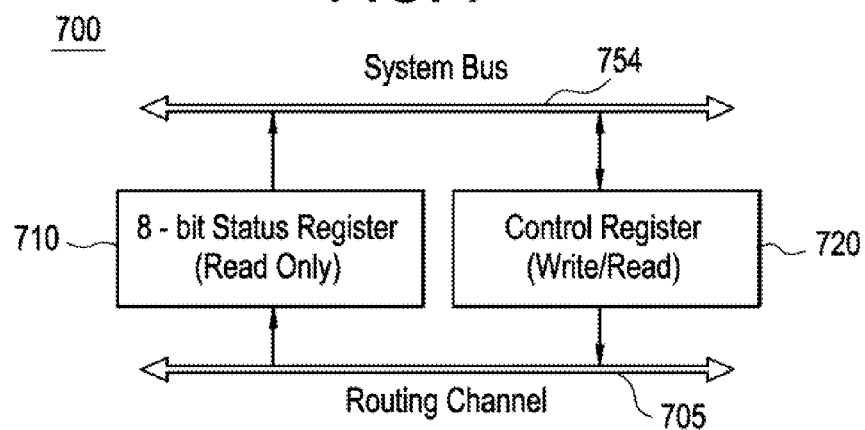
FIG. 7

Interrupt and DMA Processing in IDMUX

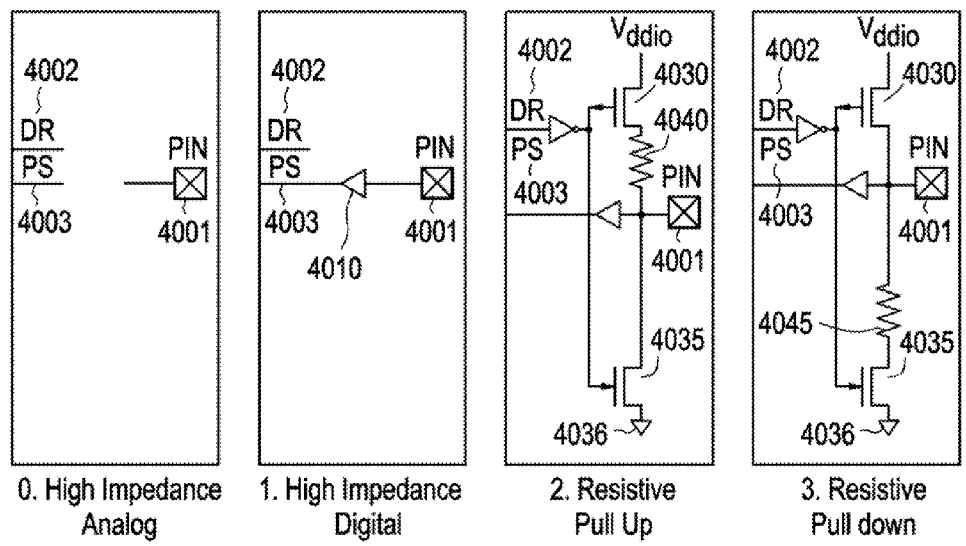
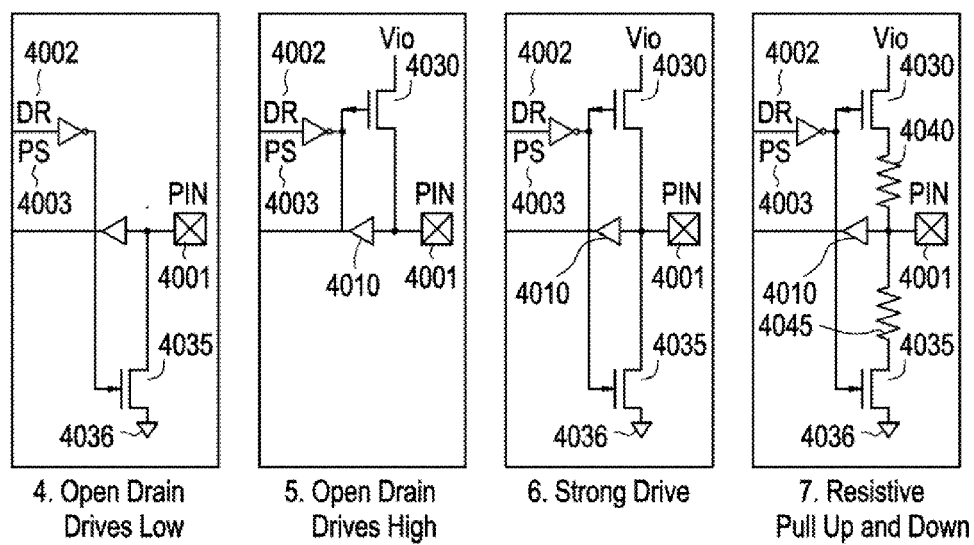

SELF-MODULATED VOLTAGE REFERENCE

RELATED APPLICATIONS

This application claims the benefit of U.S. Provisional Patent Application No. 61/237,802, filed Aug. 28, 2009. This application also claims the benefit of U.S. Provisional Patent Application No. 61/246,521, filed Sep. 28, 2009.

TECHNICAL FIELD

The present disclosure relates generally to programmable microcontrollers, and more specifically to voltage reference circuits in programmable microcontrollers.

BACKGROUND

Microcontrollers may have embedded processors, memories and special function analog and digital circuits. Analog circuits found in conventional microcontrollers include, for example, Continuous Time (CT) amplifiers having preset functions with given functional parameters. For instance, a CT analog amplifier might be configured as a fixed function circuit, such as a voltage amplifier, in which certain parameters, such as gain or bandwidth, might be altered by programming.

Switched Capacitor (SC) analog circuits are also frequently incorporated into microcontroller designs. SC analog circuits are somewhat more versatile than CT analog circuits in that it might be possible to alter both the circuit function as well as the parameters of the circuit function by programming. However, both CT and SC analog circuits found in conventional microcontrollers generally require programming before utilization, and neither can be dynamically programmed (programmed "on-the-fly"). General purpose digital circuits are frequently included in a microcontroller implementation. Such digital circuits are pre-programmed to realize certain digital functions such as logical operations, arithmetical functions, counting, and the like. These digital circuits are generally in the form of a Programmed Logic Array (PLA) or FPGA. Furthermore, such digital circuits that require pre-programming are generally not dynamically programmable (programmable "on-the-fly"). The main difficulty is in the generality of such a digital circuit, which requires an excessive amount of digital logic, which in turn occupies a large area on a semiconductor chip as well as an increased cost of manufacturing.

Several other design considerations related to microcontroller utilization either go unaddressed, or require separate functionalities to enable them. For instance, conventional designs do not offer a programmable analog circuit array with both CT analog circuits and SC analog circuits on the same semiconductor chip with a programmable array of digital circuits. As a result, realization of a function requiring complex communication between analog circuits and digital circuits often requires the use of multiple semiconductor chips. Further, conventional microcontroller realizations generally require pre-programming and cannot be dynamically programmed.

Another main focus in the development of electronic devices is reduction of size, while keeping the same feature set. This reduction in size is considered at every level of the system's design, from transistor size, to chip size, and to the size of the end product. Often, a reduced size corresponds to a reduced feature set. Sometimes, less commonly used features such as analog output pins may be removed to reduce chip size. However, in certain applications, a designer may still benefit from the ability to obtain an analog reference voltage from a chip having limited analog outputs.

BRIEF DESCRIPTION OF THE DRAWINGS

Embodiments are illustrated by way of example and are not intended to be limited by the figures of the accompanying drawings, in which like references indicate similar elements and in which:

FIG. 5 illustrates a datapath module of a UDB according to an embodiment;

FIG. 6A illustrates a FIFO configured for a transmit/receive (TXRX) function according to an embodiment;

FIG. 6B illustrates a FIFO configured dual capture function according to an embodiment;

FIG. 6C illustrates a FIFO configured for dual buffer function according to an embodiment;

FIG. 7 illustrates a UDB status and control module according to an embodiment;

FIG. 40A illustrates a pin configured as high-impedance analog according to an embodiment;

FIG. 40B illustrates a pin configured as high-impedance digital according to an embodiment;

FIG. 40C illustrates a pin configured resistive pull up according to an embodiment;

FIG. 40D illustrates a pin configured as resistive pull down according to an embodiment;

FIG. 40E illustrates a pin configured as open drain drive low according to an embodiment;

FIG. 40F illustrates a pin configured as open drain drive high according to an embodiment;

FIG. 40G illustrates a pin configured as strong drive according to an embodiment;

FIG. 40H illustrates a pin configured as resistive pull up and down according to an embodiment;

DETAILED DESCRIPTION

Many applications using Programmable System-on-Chip (PSoC®) hardware convert analog signals into digital signals and perform operations on the signals in the digital domain or in firmware. Thus, many devices in the market targeting such applications have limited analog capabilities. Such devices may be limited to, for example, a comparator and Analog to Digital Convertor (ADC). Since an analog output pin requires an analog bus and also analog buffers to provide external drive capability, a large amount of die area can be saved by eliminating these pins, reducing the size of the device.

In certain applications, even though the signal processing may take place in the digital domain, it may still be useful to obtain an analog reference voltage from the device. For example, consider a system with an ADC range of 0V to 5V and receiving an input signal value varying in the range of ±20 mV. This input signal cannot be measured directly with the ADC. However, a DC offset may be added to the input signal using an external reference voltage, to shift the input signal into the range of the ADC. The offset may be compensated inside the firmware, after measurement.

In one embodiment, a self-modulated voltage reference feature may be implemented in chips with no analog output pins using a few external passive components. Alternatively, a self-modulated voltage reference may be implemented in a chip having analog output pins which are allocated or reserved for other purposes. In one embodiment, a self-modulated voltage reference may be implemented in a Programmable-System-on-Chip (PSoC).

Figure 1:
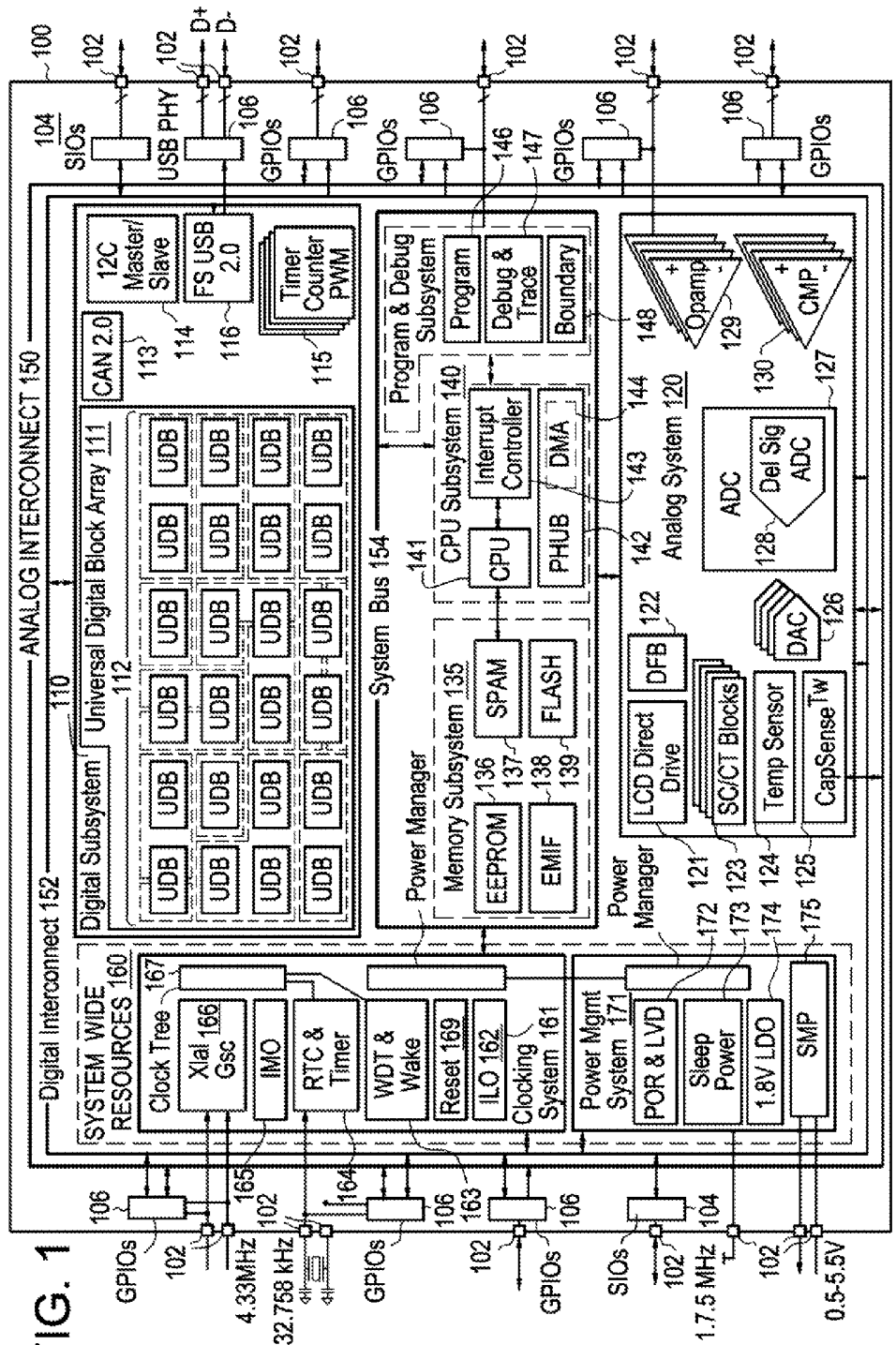
FIG. 1 illustrates a core architecture of a Programmable System-on-Chip (PSoC®) according to an embodiment.

FIG. 1 illustrates an embodiment of a core architecture 100 of a Programmable System-on-Chip (PSoC®), such as that used in the PSoC® family of products offered by Cypress Semiconductor Corporation (San Jose, Calif.). In one embodiment, the core architecture includes a digital subsystem 110. The digital subsystem 110 includes, for example, a universal digital block array 111 that comprises a plurality of universal digital blocks (UDBs) 112, a CAN 2.0 interface controller (CAN 2.0) 113, an PC Master and Slave controller (I²C M/S) 114, a plurality of multifunction digital blocks (MDBs) 115, and a full-speed USB 2.0 interface controller (FSUSB 2.0) 116, although other suitable types of digital blocks or elements may comprise the digital subsystem 110. MDBs 115 may be configured to perform common digital functions such as, for example, timers, counters, pulse-width modulators (PWMs), and the like. Digital subsystem 110 may also include communication peripherals such as, for example, Ethernet, high-speed USB, USB host, PCI Express, IEEE 1394 serial bus interface, SD card reader, and other like peripherals. The elements of digital system 110 may be coupled to digital interconnect 152 and/or to the system bus 154.

The core architecture 100 may also include an analog subsystem 120. The analog subsystem 120 may include, for example, an LCD direct drive block 121, a digital filter block (DFB) 122, a plurality of switched-capacitor/continuous time mixed-function analog (SC/CT) blocks 123, a temperature sensor block 124, a capacitive sensing (CapSense™) block 125, a plurality of digital-to-analog converters 126, an analog-to-digital converter (ADC) 127 including a delta-sigma ADC 128, a plurality of operational amplifiers (opamps) 129, a plurality of comparators (CMP) 130, and other suitable types of analog subsystem elements. For example, analog subsystem 120 may include successive approximation registers (SARs), programmable gain amplifiers (PGAs), and other like analog peripherals. The elements of analog subsystem 120 may be coupled to analog interconnect 150 and/or the system bus 154. CapSense™ block 125 may be coupled to the analog interconnect 150 separate from other elements of analog subsystem 120.

The core architecture 100 may also include memory subsystem 135, CPU subsystem 140 and programming and debug subsystem 145. Memory subsystem 135 may include, for example, an EEPROM block 136, synchronous random access memory (SRAM) 137, an external memory interface (EMIF) block 138, and flash memory (FLASH) 139. Memory subsystem 135 may also include, for example, a memory cache or memory accelerator, or other suitable types of memory blocks or elements. CPU subsystem 140 may include such processing blocks or elements as, for example, a CPU 141, an interrupt controller 142 and a bus bridge controller (DMA/PHUB) 143, which may include a direct memory access (DMA) controller 144. The program and debug subsystem 145 may include a programming block 146, a debug and trace block 147, and a boundary scan block 148. The program and debug subsystem may be coupled to the CPU subsystem 140. The CPU subsystem 140 and the memory subsystem 135 may be coupled to system bus 154. For example, the memory subsystem 135 may be coupled to the CPU subsystem 140 through the system bus 154. In one embodiment, FLASH 139 may be coupled to the CPU 141 directly.

The core architecture 100 may also include system-wide resources 160. System-wide resources 160 may include, for example, a clocking subsystem 161 and power management subsystem 171. Clocking subsystem 161 may include an internal low-speed oscillator block (ILO) 162, a watch-dog timer (WDT) and wake-up controller block 163, a real-time clock (RTC)/timer block 164, an internal main oscillator block (IMO) 165, a crystal oscillator block (Xtal Osc) 166, a clock tree 167, power manager 168, reset block 169, and other suitable types of system-wide resource blocks or elements. In one embodiment, the RTC/timer block 164 and the ILO 162 may be coupled to the WDT and wake-up controller block 163. In another embodiment, clock tree 167 may be coupled to Xtal Osc block 166 and IMO 165. Power management system 171 may include power-on-reset (POR) and low-voltage-detect (LVD) block 172, a sleep power block 173, a 1.8V internal regulator (LDO) 174, a switched mode power supply (e.g., switch-mode pump (SMP)) 175, and power manager 178. The switched mode power supply 175 may comprise, for example, a boost circuit, a buck circuit, or both. Power manager 178 may be coupled to power manager 168 of the clocking subsystem 161. In one embodiment, system-wide resources 160 may be coupled to system bus 154.

The core architecture 100 may also include a plurality of pins 102. Pins 102 may be used to couple elements of core architecture 100 to off-chip elements or route signals into or out of on-chip elements or to different pins of the device. Core architecture 100 may also include a plurality of special inputs/outputs (SIOs) 104 and general purpose inputs/outputs (GPIOs) 106. SIOs 104 may be coupled to digital interconnect 152. GPIOs 106 may be coupled to analog interconnect 150, digital interconnect 152, RTC/timer block 164, and/or Xtal Osc block 166. Core architecture 100 may also include USB inputs/outputs (USB PHY) 108, which may be coupled to FSUSB 2.0 116.

Digital Subsystem

Figure 2:
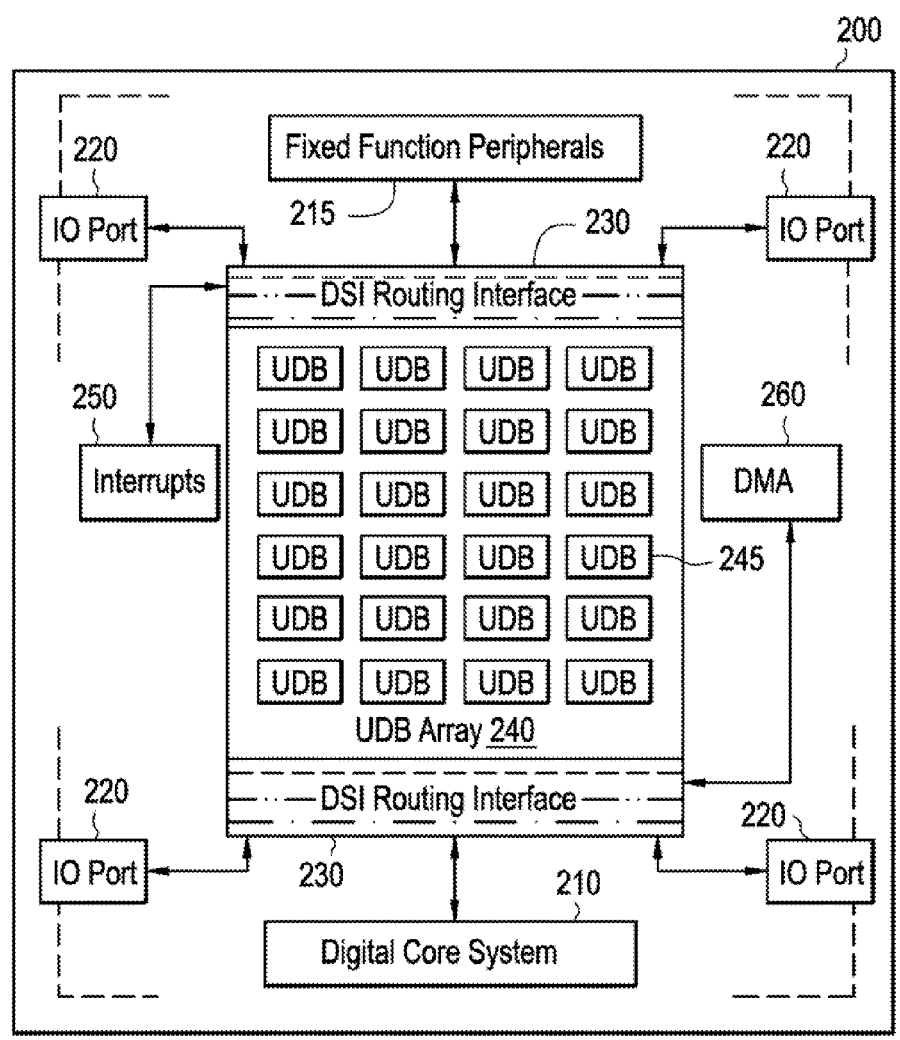
FIG. 2 illustrates a digital subsystem of the core architecture according to an embodiment.
Figure 9:
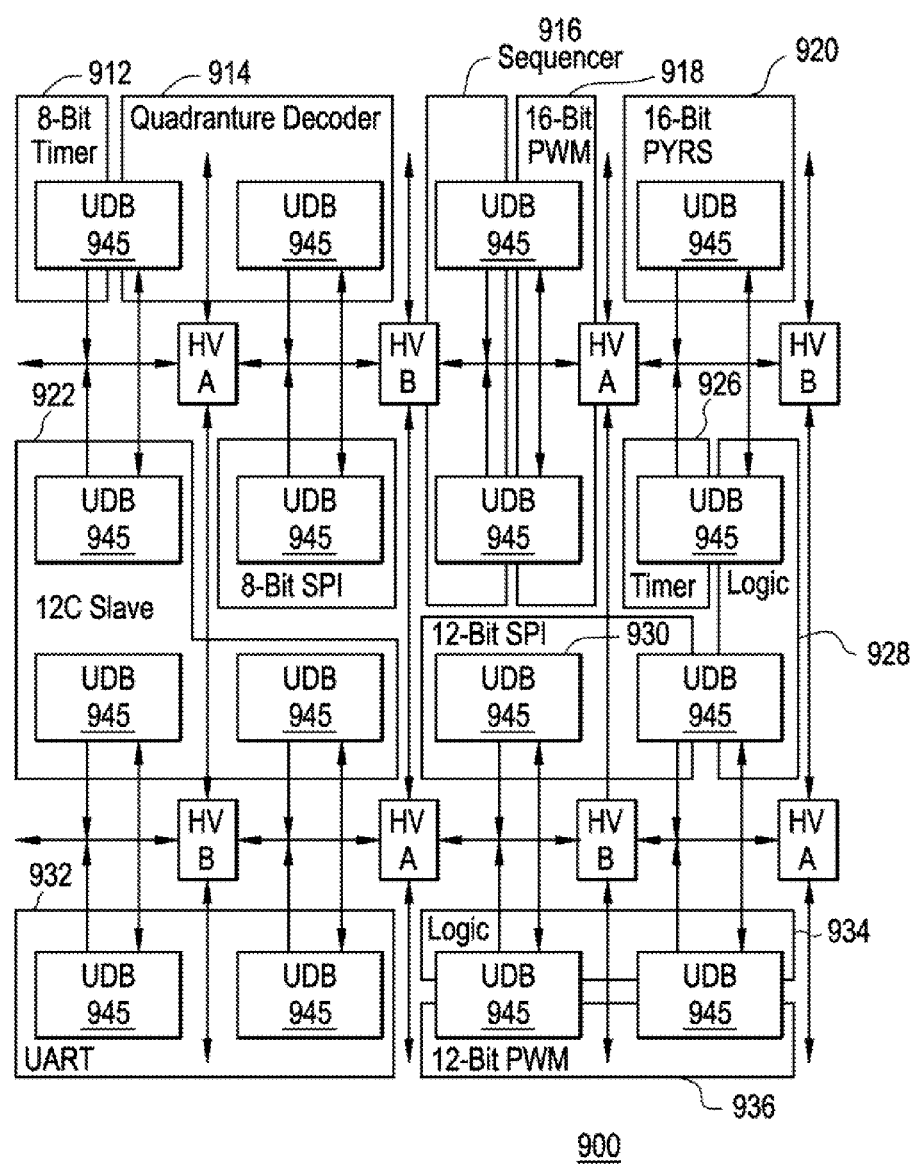
FIG. 9 illustrates a UDB array with digital functions mapped onto the array according to an embodiment.

FIG. 2 illustrates one embodiment 200 of digital subsystem 110 (FIG. 1). The digital subsystem 200 may be configurable to perform digital signal processing functions including, but not limited to, pulse-width modulators, timers, counters, I2C communication, SPI communication, UART communication, cyclical redundancy checks, pseudo-random sequence generators, digital LCD drivers, state machines, digital multiplexors and sequencers, decimators, shift registers, as well as combinations of logic gates, and other suitable types of digital signal processing functions. Mixed-signal operations enabled by the digital subsystem 200 may include, but are not be limited to, analog-to-digital converters, digital-to-analog converters, mixers, modulators and demodulators when coupled to the elements of the analog subsystem (e.g., 120, FIG. 1). The digital subsystem 200 includes highly-configurable universal digital blocks (e.g., UDBs, 112, FIG. 1), which may be configured to perform various digital functions alone or in combination with other UDBs. Further, UDBs may be partitioned and their resources shared to optimized mapping of digital functions onto an array of UDBs, an example of which is illustrated in FIG. 9 and discussed later in this specification.

Digital subsystem 200 may include, for example, a plurality of digital core system elements 210, such as clock dividers and memory and the like, fixed function peripherals 215 and IO ports 220, each of which may be coupled to a digital routing fabric (e.g., digital system interconnect (DSI) routing interface) 230. DSI routing interface 230 may be coupled to UDB array 240, which may include a plurality of UDBs 245. UDBs 245, fixed function peripherals 215, IO ports 220, interrupts 250, DMA 260 and digital core system elements 210 may be coupled to the DSI routing interface 230 to implement full-featured device connectivity. DSI routing interface 230 may allow any digital function or other feature to be routed to any pin 102 (FIG. 1) when coupled through UDB array 240. In one embodiment, UDBs 245 may be a collection of, for example, uncommitted logic (PLD) and structural logic optimized to create common embedded peripherals and customized functionality that are application- or design-specific. In one embodiment, UDBs 245 may be arranged in a matrix with a homogenous structure to allow flexible mapping of digital functions onto the UDB array 240. The USB array 240 may support extensive and flexible routing interconnects between UDBs 245 and DSI routing interface 230.

In another embodiment, UDBs 245 may be implemented using CPLD or FPGA elements singly, together, or in combination with, for example, configurable or fixed-function logic elements, memories and/or look-up tables (LUTs).

Figure 3:
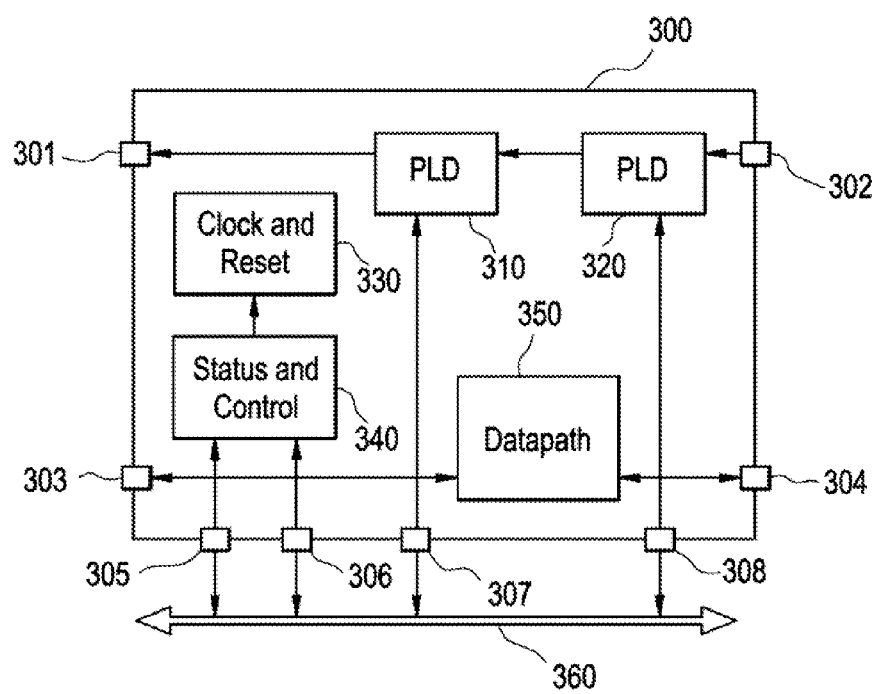
FIG. 3 illustrates a universal digital block (UDB) of the digital subsystem according to an embodiment.

FIG. 3 illustrates one embodiment of a UDB 300, for example as found in FIGS. 1 (112) and 2 (245). UDBs may be configured to perform digital functions alone or in combination with other UDBs by using a highly-configurable interconnect and chaining structure which allows UDBs to share unused resources with other groups of UDBs.

UDB 300 may include, for example, a first programmable logic device (PLD) 310 coupled to PLD chaining IO 301, routing channel 360 (e.g., via routing IO 307), and a second PLD 320. Second PLD 320 may be coupled to PLD chaining IO 302, first PLD 310, and routing channel 360 (e.g., via routing IO 308). UDB 300 may also include a clock and reset control block 330, which may be coupled to a status and control block 340. Status and control block 340 may be coupled to routing channel 360 through, for example, routing IOs 305 and 306. UDB 300 may also include a datapath module 350, which may be coupled to datapath modules of other UDBs through datapath chaining IOs 303 and 304. First and second PLDs 310 and 320 may take inputs from the routing channel 360 and form registered or combinational sum-of-products logic and may be used to implement state machines, state bits, combinational logic equations, and the like. In some embodiments, PLD configurations may be automatically generated from graphical primitives, where functions may be mapped to the PLD and the PLD may be configured based on the settings of those functions. In some embodiments, datapath module 350 may be, for example, a datapath containing structured logic to implement a dynamically configurable arithmetic logic unit (ALU) and a variety of compare configurations of conditions. The datapath module 350 may also contain input/output FIFOs to serve as the parallel data interface between the CPU system 140 (FIG. 1) and the UDB 300. The status and control block 340 may be used by the UDB 300 to interact with and synchronize to the CPU (e.g., 141, FIG. 1).

Figure 4:
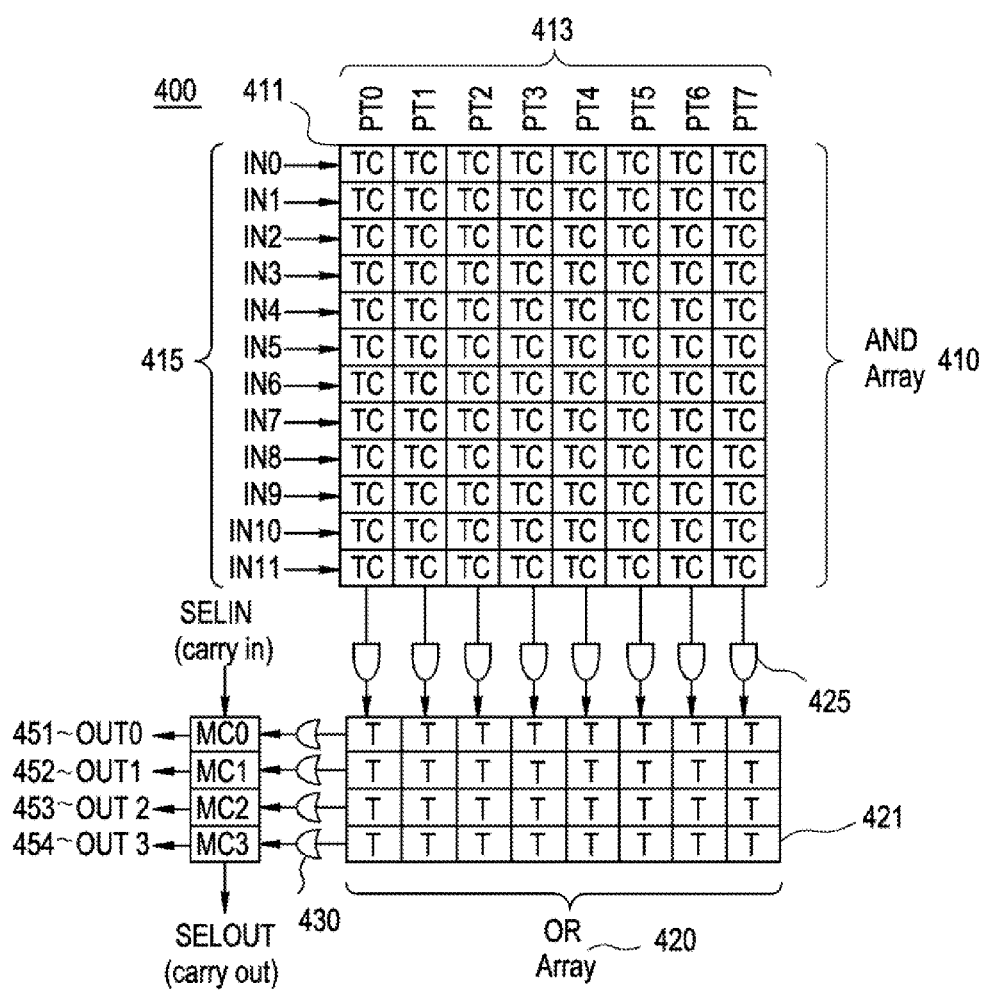
FIG. 4 illustrates a programmable logic device of a UDB according to an embodiment.

FIG. 4 illustrates one embodiment of a PLD 400 as part of a UDB (e.g., 300, FIG. 3) and linked to other UDBs and PLDs (e.g., first and second PLDs 310 and 320, FIG. 3). The PLD of a UDB may be configurable to provide generic logic, such as, for example, an AND gate, an OR gate, and/or a flip flop used for synthesizing Verilog written during development. PLD 400 may include an AND array 410 of inputs 415 and product terms 413. For each product term 413, the true (T) or complement (C) 411 of each input 415 may be selected. In one embodiment, there may be eight product terms 413 and twelve inputs 415. In other embodiments, there may be more or less than eight product terms 413 and twelve inputs 415. Product terms 413 from the AND array 410 may be ANDed through AND functions 425 to create an OR array 420 of product terms 421. The product terms 421 may be summed through OR functions 430 to create PLD outputs 451-454. The summed output of OR functions 430 may be between one and the maximum number of product terms wide. In the embodiment illustrated in FIG. 4, eight product terms are shown as part of PLD 400, although any suitable number of product terms can be used. In one embodiment, the width of the OR gate may be constant across all outputs. In another embodiment, the width of the OR gate may be variable.

FIG. 5 illustrates one embodiment of a datapath module 500 implemented in a UDB (e.g., 300, FIG. 3), as well as the chaining of multiple datapaths from multiple UDBs. The datapath module 500 includes, for example, an arithmetic logic unit (e.g., ALU 528), as well blank data registers that may be configured to implement, for example, a flag when the counter is finished, or, in another embodiment, a status output for when a timer reaches a threshold. The datapath module 500 allows chaining and MUXing of UDBs to created larger digital functions. For example, two UDBs may be chained together to provide higher-bit functionality. Datapath module 500 may include one or more inputs 501 from programmable routing to one or more input multiplexors 502. Inputs 501 couple the datapath module 500 to the routing matrix and provide the configuration for the datapath operation to perform in each cycle and the serial data inputs. Inputs may be routed from other UDBs, other device peripherals, device IO pins or other system elements. The output of the input multiplexors 502 may be coupled to a control store RAM 504. In one embodiment, control store RAM 504 may be a memory array, wherein unique configurations may be stored. Control store RAM 504 may be coupled to datapath control 505. PHUB system bus 510 may provide read- and write-access to, for example, datapath registers F1 512, F0 514, D1 516, D0 518, A1 520, and A0 522. Datapath registers 512-522 may be combined or used individually and routed through MUXes 524 and 526. Parallel input PI 523 may also be routed from programmable routing through MUX 524. MUXes 524 and 526 may have outputs that may be coupled to ALU 528. Parallel output PO 525 may also be routed from the output of MUX 524 to programmable routing. ALU 528 may be coupled to shift function 530. Shift function 530 may be coupled to mask function 532 (which, in turn, may be coupled to datapath registers F1 512 and A1 520). Outputs 544 to the programmable routing may be selected from the general conditions and the serial data outputs. Outputs 544 may be routed to other UDBs, device peripherals, interrupt controllers, the DMA, IO pins and other system elements. Datapaths may be chained through chaining block 540 with inputs from A0, A1, D0, D1, and data from previous datapath 545 to chaining block 540. Outputs 544 may be routed to the programmable routing through a plurality of output MUXes 542 or to/from the next datapath 547.

Datapath module 500 may include, for example, six primary working registers 512-522 (although any suitable number of working registers can be used), which may be accessed by the CPU 141 (FIG. 1) or DMA 144 (FIG. 1) during device operation. Primary working registers 512-522 may be categorized as accumulators (e.g., A0 522 and A1 520), data registers (e.g., D0 518 and D1 516) or FIFOs (e.g., F0 514 and F1 512). In one embodiment, accumulators may be sources and sinks for ALU 528 or sources for compares. Data registers may be sources for ALU 528 as well as for compares. FIFOs may be primary interfaces to system bus 154 (FIG. 1). FIFOs may also be data sources for the data registers and accumulators. FIFOs may also capture data from accumulators from ALU 528. In one embodiment, each FIFO may be four bytes deep, although each FIFO can be any suitable number of bytes deep.

ALU 528 may be configured to perform a variety of general-purpose functions by writing to ALU control registers (not shown) or sending control signals to ALU 528. Digital functions may include, but are not limited to, increment, Decrement, Add, Subtract, Logical AND, Logical OR, and Logical XOR. Digital functions may be reloaded into the ALU 528 and selected by writing to ALU control registers (not shown) by the CPU (e.g., 141, FIG. 1) or the DMA controller (e.g., 144, FIG. 1). Datapath module 500 may also be configured to perform functions independent of ALU 528 operation, such functions including, but not limited to, Shift Left, Shift Right, Nibble Swap, and Bitwise OR Mask.

Datapath module 500 may be optimized to implement embedded functions such as, for example, timers, counters, integrators, PWMs, pseudo-random sequence generators (PRSs), cyclic redundancy checks (CRCs), shifters, dead band generators and other suitable types of digital functions by writing to ALU control registers (not shown) with the CPU (e.g., 141, FIG. 1) or the DMA controller (e.g., 144, FIG. 1).

In one embodiment, datapath module 500 may be configured to chain conditions and signals with neighboring datapaths to create higher-precision arithmetic, shift, CRC or PRS functions, and other like functions that may use higher-precision arithmetic.

In one embodiment, ALU 528 may be shared in applications that are oversampled or do not need high clock rates. For example, carry and shift out data from ALU 528 may be stored in data registers and may be selected as inputs in subsequent cycles. Such a configuration may provide support for functions that require greater bit lengths than are available in a single datapath.

In one embodiment, conditions may be created by datapath module 500 that may include two compare operands. The two compares of datapath module 500 may have bit masking options. Compare operands may include accumulators A0 522 and A1 520 and data registers D0 518 and D1 516 in a variety of configurations. Other conditions created by datapath module 500 may include, for example, zero detect, all ones detect and overflow. Conditions may be the primary outputs of datapath module 500. The outputs of datapath module 500 may be driven out to the UDB routing matrix. In one embodiment, conditional computation can use the built-in chaining to neighboring UDBs to operate on wider data widths without the need to use routing resources.

In one embodiment, the most significant bit (MSB) of ALU 528 and shift function 530 may be programmatically specified to support variable-width CRC and PRS functions. In conjunction with masking function 532, the MSB of ALU 528 and shift function 530 may implement, for example, arbitrary-width timers, counters and shift blocks.

Datapath module 500 may include built-in support for single-cycle CRC computation and PRS generation of arbitrary width and arbitrary polynomials. CRC and PRS functions longer than, for example, eight bits may be implemented in conjunction with PLD logic, or built-in chaining may be used to extend the functions into neighboring UBDs.

FIFOs F0 514 and F1 512 may be, for example, four bytes deep (or other suitable bit depth) and configured independently as an input buffer or an output buffer. In the case of an input buffer, system bus 154 (FIG. 1) may write to the FIFO, and datapath module 500 may perform an internal read of the FIFO. In the case of an output buffer, datapath module 500 may perform an internal write to the FIFO, and system bus 154 may read from the FIFO. FIFOs F0 514 and F1 512 may generate a status that is selectable as a datapath output and can be driven to routing. Once driven to routing, the status generated by F0 514 and F1 512 may interact with sequencers to move the device between states or to execute ordered functions, interact with interrupts to generate tasks in software, interact with the DMA to store the status to a memory location or registers without consuming CPU overhead, or perform other like functions.

FIGS. 6A-6C illustrate example FIFO configurations which may be constructed, for example, with the datapath module 500 described with respect to FIG. 5. FIG. 6A illustrates an example FIFO configuration for a transmit/receive (TXRX) function 600. As illustrated in FIG. 6A, system bus 654 may be coupled to F0 614. F0 614 may be coupled to either datapath D0 or datapath D1 in block 617, and then coupled to either accumulator A0, accumulator A1, or ALU 528 (FIG. 5) in block 628. The output of block 628 may be coupled to F1 612. F1 612 may be coupled to system bus 654.

FIG. 6B illustrates an example FIFO configuration for a dual capture function 601. Accumulator A0, accumulator A1 or ALU 528 (FIG. 5) in block 628 may be coupled to either F0 614 or F1 612. F0 614 and F1 612 may be coupled to system bus 654.

FIG. 6C illustrates an example FIFO configuration for a dual buffer function 602. System bus 654 may be coupled to F0 614. F0 614 may be coupled to datapath 618 and accumulator 622. System bus 654 may be also coupled to F1 612. F1 612 may be coupled to datapath D1 616 and accumulator A1 620.

FIG. 7 illustrates a UDB status and control module 700 (e.g., 340, FIG. 3) according to one embodiment. The UDB status and control module 700 includes status and control registers 710 and 720, respectively, which may be accessed and set to, for example, enable, disable, configure and reconfigure the UDBs. The status and control module 700 routes data from the datapath and places that information into the status register 710. Signals from the datapath are then easily accessible by other system components without required datapath overhead.

UDB status and control module 700 includes routing channel 705. Routing channel 705 may be coupled to status register 710 and control register 720. Status register 710 and control register 720 may be coupled to system bus 754. In one embodiment, the bits of control register 720, which may be written to via the system bus 754, may be used to drive into the routing matrix and provide firmware with the opportunity to control the state of UDB processing. The status register 710 may allow the state of the UDB to be read out onto the system bus 754 directly from internal routing. Status register 710 and control register 720 may have programmable connections to the routing matrix, which allows routing connections to be made depending on the requirements of the application. It is noted that status register 710 and control register 720 are illustrated as each being 8-bits wide, although the width of each of the registers can be any suitable number of bits.

Figure 8:
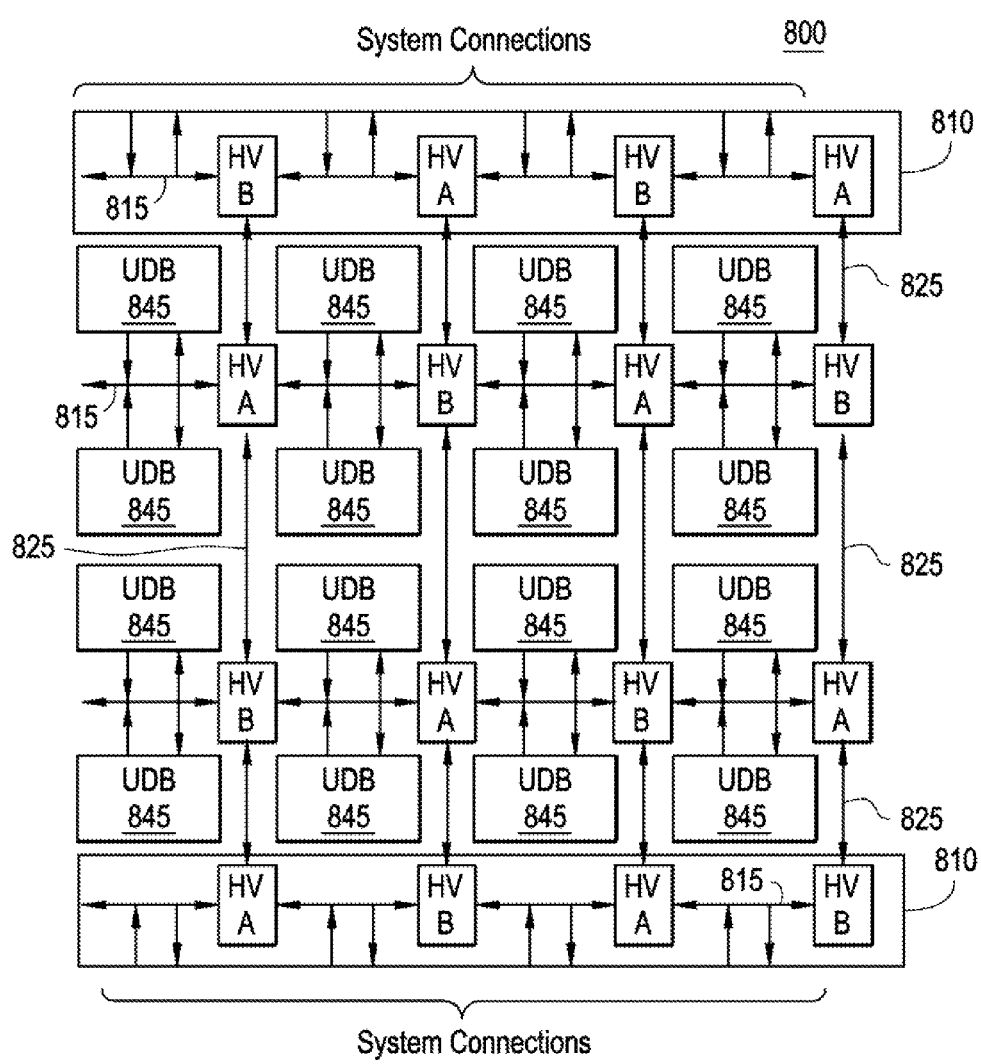
FIG. 8 illustrates a UDB array according to an embodiment.

FIG. 8 illustrates a UDB array 800 according to one embodiment. UDB array 800 includes DSI routing interfaces 810. Array 800 also includes horizontal and vertical (HV) routing channels 815 and 825. In one embodiment, HV routing channels 815 and 825 may include, for example, 96 wires, although any suitable number of wires or other connections may be used. HV routing channels 815 and 825, wire connections to UDBs 845, and the DSI routing interface 810 may be highly permutable. The permutability provides efficient automatic routing, which may allow wire-by-wire segmentation along the vertical and horizontal routing channels 815 and 825 to further increase routing flexibility and capability.

FIG. 9 illustrates a UDB array 900 according to one embodiment with digital functions mapped onto the UDB array 900. Appropriate functions may be implemented by configuring UDBs 945 in an array to perform any suitable type of digital functions. For purposes of illustration and not limitation, functions that are mapped onto the UDB array 900 include, for example, a first timer 912, a quadrature decoder 914, a sequencer 916, a first PWM 918, a PRS 920, an I2C slave 922, a first SPI 924, a second timer 926, first logic 928, a second SPI 930, a UART 932, second logic 934, and second PWM 936. In this embodiment, the primary programmable resources of UDBs are two PLDs, one datapath and one status/control register. These resources may be allocated independently. UDB PLDs, datapaths and status control registers may have independently selectable clocks and may be allocated to multiple unrelated functions. As an example, first timer 912 uses one datapath in a UDB 945, which allows other resources of UDB 945 to be used for other functions, such as quadrature encoder 914, which may require more PLD logic that one UDB can supply. Programmable resources in the UDB array 900 may be homogenous, allowing functions to be mapped to arbitrary boundaries in the array. While UDB array 900 has functions mapped to it in such a way as to consume all of its UDBs, application requirements may require a different set of digital functions that may not use all digital resources. Additionally, the mapped functions of FIG. 9 are intended to be representative of one application. UDB array 900 may be configured to implement a different set of functions or the same functions in a different configuration.

Figure 10:
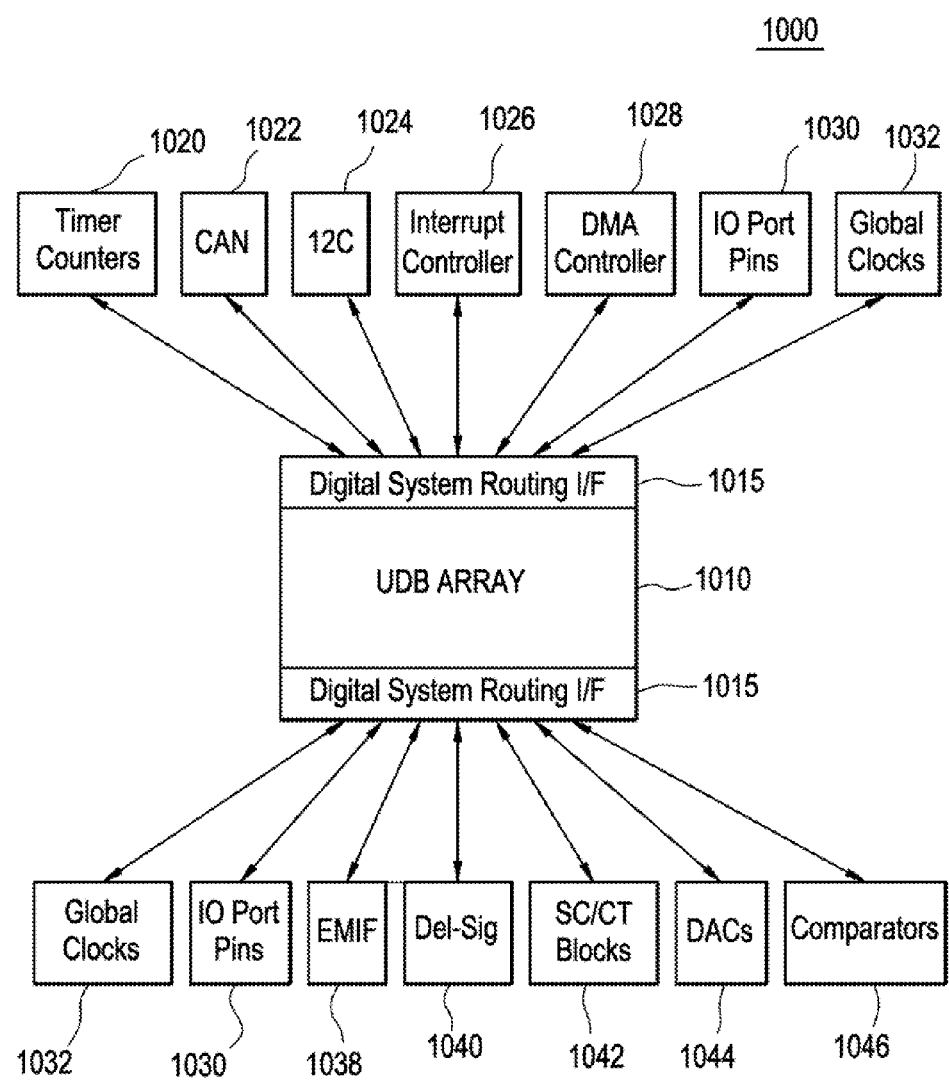
FIG. 10 illustrates a digital routing fabric in a system according to an embodiment.

FIG. 10 illustrates one embodiment of a DSI routing interface 1015 in an overall digital subsystem 1000. DSI routing interface 1015 may function as a continuation of the horizontal and vertical routing channels 815 and 825 (FIG. 8) at the top and bottom of an array 1010 of UDBs. The DSI routing interface 1015 may provide general purpose programmable routing between device peripherals such as UDBs (e.g., 112, FIG. 1), IOs (e.g., 104 and 106, FIG. 1), the analog subsystem (e.g., 120, FIG. 1), interrupts generated by the CPU (e.g., 141, FIG. 1), the DMA controller (e.g., 144, FIG. 1) and fixed function peripherals. The DSI routing interface 1015 may be used to send and receive signals to any digital resource. Signals may include, for example, inputs from IOs and peripherals, outputs from digital resources to other system elements, control signals and status queries.

In some embodiments, device peripherals that are connected by DSI routing interface 1015 may include timers and counters 1020, a CAN interface 1022, an I2C interface 1024, an interrupt controller 1026, a DMA controller 1028, port pins 1030, global clocks 1032, an EMIF 1038, delta-sigma ADCs 1040, SC/CT blocks 1042, DACs 1044, comparators 1046, IO ports (not shown) or any other suitable type of digital core or fixed function peripheral that may use programmable routing. Signals that may use programmable routing may include, but are not limited to:

interrupt requests from all digital peripherals in a system,
DMA requests from all digital peripherals in a system,
digital peripheral data signals that need flexible routing to IOs,
digital peripheral data signals that need connection to UDBs
connections to the interrupt and DMA controllers,
connections to IO pins, and
connections to analog system digital signals.

Figure 11:
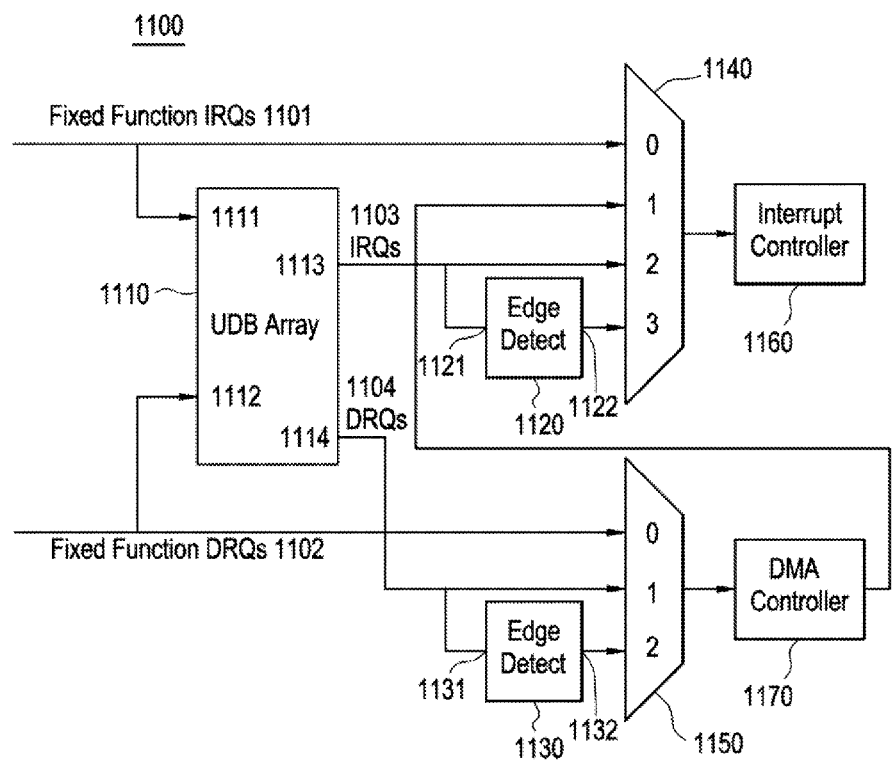
FIG. 11 illustrates an interrupt and DMA multiplexer according to an embodiment.

Interrupt and DMA routing may be made even more flexible in the DSI routing interface 1015, which may allow for more efficient and faster routing of signals and configuration of digital subsystem components. FIG. 11 illustrates one embodiment of an interrupt and DMA controller 1100. Fixed-function interrupt request lines (IRQs) 1101 may be routed into UDB array 1110 through input 1111 and out through output 1113. Fixed-function DRQs 1102 may be routed into UDB array 1110 through input 1112 and out through output 1114. IRQs 1103 may then be routed through an edge detect 1120 via input 1121 and output 1122 of the edge detect 1120. DRQs 1104 may then be routed through an edge detect 1130 via input 1131 and output 1132 of the edge detect 1130. Fixed-function DRQs, DRQs from the UDB array 1110, and the output 1132 of edge detect 1130 may be routed through MUX 1150 to the input of DMA controller 1170. Fixed-function IRQs, IRQs from the UDB array 1110, the output of DMA controller 1170 and the output 1122 of edge detect 1120 may be routed through MUX 1140 to interrupt controller 1160.

Figure 12A:
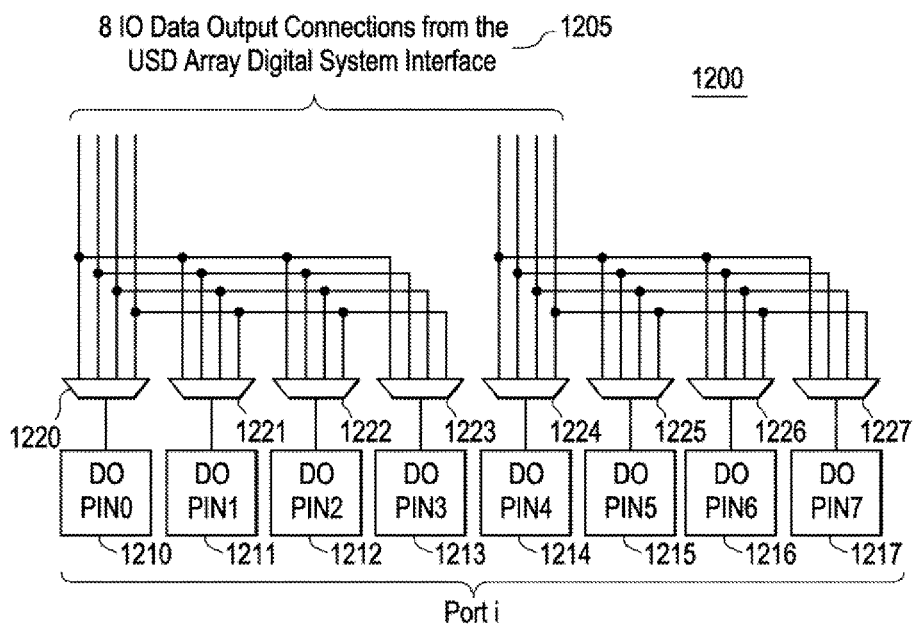
FIG. 12A illustrates an embodiment of IO pin output connectivity according to an embodiment.
Figure 12B:
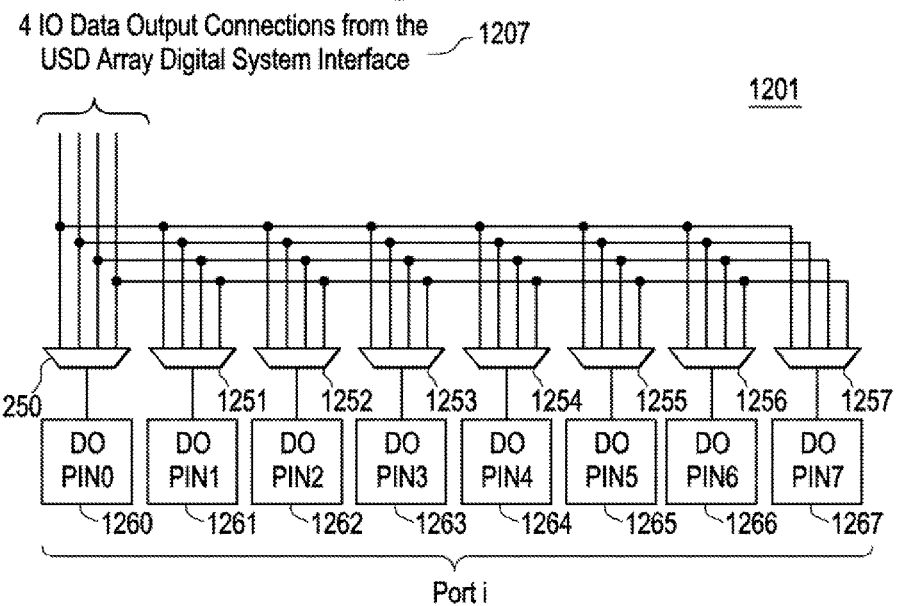
FIG. 12B illustrates an embodiment of IO pin output connectivity according to another embodiment.

FIG. 12A illustrates an embodiment of the IO pin output connectivity 1200. For purposes of illustration and not limitation, eight IO data output connections 1205 from the UDB array DSI may be routed to port pins 1210-1217 through MUXes 1220-1227 (although any suitable number of data output connections, port pins, and MUXes may be used). For example, the first four data output connections 1205 from the UDB array DSI may be coupled to the first four port pins 1210-1213 through the first four MUXes 1220-1223. For example, the second four data output connections 1205 from the UDB array DSI may be coupled to the second four port pins 1214-1217 through the second four MUXes 1224-1227. FIG. 12B illustrates another embodiment 1201 of IO pin output connectivity in which four DSI connections to an IO port may be used to implement dynamic output enable control of pins. IO control signal connections 1207 from UDB array DSI may be routed to output enable pins 1260-1267 through MUXes 1250-1257. In one embodiment, MUXes 1250-1257 may receive all IO control signal connections 1207 globally. In another embodiment, MUXes 1250-1257 may receive a subset of the available IO control signal connections 1207, or a subset of MUXes 1250-1257 may receive all IO control signal connections 1207 or a subset of the available IO control signal connections 1207.

Figure 13:
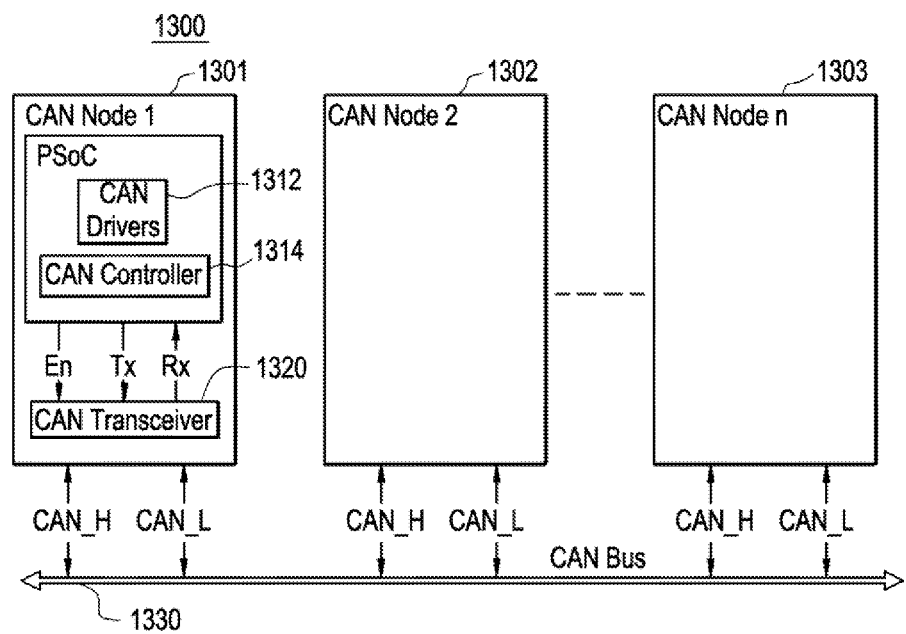
FIG. 13 illustrates a CAN bus system according to an embodiment.

FIG. 13 illustrates a controller area network (CAN) bus system 1300. The CAN bus system 1300 may be used to communicate over a CAN bus network to other devices. CAN bus system 1300 may include a plurality of CAN nodes, including CAN node 1 (1301), CAN node 2 (1302), . . . , CAN node n (1303), where n can be any suitable number of CAN nodes. Each CAN node includes CAN drivers 1312 and a CAN controller 1314. In one embodiment, CAN drivers 1312 and CAN controller 1314 may be implemented in a PSoC® device, although CAN drivers 1312 and CAN controller 1314 can be implemented using any appropriate type of device capable of providing such functionality. Each CAN node may also include a CAN tranceiver 1320 coupled to the CAN drivers 1312 and CAN controller 1314 through TX/RX signals and an enable signal. Each CAN node may also be coupled to CAN bus 1330 through, for example, CAN_H and CAN_L signals. In one embodiment, CAN drivers 1312 may run on the CPU (e.g., 141, FIG. 1).

Figure 14:
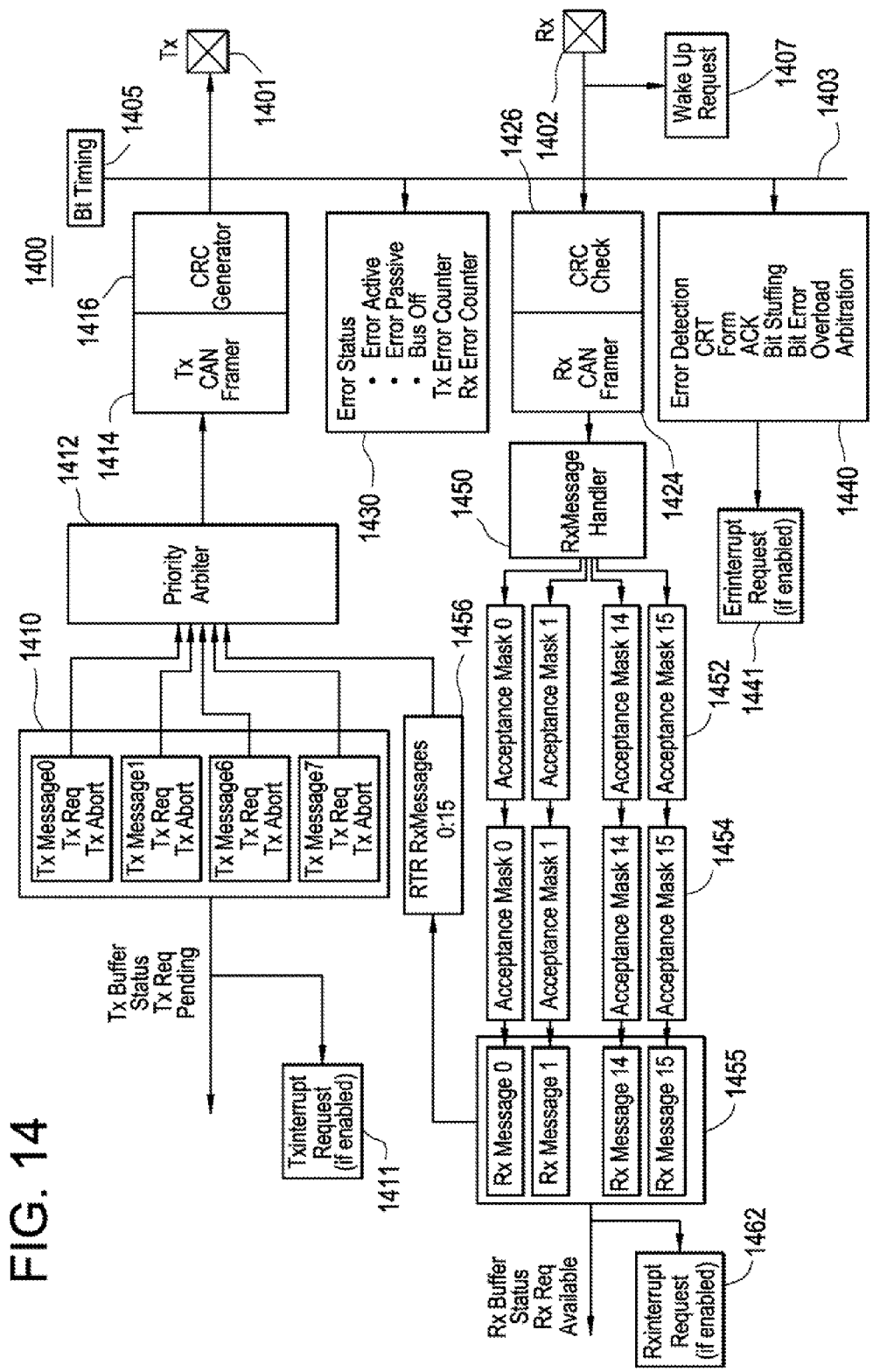
FIG. 14 illustrates a block diagram for a CAN controller according to an embodiment.

FIG. 14 illustrates a block diagram for a CAN controller 1400 from the CAN bus system 1300 (FIG. 13) and the digital subsystem (e.g., 113, FIG. 2). The CAN controller 1400 may be configured to send and receive signals on a CAN bus and to configure signals received by other system elements to meet the protocol requirements of the CAN bus. CAN controller 1400 may include a TX block 1410 which includes TX message, TX request and TX abort information for each data packet to be communicated by the CAN controller 1400. TX information from TX block 1410 can be used to generate a TX interrupt request (e.g., via block 1411), or to generate a TX buffer status or TX request pending indication that can be routed back in the main digital subsystem. Information from the TX block 1410 may be routed to the TX CAN framer 1414 and CRC generator 1416 through priority arbiter 1412. Signals may be routed from CRC generator 1416 to the TX pin 1401. Signals may be received by the CAN controller 1400 through RX pin 1402. Signals received at the RX pin 1402 may be routed to a WakeUp request block 1407. Alternatively, the signals received at the RX pin 1402 may be routed to the RX message handler 1450 through CRC check block 1426 and RX CAN framer 1424. RX message handler 1450 may be configured to assign mask information to data received through RX pin 1402 by routing the signals to one or more of a plurality of acceptance masks 1452. Information may be routed from the plurality of acceptance masks 1452 to the acceptance codes 1454, from which receive messages are generated in block 1455. Received messages generated in block 1455 may then be routed back to the priority arbiter 1412 via router block 1456, used to generate a RX interrupt in block 1462, or be used to generate a RX buffer status or RX message available indication that may be routed back in the main digital subsystem. Bit timing block 1405 may be coupled to the output of CRC generator 1416 and the input of CRC check block 1426, as well as to error status block 1430 and error detection block 1440.

The CAN bus interface may be compliant with, for example, the Bosch v 2.0B CAN-Bus specification and implemented using an industry-standard AMBA AHB bus and a Philips compatible PHY interface. In one embodiment, the CAN controller 1400 may operate as a slave device with configuration, control and data managed by an application processor or external DMA controller. The CAN controller 1400 may support one or more interrupts and may or may not provide an AHB DMA request signal.

Figure 15:
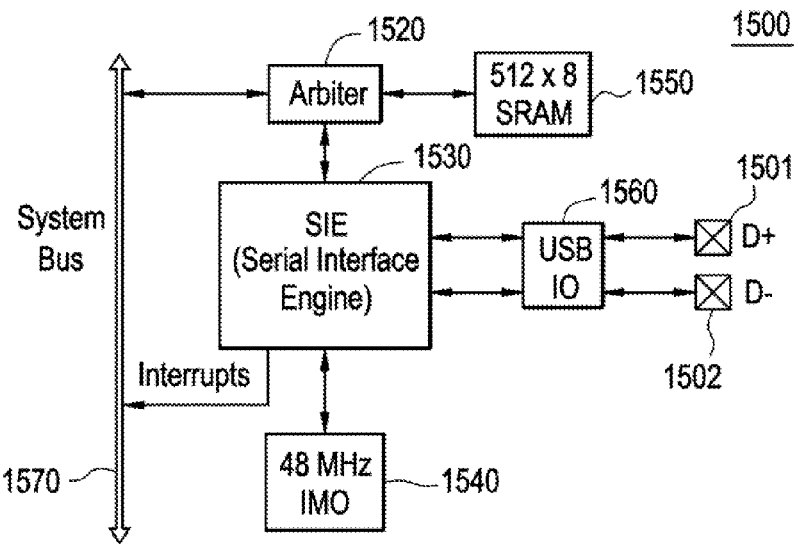
FIG. 15 illustrates a block diagram for a USB controller according to an embodiment.

Referring to FIG. 1, the digital subsystem 110 may include a USB communication interface 116 that may be capable of supporting control, interrupt, bulk, and/or isochronous USB transfer types. The USB communication interface 116 may be configured to send and receive signals to other USB devices on a bus. FIG. 15 illustrates a block diagram of a USB controller 1500 of the digital subsystem 110 according to one embodiment. Pins 1501 and 1502 connect to D+ and D− inputs, respectively, and may be coupled to USB IO block 1560. Signals may be routed through USB IO block 1560 to serial interface engine (SIE) 1530. SIE 1530 may be coupled to arbiter 1520 and 48 MHz IMO 1540 in one embodiment (although IMO 1540 can be of any suitable frequency). SIE 1530 may also be configured to generate appropriate interrupts that can be used by, for example, the digital subsystem 110. In another embodiment, arbiter 1520 and RAM (not shown) may be replaced by a request to a DMA controller (e.g., 144, FIG. 1) that enables the SIE 1530 to share memory from a memory subsystem (e.g., 135, FIG. 1). SIE 1530 may generate interrupts and communicate back to the digital subsystem 110 through system bus 1570. Arbiter 1520 may be coupled to system bus 1570 and to SRAM 1550 (SRAM 1550 can be of any appropriate size). In another embodiment, USB IO 1560 may be external to the device and interface to the SIE 1530 through an interface protocol such as, for example, USB 2.0 Transceiver Macrocell Interface (UTMI) or UTMI+Low Pin Interface (ULP).

Figure 16:
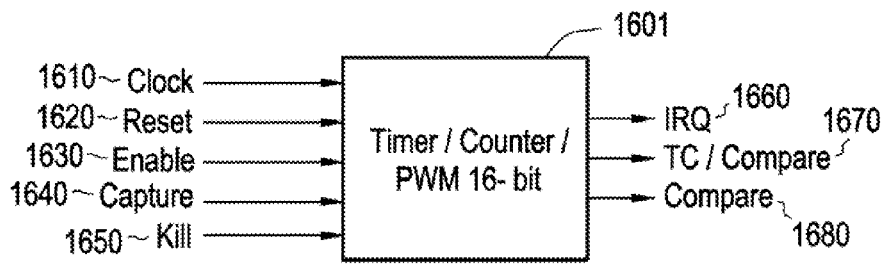
FIG. 16 illustrates a timer/counter/PWM fixed-function peripheral block in-system according to an embodiment.

Referring again to FIG. 1, the digital subsystem 110 may include one or more multifunction digital blocks (MDBs) that are configurable as, for example, a timer, a counter, a PWM, or other common digital functions. MDBs provide optimized digital resources that may be easily configured to implement common digital functions. Such dedicated peripherals may be emulated in UDBs to increase the number of such blocks in the application. However, dedicated resources that may be used to perform basic digital functions allow more configurable resources to be configured to perform complex functions which may require more resources than a single block may provide. FIG. 16 illustrates a block diagram of the inputs and output of the MDB 1601. The MDB 1601 may select from multiple clock sources 1610 with input and output signals connected through DSI routing. DSI routing allows connection to any device pin and any internal signal accessible through the DSI. Each MDB 1601 may have, for example, a compare output 1680, terminal count output 1670, and a programmable interrupt request line (IRQ) 1660. MDB 1601 may be configured as free-running, one-shot or enable-input 1630 controlled, and have timer reset and capture inputs 1620 and 1640, respectively, and a kill input 1650 for control of the comparator outputs. In another embodiment, MDBs and UDBs, as shown in FIG. 3, may be configurable such that functions between MDBs and UDBs are interchangeable or distributed.

Figure 17:
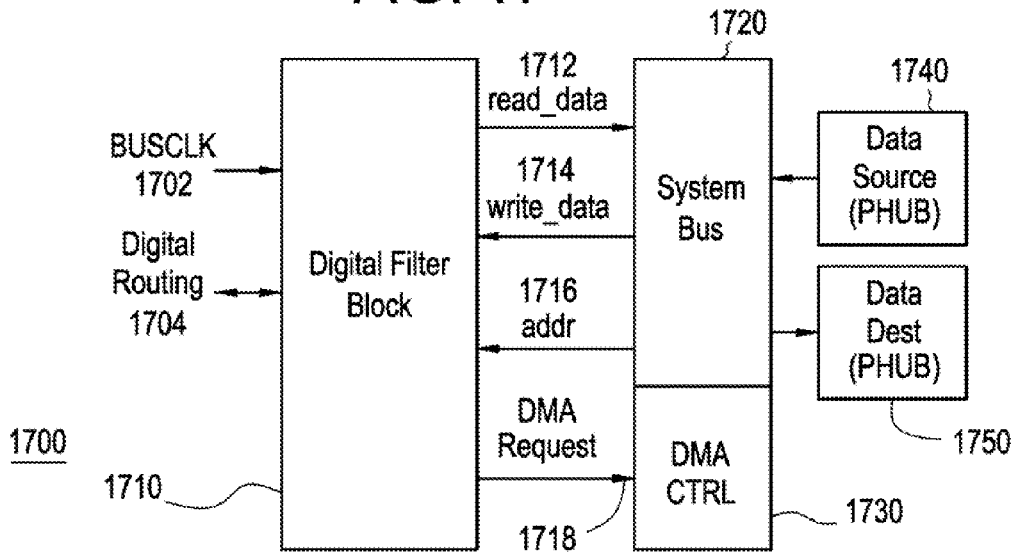
FIG. 17 illustrates a digital signal processing application block diagram according to an embodiment.

The digital subsystem may include a digital signal processing block (e.g., digital filter block (DFB)). For purposes of illustration and not limitation, FIG. 17 illustrates a DFB application block 1700 diagram. DFB application block 1700 includes a DFB 1710 with an input connection from bus clock (BUSCLK) 1702, and input/output connections to and from digital routing 1704. DFB application block 1700 includes, for example, system bus 1720 over which write_data and address signals 1714 and 1716, respectively, are sent to the DFB 1710. DFB 1710 may be configured to send read_data signals 1712 via system bus 1720. DFB 1710 also sends DMA request signals 1718 to DMA control block 1730. Data source block 1740 couples into system bus 1720 to send data to DFB 1710. Data destination block 1750 couples from system bus 1720 to send data from DFB 1710. A DFB architecture is described in more detail in, for example, U.S. patent application Ser. No. 11/865,672, filed Oct. 1, 2007, and assigned to Cypress Semiconductor Corporation (San Jose, Calif.), the entire contents of which are incorporated by reference herein.

In one embodiment, a DFB may be, for example, any suitable type of fixed-point, programmable DSP engine that may include a AHB-Lite DMA capable slave interface. Configuration, status memory test, signal, and coefficient data moving into or out of the DFB may pass across the AHB interface. A DFB may support multiple streaming data channels, where programming instructions, historic data, and filter coefficients and results are stored locally with new period data samples received from the AHB interface. System software may load sample and coefficient data into and out of DFB data RAMs and/or reprogram for different filter operation. Such configurations may allow for multi-channel processing or deeper filters that would be supported in local memory. The DFB may also provide a software-configurable interrupt and multiple DMA channel support. Semaphore bits may be available for software to interact with the DSP assembly program. In one embodiment, data movement may be controlled by the system DMA to allow data to be moved by hardware with limited CPU overhead. In another embodiment, data may be moved directly by the microcontroller if there are no available DMA channels, such as when the application requires it for program execution timing and steps.

The DFB may support multiple input and output data ports, accessible through DMA or directly by the system CPU. These ports may support accesses of varied widths and have coherency protection hardware allowing them to be written or read in multiple accesses of less than full width accesses. Coherency protection may allow processing of wide data through narrow busses without corruption.

The DFB may support internal clock gating by splitting the bus block into a plurality of gated clock domains (e.g., three, although any suitable number of gated clock domains can be used). For purposes of illustration and not limitation, a first clock domain may clock the DFB core and the majority of the block. A second clock domain may clock the AHB interface, and a third clock domain may comprise a combination of the first and second clock domains as described. In one embodiment, the DFB may contain embedded register files for internal data storage, and input and output storage to and from the AHB interface. Multiple clock domains may allow for different rates of clocking for different program functions. For example, a program block may have a first clocking domain for the input and a second clocking domain for the output.

The DFB may provide a multiple accumulate (MAC) operation in one clock cycle. Such functionality may enable finite impulse response (FIR), infinite impulse response (IIR), and other digital filters, thereby offloading the main CPU while significantly improving execution speed of the filter operation if done by the CPU.

DFB may have multiple modes of operation. In one embodiment, the DFB may have block mode and streaming mode. Block mode may be used to set up the DFB for operation by loading, for example, data, coefficients, instructions, finite state machine (FSM) controls and other like information into RAMS for operation. The DFB core may be halted and the embedded memories accessed by the AHB bus interface. Block mode may be used to enable multiple channels, multiple filters or both in, for example, a time-division multiplexed fashion. Block mode may also be used to enable filter depths larger than local DFB memory may allow. Streaming mode may be used to maximize performance and minimize system bandwidth usage by storing instruction sets and sample and coefficient data in local DMA memory. In one embodiment, only new incoming data samples, outgoing filter results and control and stat information may be transferred across the AHB bus. In streaming mode, the DFB may wait for periodic data samples, process the data, update results, and notify system software through DMA or an interrupt when the filter cycle is complete and another data sample may be received.

Analog Subsystem

An analog programmable subsystem can create application specific combinations of standard analog signaling blocks and advanced analog signal processing blocks. These blocks can be interconnected to each other, to any pin on the device or to digital and system components. Such interconnectivity provides a high level of design flexibility and IP security. An analog programmable system may include, but is not limited to, such features as the following:

a flexible, configurable analog routing architecture including analog globals, an analog multiplexor bus (MUX bus) and analog local buses,
a high resolution delta-sigma ADC,
DACs capable of providing voltage or current output,
comparators with optional connections to configurable look-up table (LUT) outputs,
configurable switched capacitor/continuous time (SC/CT) blocks,
opamps for internal subsystem use and connection to GPIO,
a capacitive sensing subsystem,
voltage or current references,
current sources and/or sinks,
IO ports,
temperature sensors, and
optical sensors.

Figure 18:
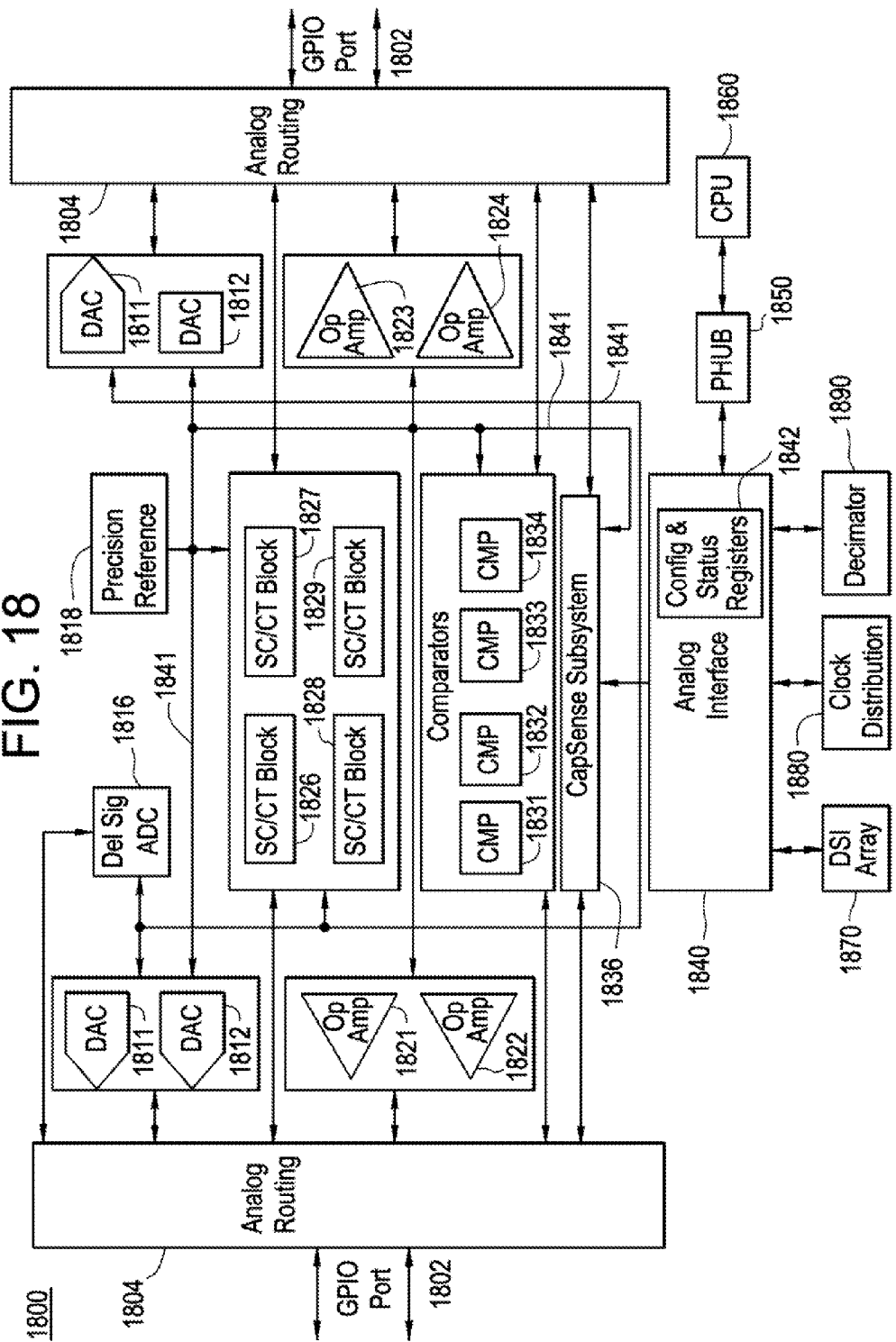
FIG. 18 illustrates a block diagram for an analog system of a core architecture according to an embodiment.

FIG. 18 illustrates a block diagram of one embodiment of an analog subsystem 1800 as may be seen in FIG. 1 (analog subsystem 120). The analog subsystem 1800 may include several banks of analog blocks such as, for example, DACs, opamps, comparators, switched-capacitor/continuous time (SC/CT) functional blocks, delta-sigma analog-to-digital (ADC) converters, precision references, capacitive sensing channels, and other like analog blocks, signals to and from which may be routed to any part of the system (e.g., 100, FIG. 1) through a highly configurable analog interconnect. The analog interconnect may be controlled by several system elements including, but not limited to, an analog interface controller, a peripheral hub controller, a direct memory access controller, a microprocessor that may be part of a CPU subsystem (e.g., 140, FIG. 1), digital subsystem elements such as UDBs (e.g., 112, FIG. 1), or IOs. The configurable analog interconnect and the flexibility of its control (which may be achieved through any suitable number of system components) allows for more flexible and faster signal processing while decreasing overall CPU overhead. References and external signals may be routed to anywhere in the analog subsystem 1800 through a highly configurable analog interconnect which allows for a large number of possible references and connection of multiple references to different blocks, banks of blocks, or channels.

GPIO Ports 1802 may be coupled to analog routing 1804. Analog routing 1804 may be coupled to, for example, DACs 1811-1814, DelSig ADC 1816, Opamps 1821-1824, SC/CT blocks 1826-1329, comparators (CMPs) 1831-1834, and capacitive sensing (CapSense™) subsystem 1836. Precision reference 1818 may be coupled to, for example, DelSig ADC 1816. DACs 1811-1814, DelSig ADC 1816, precision reference 1818, opamps 1821-1824, SC/CT blocks 1826-1829, CMPs 1831-1834 and CapSense™ subsystem 1836 may be coupled to each other or to analog interface 1840 through internal analog routing 1841. Analog interface 1840 may include a configuration and status registers block 1842. Analog interface 1840 may be coupled to, for example, DSI array 1870, clock distribution block 1880, decimator 1890 and PHUB 1850. PHUB 1850 may be coupled to CPU 1860.

Figure 19:
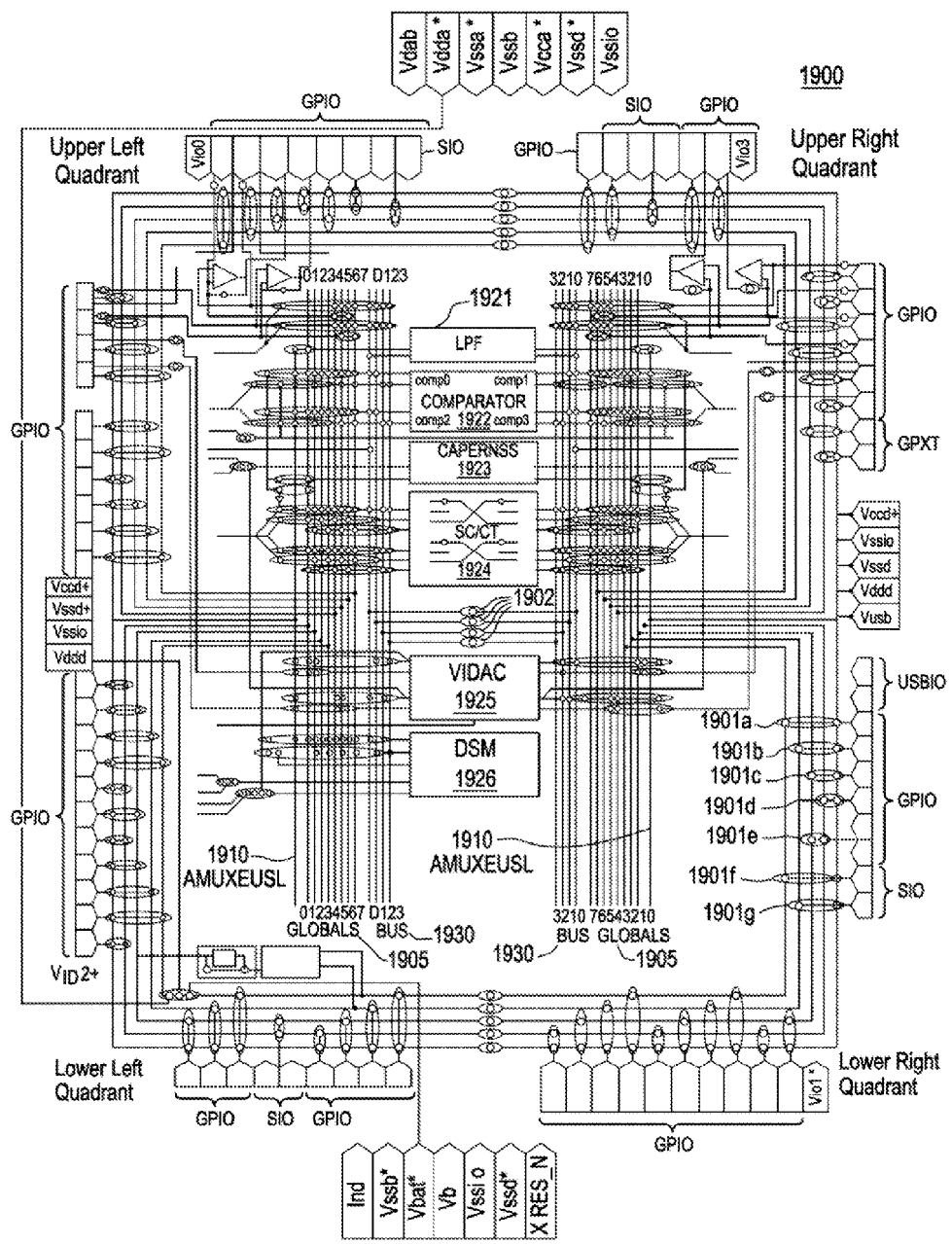
FIG. 19 illustrates an internal and external analog routing for an analog subsystem according to an embodiment.

FIG. 19 illustrates one embodiment of internal and external programmable analog routing 1900, examples of which are illustrated in FIG. 1 (150) and FIG. 18 (1841). Programmable analog routing 1900 comprises a series of buses, switches and MUXs that are interwoven amongst the analog subsystem (e.g., 120, FIG. 1), which allows analog blocks, banks of blocks, and channels to be connected to each other, to internal and external reference signals, to mixed-signal blocks (such as DACs), as well as to GPIO. Programmable analog routing 1900 includes a plurality analog globals (AG) 1905 (e.g., 16 or any suitable number of AGs) and a plurality of analog MUX buses (AMUXBUS) 1910 (e.g., 2 or any appropriate number of AMUXBUSes). AGs and AMUXBUSes may connect GPIOs 1915 to any suitable type of analog functional blocks. Analog functional blocks may include, for example, a low-pass filter 1921, a comparator 1922, a capacitive sensing block 1923, a SC/CT functional block 1924, a voltage/current digital-to-analog converter (VIDAC) 1925, a DSM 1926, and any other appropriate type of analog functional block. Each GPIO 1915 may be coupled to, for example, one AG 1905 and one AMUXBUS 1910. Each GPIO 1915 may be coupled to a corresponding AG 1905 through an analog switch 1901 (e.g., 1901a-g). Analog switches 1901a-g may be large or small. Large analog switches (e.g., 1901a, b, c, d, f, and g) may have lower impedance. Small analog switches (e.g., 1901e) may have higher impedance. The AMUXBUS 1910 may be a shared routing resource connecting all or substantially all GPIO 1905 through an analog switch 1901. Programmable analog routing 1900 may also include a plurality of analog local buses 1930 (e.g., 8 or any suitable number of analog local buses) to route signals between different analog functional blocks such as the example analog functional blocks 1921-1926 described above. In one embodiment, there may be eight analog local buses 1930, four on one side (e.g., right) of the device and four on the other side (e.g., left) of the device. Analog local buses 1930 from opposing sides of the device may be coupled together through analog switches 1902. Programmable analog routing 1900 may also include, for example, MUXes and switches for IO selection of the analog functional blocks. In one embodiment, programmable analog routing 1900 may provide hierarchical routing to system components. In another embodiment, programmable analog routing 1900 may allow for open routing to system components.

Figure 20:
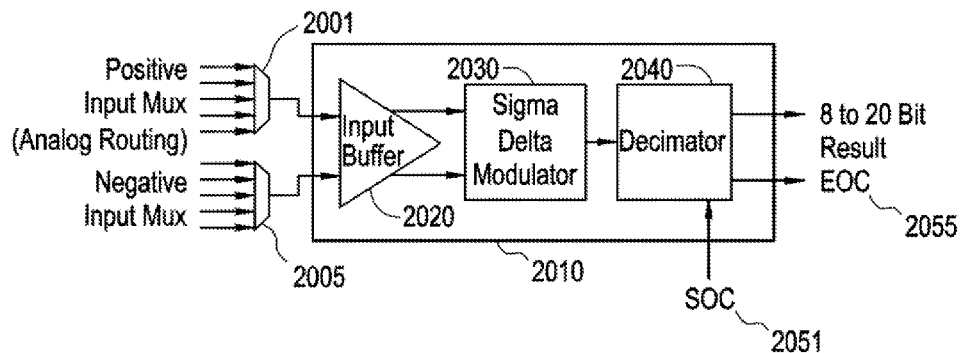
FIG. 20 illustrates a block diagram of a delta-sigma analog-to-digital converter according to an embodiment.

FIG. 20 illustrates a block diagram of one embodiment of a delta-sigma ADC 2010 shown in FIG. 18 (1816) and coupled to the analog interconnect 1841 (FIG. 18). Delta-sigma ADC 2010 comprises part of the analog subsystem (e.g., 120, FIG. 1), and may be capable of receiving signals from a plurality of sources including, but not limited to, GPIO, precision references, digital subsystem elements (e.g., 110, FIG. 1), the DMA controller (e.g., 144, FIG. 1), and the like. Delta-sigma ADC 2010 may include, for example, an input buffer 2020, a delta-sigma modulator 2030, and a decimator 2040. Input buffer 2020 may be coupled to internal and external bus input MUXes 2001 and 2005. The signals from input MUXes 2001 and 2005 may be coupled directly to delta-sigma modulator 2030 in one embodiment. In another embodiment, the signals from input MUXes 2001 and 2005 may be coupled to delta-sigma modulator 2030 through input buffer 2020, which eliminates load from the input of delta-sigma modulator 2030. In normal operations, delta-sigma modulator 2030 may oversample the input and generate a serial data stream output. The high-speed data stream may be passed through decimator 2040. Decimator 2040 may convert the high-speed serial data stream into parallel ADC results. Resolution and sample rate of delta-sigma ADC 2010 may be controlled through decimator 2040.

Delta-sigma ADC 2010 may be configured to operation in a plurality of modes. These modes may include, but are not limited to: single sample, fast filter, continuous or fast FIR (average). Modes may be initiated by, for example, a write to a start bit in a control register or an assertion of the Start of Conversion (SOC) signal 2051. End of conversion (EOC) signal 2055 may assert high and remain high until the value is read by either the DMA controller or the CPU when the conversion is complete.

In single sample mode, delta-sigma ADC 2010 may perform one sample conversion on a trigger. In such a mode, delta-sigma ADC 2010 may remain in a standby state until SOC signal 2051 is asserted. When SOC signal 2051 is asserted, delta-sigma ADC 2010 may perform one sample conversion and capture the result. The system may poll a control register for status or configure the EOC signal 2055 to generate an interrupt or invoke a DMA request to detect the end of the conversion. When the conversion is complete, delta-sigma ADC 2010 may reenter the standby state where it remains until another SOC event.

In continuous mode, delta-sigma ADC 2010 may be reset and then run continuously until stopped. Such a mode may be used when the input signal is not switched betweens sources and multiple samples are required.

In fast filter mode, back-to-back signals may be captured continuously and delta-sigma ADC 2010 reset between each sample. On completion of one sample, delta-sigma ADC 2010 may be reset and another sample begun immediately. The results of the conversions may then be transferred using at least one of polling, interrupts, DMA request, or the like.

Fast FIR (average) mode may operate similar to fast filter mode, but without resetting the delta-sigma ADC 2010 between intermediate conversions. Fast FIR (average) mode may be used when decimation ratios greater than what is available from the standard ADC are required. For such a mode, a post processor filter may be used to perform additional decimation to obtain resolutions greater than are natively available in the ADC.

Figure 21:
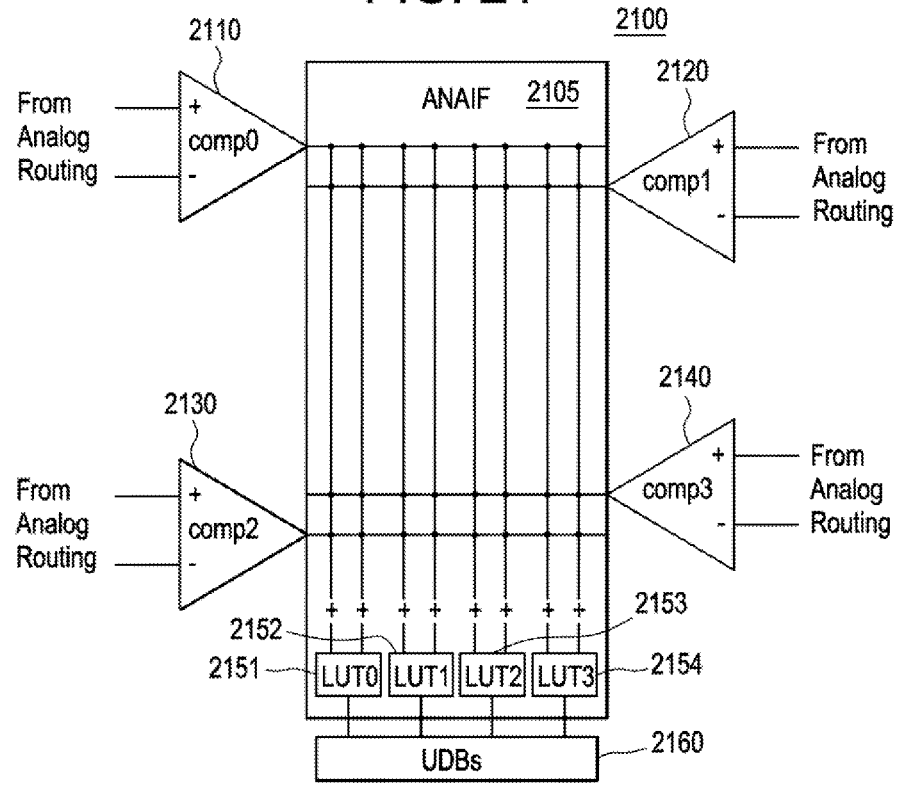
FIG. 21 illustrates four comparators of an analog subsystem to an embodiment.

FIG. 21 illustrates one embodiment of a comparator set or bank 2100 of a plurality (e.g., four or other suitable number) of analog comparators 2110, 2120, 2130 and 2140 coupled by their output to analog interface (ANAIF) 2105. Comparators 2110, 2120, 2130 and 2140 may be coupled to, for example, the reset of the analog subsystem 1800 illustrated in FIG. 18 or to the rest of the device through the programmable analog routing 1900 illustrated in FIG. 19. The output of each comparator 2110, 2120, 2130, and 2140 may also be routed anywhere on the device through the same programmable interconnect. In one embodiment, each comparator 2110, 2120, 2130, and 2140 input and output may be controlled by the DMA controller (e.g., 144, FIG. 1) to offload the CPU (e.g., CPU 141, FIG. 1). In another embodiment, the comparator signals may be controlled by the analog interface controller 2105 and coupled to other analog subsystem elements such as, for example, low-pass filters (e.g., 1921, FIG. 19) or to GPIO through the programmable interconnect illustrated in FIG. 19.

Each comparator (2110, 2120, 2130, 2140) comprises a positive and negative input that couples to the analog routing and an output that couples to analog interface (ANAIF) 2150, which includes LUTs 2151-2154. LUTs 2151-2154 may be two input, one output LUTs that are driven by any one or two of the comparators in the device, although LUTs 2151-2154 may includes any suitable number of inputs and outputs. The output of LUTs 2151-2154 may be routed to UDBs 2160 through the DSI of the UDB array. From the DSI of the UDB array, signals from LUTs 2151-2154 may be coupled to UDBs, the DMA controller, IOs, the interrupt controller, or other like elements. In another embodiment, comparator outputs may be coupled to the UDBs without being routed through LUTs 2151-2154.

Figure 22:
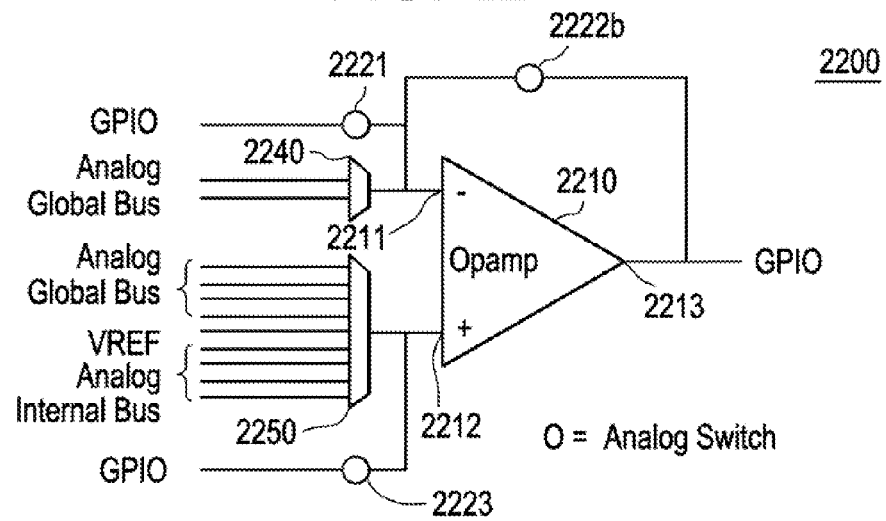
FIG. 22 illustrates an opamp of an analog subsystem according to an embodiment.

FIG. 22 illustrates one embodiment of an opamp circuit 2200. Opamp circuits are illustrated as part of the analog subsystem 1800 (FIG. 18) and may be coupled through their inputs or outputs to other analog subsystem components or to other system elements shown in FIG. 1. Opamp circuit 2200 includes opamp 2210 comprising negative input 2211, positive input 2212, and output 2213. Negative input 2211 may be coupled to the output of MUX 2240 having inputs coupled to the analog global bus. Negative input 2211 may also be coupled to a GPIO through analog switch 2221. Positive input 2212 of opamp 2210 may be coupled to the analog global bus, a reference voltage (VREF), or the analog internal bus through multiplexor 2250. Positive input 2212 may also be coupled to a GPIO through analog switch 2223. The output 2213 of opamp 2210 may be coupled to a GPIO or to the negative input 2211 through analog switch 2222. Opamp circuit 2200 may be an uncommitted analog resource and may be configured as a gain stage or voltage follower, or an output buffer on external or internal signals. Opamp speed modes may include, but are not be limited to, slow, low, medium and fast, which may be set by writing to appropriate opamp control registers (not shown) by the CPU (e.g., 141, FIG. 1) or by the DMA controller (e.g., 144, FIG. 1). UDBs or other digital subsystem blocks may control and configure the opamp circuit 2200, but may do so by invoking the DMA controller. Slow mode consumes the least amount of quiescent power, while fast mode consumes the most power. The inputs may swing rail-to-rail.

Figure 23A:
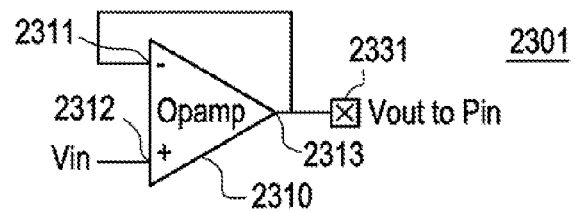
FIG. 23A illustrates an opamp configured as a voltage follower according to an embodiment.
Figure 23B:
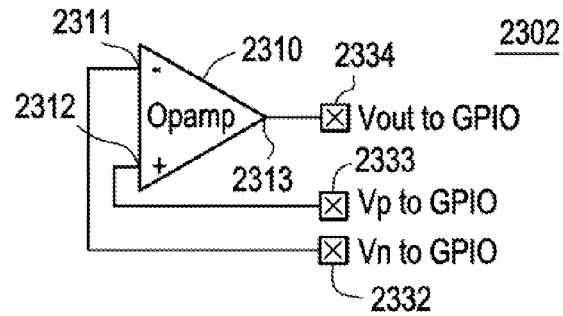
FIG. 23B illustrates an opamp configured as an external uncommitted opamp according to an embodiment.
Figure 23C:
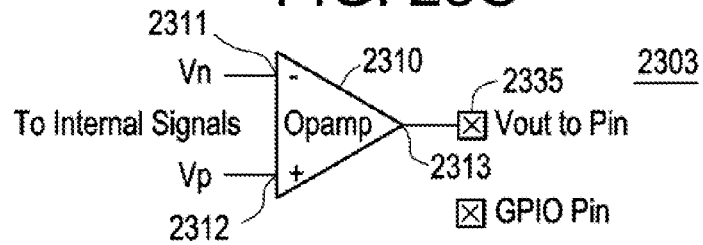
FIG. 23C illustrates an opamp configured as an internal uncommitted opamp according to an embodiment.

FIGS. 23A-C illustrate examples of opamp configurations for opamp circuit 2200 (FIG. 22). Opamps are configured to perform functions by setting registers that control switch operations and connections. These registers may be hard-coded during development or controlled by a number of system-level elements including, but not limited to, the analog interface controller (FIG. 20), the CPU (e.g., 141, FIG. 1), UDBs (e.g., 945, FIG. 9), or the DMA controller (e.g., 144, FIG. 1). Opamp register settings and switches may be controlled through the programmable analog routing 1900 illustrated in FIG. 19.

For example, FIG. 23A illustrates an opamp circuit 2200 configured as a voltage follower 2301 according to one embodiment. Opamp 2310 includes negative input 2311, positive input 2312, and output 2313. Positive input 2312 may be coupled to a voltage input Vin. Output 2313 may be coupled to a pin 2331 as an output voltage, Vout, and to negative input 2311.

FIG. 23B illustrates an opamp circuit 2200 configured as an external uncommitted opamp 2302 according to one embodiment. Negative input 2311 may be coupled to a negative voltage, Vn, through a GPIO 2332. Positive input 2312 may be coupled to a positive voltage, Vp, through a GPIO 2333. Output 2313 may be coupled to a pin 2334 as an output voltage, Vout.

FIG. 23C illustrates an opamp circuit 2200 configured as an internal uncommitted opamp 2303 according to one embodiment. Negative input 2311 may be coupled to an internal negative voltage, Vn. Positive input 2312 may be coupled to an internal positive voltage, Vp. Output 2313 may be coupled to a pin 2335 as an output voltage, Vout.

Internal and external opamps such as those illustrated in FIGS. 23B and 23C may be used to implement analog functions including, for example, inverting and non-inverting amplifiers, active filters, current and voltage sources, differential amplifiers, instrumentation amplifiers comparators and other analog functions with signals generated by the device itself or with signals generated by external components.

Figure 24:
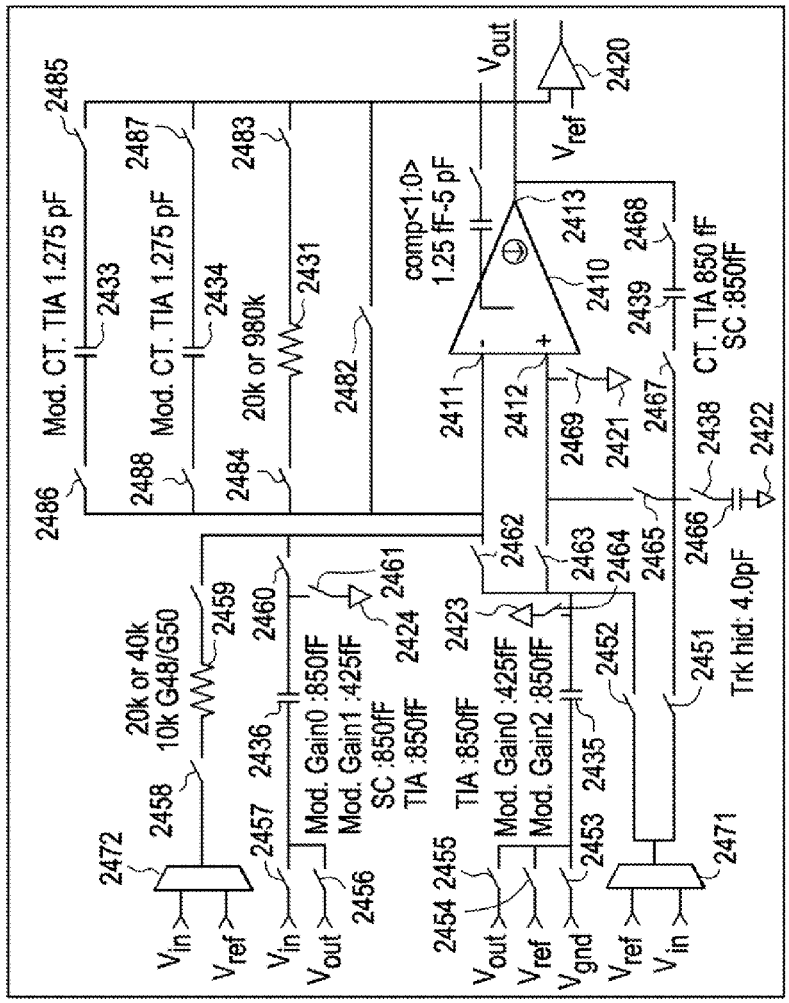
FIG. 24 illustrates a switched capacitor/continuous time (SC/CT) functional block according to an embodiment.

FIG. 24 illustrates one embodiment of the switched-capacitor/continuous time (SC/CT) functional block 2400, which may be part of the analog subsystem 1800 (FIG. 18) and coupled to analog routing 1841 (FIG. 18, see also FIG. 19). The SC/CT functional block 2400 may be configurable to perform a variety of analog functions that require either switched-capacitor operation, continuous time operation or both by controlling switches that route signals into and out of an opamp. Such switches may be controlled through, for example, register settings which may be written to by a number of sources including, but not limited to, the analog interface (FIG. 20), the DMA controller (e.g., 144, FIG. 1), the CPU (e.g., 141, FIG. 1), or the digital subsystem shown in FIG. 2.

According to an embodiment, the SC/CT functional block 2400 may be built around, for example, a single rail-to-rail high bandwidth opamp 2410. Opamp 2410 includes a negative input 2411, a positive input 2412, and an output 2413. Capacitors 2433 and 2434 and variable resistor 2431 may be coupled to the negative input 2411 through switches 2486, 2488 and 2484, respectively. Capacitors 2433 and 2434 and variable resistor 2431 may be coupled to the output 2413 through switches 2485, 2487 and 2483, respectively. The output 2413 may be coupled to negative input 2411 through switch 2482. Output 2413 may be coupled to an output voltage, Vout, or to one input of comparator 2420. The other input of comparator 2420 may be coupled to a reference voltage, Vref. Output 2413 may be coupled to capacitor 2439 through switch 2468. Positive input 2412 may be coupled to ground 2421 through switch 2469. Positive input 2412 may be coupled to capacitor 2439 through switches 2465 and 2467, to capacitor 2438 through switches 2465 and 2466, or to the output of MUX 2471 through switch 2451. The inputs of MUX 2471 may be coupled to an input voltage, Vin, and a reference voltage, Vref. Capacitor 2438 may be coupled to ground 2422. Positive input 2412 may be coupled to the output of MUX 2471 through switches 2463 and 2452, to ground 2423 through switches 2463 and 2464, or to capacitor 2435 through switch 2463. Capacitor 2435 may be coupled to an output voltage, Vout, a reference voltage, Vref, or a ground voltage, Vgnd, through switches 2455, 2454 or 2453, respectively. Negative input 2411 may be coupled to the output of MUX 2471 through switches 2462 and 2452, to ground 2423 through switches 2462 and 2464, or to capacitor 2435 through switch 2462. Negative output 2411 may be coupled to variable resistor 2432 through switch 2459 or to capacitor 2436 through switch 2460. Capacitor 2436 may be coupled to ground 2424 through switch 2461. Capacitor 2436 may be coupled to an input voltage, Vin, or an output voltage, Vout, through switches 2457 or 2456, respectively. Variable resistor 2432 may be coupled to the output of MUX 2472 though switch 2458. The inputs of MUX 2472 may be coupled to an input voltage, Vin, and a reference voltage, Vref.

The SC/CT functional block 2400 may use capacitors and switches to create switched-capacitor (SC) analog functions. Such circuits operate by moving charge between capacitors by opening and closing appropriate switches. Non-overlapping clock signals may control the switches so that not all switches are ON simultaneously. Opamp 2410 may also be connected to an array of resistors to allow constructions of a variety of continuous time (CT) functions. Opamp 2410, and associated capacitors, resistors and switches, may be programmed to perform analog functions including, but not limited to:

naked operational amplifier, continuous mode,
unity-gain buffer, continuous mode,
programmable gain amplifier (PGA), continuous mode,
transimpedance amplifier (TIA), continuous mode,
up/down mixer, continuous mode,
non-return-to-zero sample and hold mixer (NRZ S/H), switched capacitor mode, and
first order delta-sigma modulator for an analog-to-digital converter-switched capacitor mode.

To perform the naked opamp analog function, inputs 2411 and 2412 and output 2413 may be configured for connection to internal or external signals. According to an embodiment, the opamp may have a unity gain bandwidth greater than 6 MHz and output drive current up to 650uA, which is sufficient for buffering internal signals and driving external loads greater than 7.5 kohms.

The SC/CT functional block 2400 may be configured as a unity gain buffer using that same or similar configuration as may be used for the naked opamp analog function, with output 2413 coupled directly to an inverting input for a gain of 1.00. With such a configuration, the SC/CT functional block 2400 may have −3 dB bandwidth greater than 6 MHz.

Figure 25A:
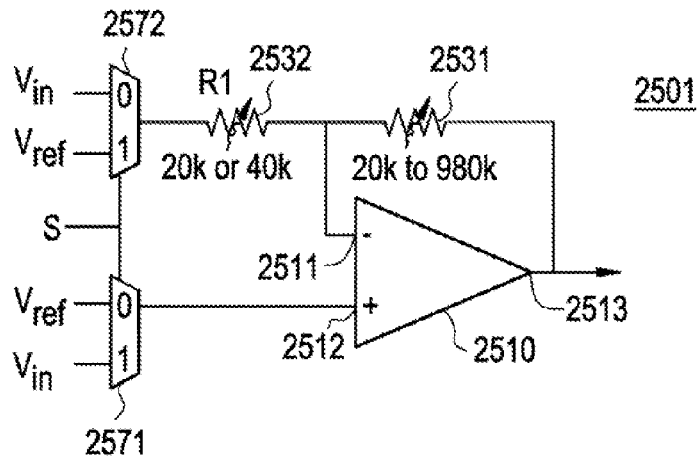
FIG. 25A illustrates a SC/CT functional block configured as a programmable gain amplifier (PGA) according to an embodiment.

FIG. 25A illustrates one embodiment of a PGA 2501 implemented by the SC/CT functional block 2400 shown in FIG. 24. Negative input 2511 of opamp 2510 may be coupled between variable resistors R1 2532 and R2 2531, which may be coupled in series between the output of MUX 2572 and opamp output 2513. Positive input 2512 may be coupled to the output of MUX 2571. The inputs of MUXes 2571 and 2572 may be coupled to appropriate input voltages, Vin, and reference voltages, Vref. The gain of the PGA 2501 may be switched from inverting and non-inverting by changing the shared select value, S, of both input MUXes 2571 and 2572. The gain may be adjusted by changing the values of R1 2532 and R2 2531.

Figure 25B:
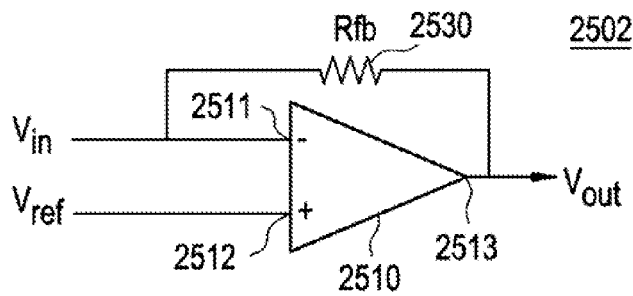
FIG. 25B illustrates a SC/CT functional block configured as a transimpedance amplifier (TIA) according to an embodiment.

FIG. 25B illustrates one embodiment of a TIA 2502 implemented by the SC/CT functional block 2400 shown in FIG. 24. Negative input 2511 of opamp 2510 may be coupled to an input current, Iin, and output 2513 through feedback resistor Rfb 2530. Positive input 2512 may be coupled to a reference voltage, Vref.

Figure 25C:
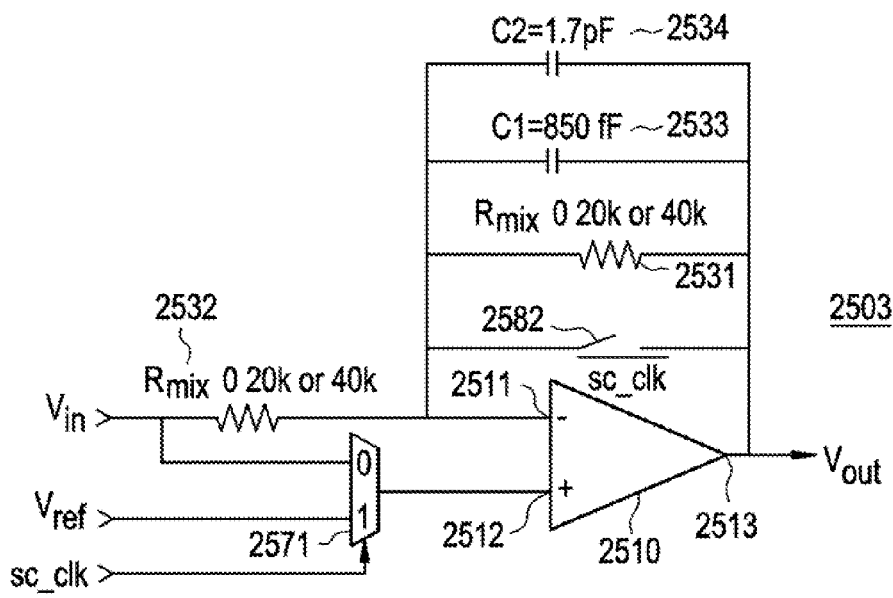
FIG. 25C illustrates a SC/CT functional block configured as a mixer according to an embodiment.

FIG. 25C illustrates one embodiment of a mixer 2503 implemented by the SC/CT functional block 2400 shown in FIG. 24. Negative input 2511 of opamp 2510 may be coupled to variable mix resistors 2532 and 2531 and capacitors C1 2533 and C2 2534. Negative input 2511 may also be coupled to output 2513 through switch 2582. Output 2513 may be coupled to the opposite side of variable mix resistors 2532 and 2531 and capacitors C1 2533 and C2 2534 and produce an output voltage, Vout. The side of resistor 2532 opposite negative input 2511 may be coupled to an input voltage, Vin, and to one input of MUX 2571. Another input of MUX 2571 may be coupled to a reference voltage, Vref. The output of MUX 2571 may be coupled to positive input 2512. MUX 2571 may be controlled by a suitable clock signal, sc_clk. Mixing applications may use an input signal frequency and a local oscillator frequency. The polarity of the clock alternates the amplifier between inverting and non-inverting gain. The output of the mixer may be the product of the input and the switching function from the local oscillator, with frequency components at the local oscillator plus and minus the signal frequency and reduced-level frequency components at odd integer multiples of the local oscillator frequency.

Figure 26:
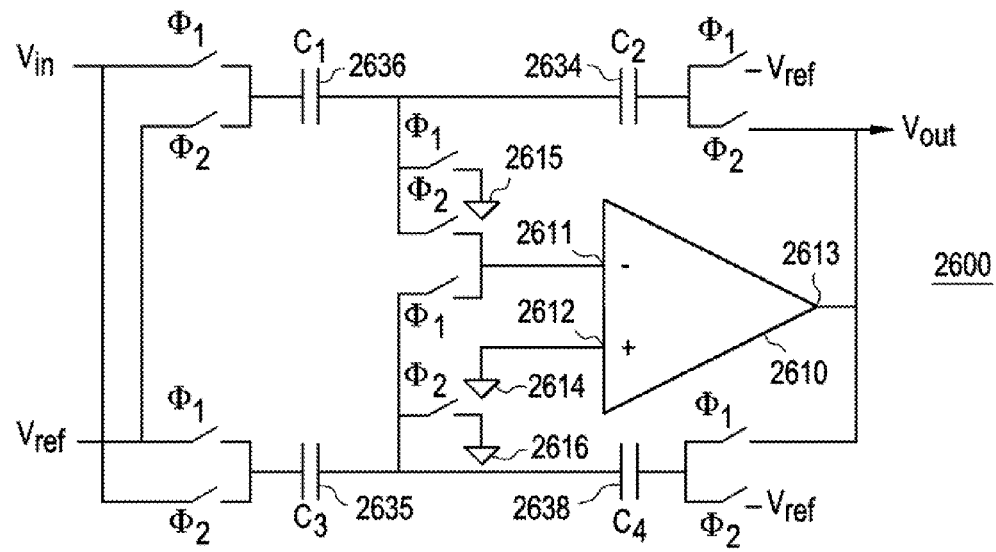
FIG. 26 illustrates a SC/CT functional block configured as a sample and hold according to an embodiment.

FIG. 26 illustrates one embodiment of a sample and hold circuit 2600 implemented by the SC/CT functional block 2400 shown in FIG. 24. Positive input 2612 of opamp 2610 may be coupled to ground 2614. In a first phase, negative input 2611 may be coupled between capacitors C3 2635 and C4 2638, which may be in series. Also in a first phase, capacitor C1 2636 may be coupled between an input voltage, Vin, and ground 2615, and capacitor C2 2634 may be coupled between a reference voltage, Vref, and the ground 2615. Also in a first phase, capacitor C3 2635 may be coupled between a reference voltage, Vref, and negative input 2611, and capacitor C4 2638 may be coupled between output 2613 and negative input 2611. In a second phase, capacitor C1 2636 may be coupled between a reference voltage, Vref, and negative input 2611, and capacitor C2 may be coupled between output 2613 and negative input 2611. Also in a second phase, capacitor C3 2635 may be coupled between an input voltage, Vin, and ground and capacitor C4 2638 may be coupled between a reference voltage, Vref, and ground 2616. In some embodiments, the first and second phases may be opposite phases of a clock.

In another embodiment, the SC/CT functional block 2400 may be configured as a mixer to down convert an input signal. Such a circuit may have a high bandwidth passive sample network that can sample input signals and hold those signals using the sample and hold circuit 2600. The output frequency may be the difference between the input frequency and the highest integer multiple of the local oscillator that is less than the input.

In another embodiment, the SC/CT functional block 2400 may be configured as a first-order modulator by placing the SC/CT in an integrator mode and using a comparator to provide a feedback to the input. A reference voltage may then be either subtracted or added to the input signal. The output is then the output of the comparator and not the integrator in the modulator. The signal may then be down-sampled and buffered and processed by a decimator to make a delta-sigma converter of a counter to implement an incremental converter. The accuracy of the sampled data from the first-order modulator may be determined by several factors known to those of ordinary skill in the art.

Figure 27:
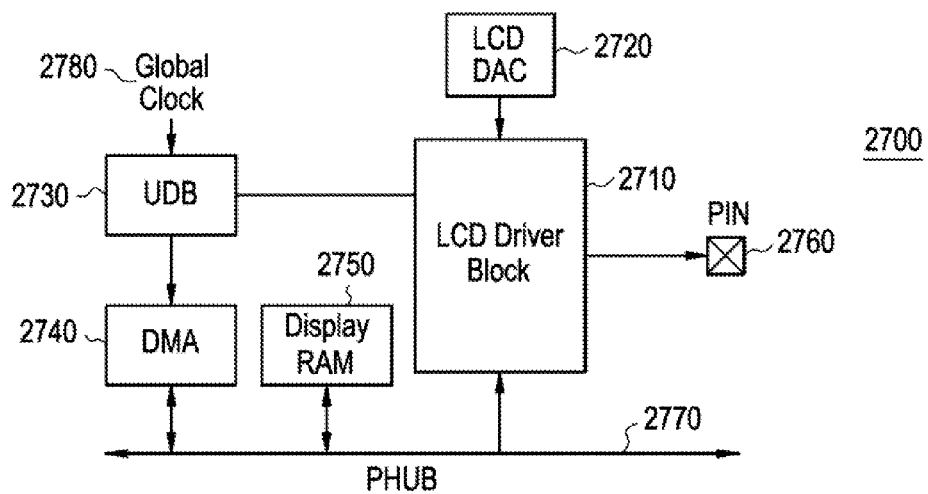
FIG. 27 illustrates a block diagram of an LCD subsystem according to an embodiment.

FIG. 27 illustrates a block diagram of an LCD system 2700 from FIG. 1 (LCD direct drive block 121). The LCD system 2700 allows the system of FIG. 1 to perform analog, digital, and mixed-signal processing, and to display data on an LCD without a separate, external LCD controller, thereby streamlining and simplifying design. LCD system 2700 may include, for example, an LCD driver block 2710 coupled to an LCD DAC 2720, a UDB 2730, PHUB 2770, and a pin 2760. UDB 2730 may be coupled to a global clock 2780, DMA 2740, and LCD driver block 2710. PHUB 2770 may be coupled to DMA 2740, display RAM 2750, and LCD driver block 2710. The LCD driver block 2710 may include at least one LCD segment pin driver that may be configured to buffer the appropriate output of the LCD DAC 2720 to drive the class of an LCD directly. A register setting may determine whether the pin is a common or a segment. The pin's LCD driver may then select a bias voltage to drive the IP pin, as appropriate for the display data. In some embodiments, there may be six bias voltages. In other embodiments, there may be more or less than six bias voltages. UDB 2730 may be configured to generate global LCD control signals and clocking. Signals may be routed to each LCD pin driver through, for example, a set of dedicated LCD global routing channels. In addition to generating the global LCD control signals, UDB 2730 may produce a DMA request to initiate transfer of the next frame of LCD data. LCD DAC 2720 may generate the contrast control and bias voltage for the LCD system 2700. LCD DAC 2720 may produce a variety of voltages, plus a ground voltage. In some embodiments, there may be five voltages from LCD DAC 2720. In other embodiments there may be more or less that five voltages. Bias voltages may be driven out to GPIO pins on a dedicated LCD bias bus.

Figure 28:
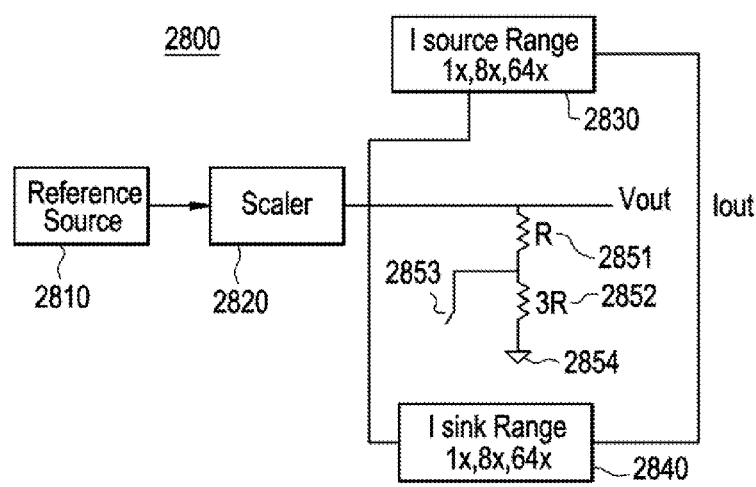
FIG. 28 illustrates a block diagram of a digital-to-analog converter (DAC) according to an embodiment.

FIG. 28 illustrates a block diagram of a DAC 2800. DAC 2800 may include a reference source block 2810 coupled to a scaler block 2820. The scaler block 2820 may be coupled to a current source (Isource) range block 2830, a current sink (Isink) range block 2840 or an output voltage, Vout. A resistor network, including resistors 2851 and 2852, switch 2853 and ground 2854, may be coupled to scaler block 2820 and Vout. DAC 2800 may be configured as either a current DAC (IDAC) or a voltage DAC (VDAC, not shown).

Figure 29:
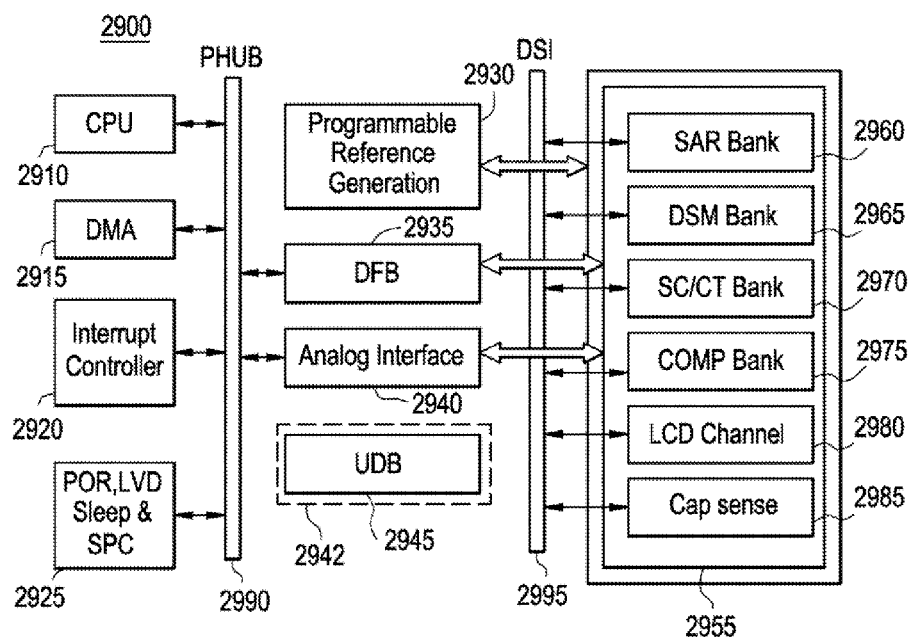
FIG. 29 illustrates a programmable analog subsystem according to an embodiment.

FIG. 29 illustrates another embodiment of a programmable analog subsystem 2900 (e.g., 120, FIGS. 1 and 1800, FIG. 18). CPU 2910, DMA 2915, Interrupt Controller 2920, and power block (POR, LVD, Sleep & SPC) 2925 may be coupled to the PHUB 2990. The DFB 2935 and analog interface controller 2940 may also be coupled to the PHUB 2990. DFB 2935 and a plurality of UDBs 2945, which are part of a UDB array 2942, may be coupled to the DSI 2995. DFB 2935 and analog interface controller 2940 may be coupled to the analog subsystem 2955, which may comprise, for example, a bank of SAR DACs 2960, a bank of DSMs 2965, a bank of SC/CT functional blocks 2970, a bank of comparators 2975, and LCD channel 2980, and a capacitive sensing (CapSense™) channel 2985. SAR DAC bank 2960, DSM bank 2965, SC/CT bank 2970, COMP bank 2975, LCD channel 2980, and CapSense™ channel 2985 may be coupled to DSI 2995. A programmable reference generation block 2930 may be coupled to the analog subsystem 2955.

Reconfigurable routing of the analog subsystem 2955 allows IOs to be routed to any analog resource as a bank of functions (DAC, comparators, SC/CT functional blocks, opamps, and the like). Additionally, reconfigurable routing of the analog subsystem 2955 may allow intra-block routing or intra-channel routing for specific functions (DAC, comparators, SC/CT functional blocks, opamps, and the like). The reconfigurable routing may be controlled by the microprocessor (CPU), the DMA, register interfaces, by programmable digital logic, or the like. In one embodiment, UDBs may be configured to provide the programmable digital logic that controls the analog reconfigurability.

Signal processing characteristics of analog and mixed-signal blocks, banks (of blocks) or channels may be controlled by programmable digital logic regardless of their type. For example, an ADC and a comparator, which are not part of the same analog block or bank or channel, may be reconfigured to output or process signals by the same control element, such as a UDB or DMA controller.

Data and clock signals from analog and mixed-signal blocks, banks or channels may be routed on-chip to other analog and mixed signal blocks, banks or channels or to digital subsystem components to extend the signal processing capability of the device. For example, digital filtering of an ADC output, spread spectrum clocking, and clocking with variable jitter may be accomplished by routing analog and mixed-signal outputs through the programmable interconnect to other on-chip elements.

Additionally, analog and mixed-signal blocks, banks and channels may be controlled synchronously or asynchronously by digital signals from the clocking or digital subsystems through the analog routing (illustrated in FIG. 19).

Memory Subsystem

Referring to FIG. 1, core architecture 100 may include a memory subsystem that may include, for example, static RAM (e.g., 137), flash program memory (e.g., 139), EEPROM (e.g., 136), and an external memory interface (e.g., EMIF 138). Static RAM may be used for temporary data storage and may be accessed by the CPU (e.g., 141) or the DMA controller (e.g., 144). The static RAM may be accessed by the CPU or the DMA controller at different times or simultaneously.

Figure 30:
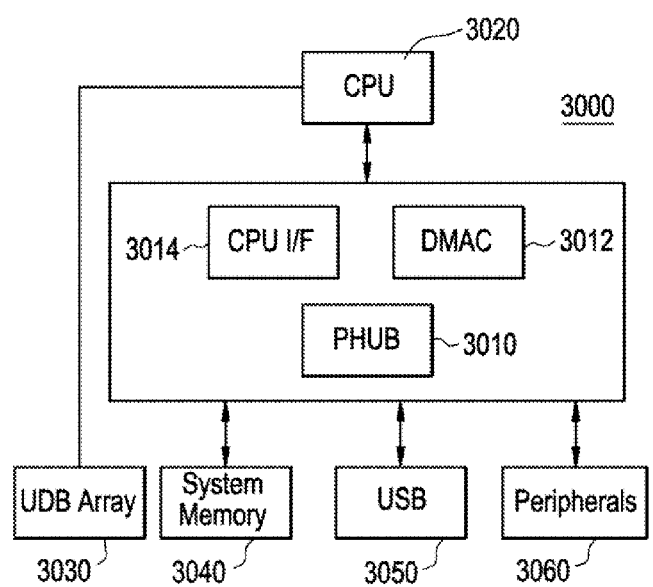
FIG. 30 illustrates a block diagram of a DMA in-system according to one embodiment.

FIG. 30 illustrates a block diagram of a DMA controller 3012 in a system 3000 according to one embodiment. The DMA controller 3012 (e.g., 144, FIG. 1) may form part of the CPU subsystem (e.g., 140, FIG. 1) or may be a separate, independent function. In either configuration, the DMA controller 3012 may access the memory subsystem to configure programmable analog and digital resources as well as to route signals from one system element to another without increasing CPU bandwidth overhead. DMA may be invoked by the interrupt controller, by elements of the digital subsystem or by the CPU (e.g., 141, FIG. 1).

DMA controller 3012 and a CPU interface (CPU I/F) 3014 may form part of a peripheral hub (PHUB) 3010. PHUB 3010 may be coupled to the UDB array 3030 (e.g., illustrated in FIG. 2), the memory subsystem (e.g., 135, FIG. 1), the USB controller 3050, or other system peripherals 3060, which may include, for example, elements of the analog subsystem (FIG. 18), the digital subsystem (FIG. 2) or system-wide resources (e.g., 160, FIG. 1). The DMA controller 3012 may be coupled through the PHUB 3010 to the CPU 3020 (e.g., 141, FIG. 1), which may also receive signals from the UDB array 3030.

Flash memory provides nonvolatile storage for user firmware, user configuration data, bulk data storage, optional error correcting code (ECC), and other like information. In some embodiments, flash memory may be allocated to ECC specifically. In other embodiments, the flash memory allocated to ECC may be reallocated to other flash memory functions when not used for ECC. ECC may correct and detect errors in firmware memory. In some embodiments, an interrupt may be generated when an error is detected.

Programming of flash memory may be performed through a special interface and preempt code execution out of flash memory. The flash programming interface may perform flash erasing, programming and setting code protection levels. Flash in-system serial programming (ISSP), which may be used for production programming, may be performed through both the SWD and JTAG interfaces. In-system programming, which may be used for bootloaders, may be completed through interfaces such as, for example, I2C, USB, UART, SPI or other like communication protocols. Flash memory may include a flexible flash protection model that prevents access and visibility to on-chip flash memory. A flash protection module may prevent duplication or reverse engineering of proprietary code.

EEPROM memory may be a byte-addressable nonvolatile memory. Reads from EEPROM may be random access at the byte level. Reads may be completed directly; writes may be completed by sending write commands to an EEPROM programming interface. CPU code execution may continue using programs stored in flash memory during EEPROM writes. EEPROM may be erasable and writeable at the row level. In some embodiments, EEPROM may be divided into 128 rows of 16 bytes each. In other embodiments, EEPROM may be divided into more or fewer rows or more or fewer bytes.

Figure 31:
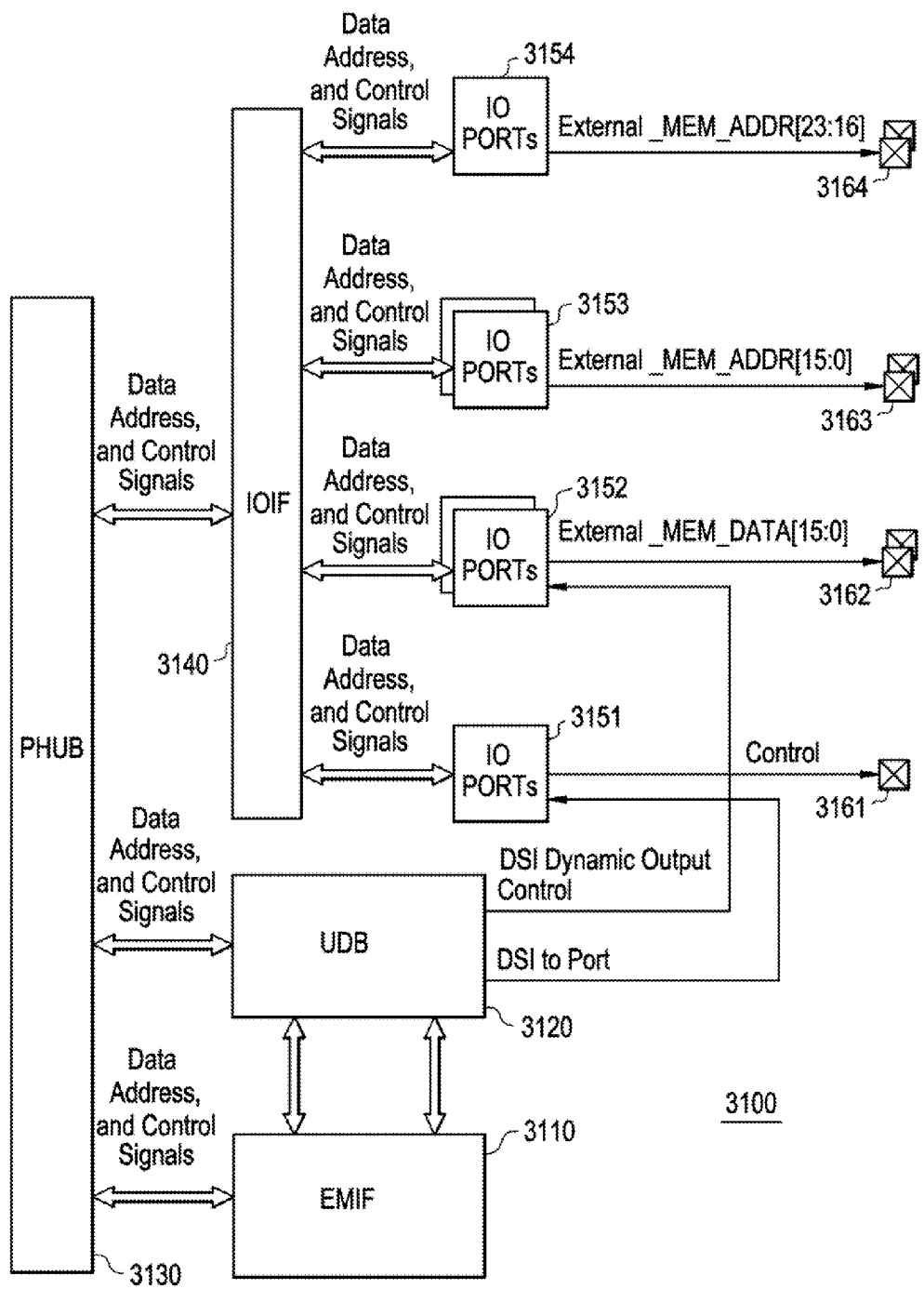
FIG. 31 illustrates an external memory interface (EMIF) according to an embodiment.

FIG. 31 illustrates one embodiment of an EMIF 3110 in a system 3100. EMIF 3110 may be coupled to a UDB 3120 for sending and receiving of EM control signals and other suitable types of control signals. EMIF 3110 may be coupled to PHUB 3130 for sending and receiving data, address, and control signals. PHUB 3130 may be coupled UDB 3120 for sending and receiving data, address, and control signals. PHUB 3130 may be coupled to IO interface (IO IF) 3140 for sending and receiving data, address, and control signals. IO IF 3140 and UDB 3120 (through the DSI) may be coupled to IO ports 3151 for connection to pin 3161 for control signals. IO IF 3140 and UDB 3120 (through DSI dynamic output control) may be coupled to IO port 3152 for connection to pin 3162 for external memory data. IO IF 3140 may be coupled to IO port 3153 for connection to pin 3163 for external memory addressing (e.g., lower word of address). IO IF 3140 may be coupled to IO port 3154 for connection to pin 3164 for external memory addressing (e.g., upper word of address). EMIF 3110 may allow read and write accesses to external memories. EMIF 3110 may support synchronous and asynchronous memories, and may support either type of memory at a time or both simultaneously.

Clocking Subsystem

Referring to FIG. 1, the clocking subsystem 161 of the core architecture 100 may be configured to generate, divide and distribute clocks through the system. Internal and external clocks allow for optimized accuracy, power and cost. All or some system clock sources may be used to generate clock frequencies determined by the application requirements with clock dividers and UDBs. Clock generation may be automatically configured through a development environment, such as the PSoC Creator™ IDE graphical interface distributed by Cypress Semiconductor Corporation (San Jose, Calif.).

Figure 32:
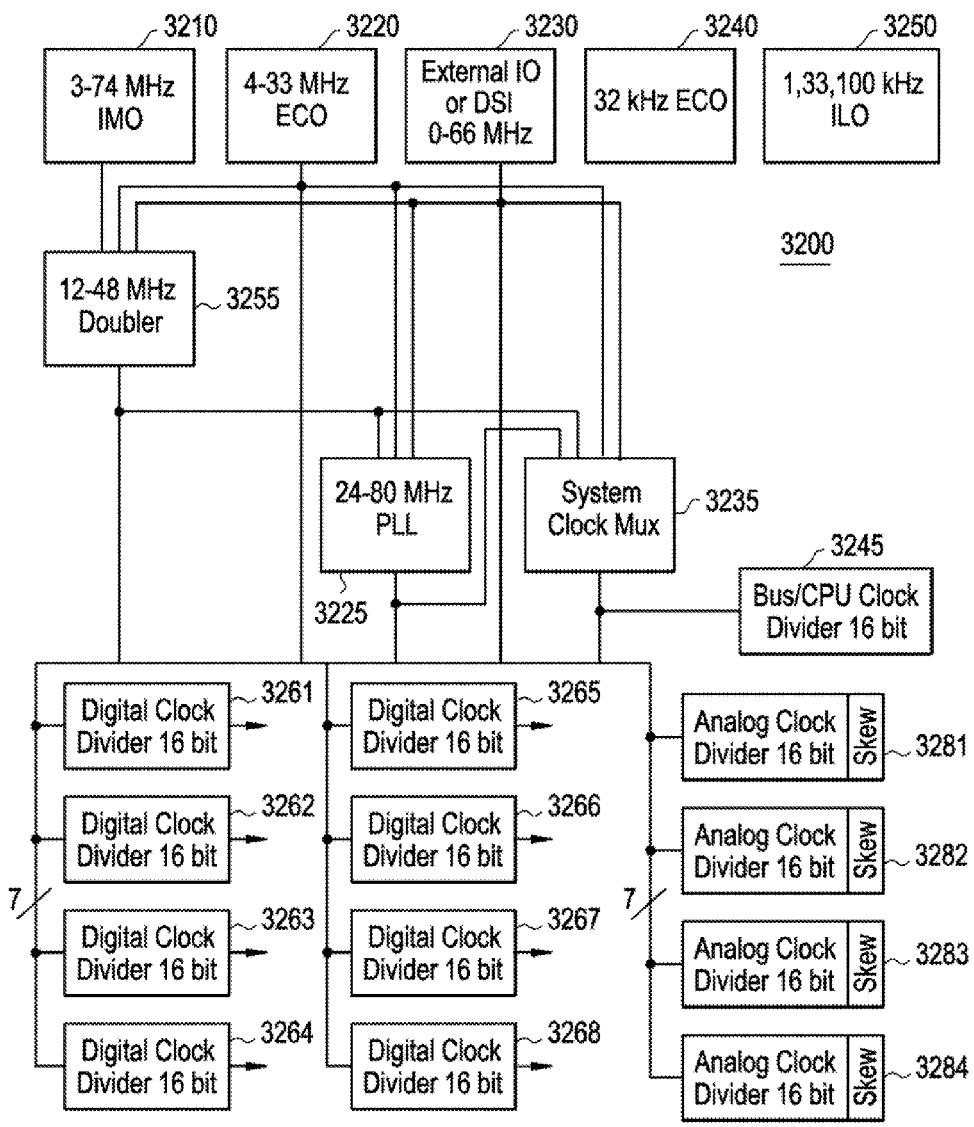
FIG. 32 illustrates a clocking subsystem of core architecture according to an embodiment.

FIG. 32 illustrates one embodiment of the clocking subsystem 3200, also shown in FIG. 1 (clocking subsystem 161). Clocking subsystem 3200 may include IMO 3210. IMO 3210 may output a stable clock and may operate with no external components. IMO 3210 may be locked to an external frequency, such as a USB signaling frequency, an RS232 bit period, I2C clock or other externally provided signals of known frequency, period or duration. IMO 3210, in conjunction with PLL 3225, may allow generation of CPU and system clocks up to the device's maximum frequency. High-speed external crystal oscillator (ECO) 3220 provides a high-frequency, high-precision clock using an external crystal. Oscillator 3220 may support a plurality of crystal types within a specified range. When used in conjunction with PLL 3225, oscillator 3220 may generate CPU and system clocks up to the device's maximum frequency. DSI 3230 provides routing or clocks taken from external clocks connected to IO or generated within the device in the digital system or UDBs. In some embodiments, the primary DSI clock may provide access to all clocking resources and up to, for example, eight or other suitable number of other DSI clocks, which may be generated internally or externally. Access to clocking resources may be used by system resources to achieve digital, analog, or mixed-signal functions that require clocking to, for example, control switches, provide reference signals for timers and counters, and process signals from ADCs and DACs. In other embodiments, the primary DSI clock may be routed directly to digital clock dividers 3261-3268. While eight digital clock dividers are illustrated, one of ordinary skill in the art would recognize that more or fewer clock dividers can be used.

Low-speed ECO 3240 provides precision timing with minimal power consumption using, for example, an external watch crystal for on-chip clocking resources that are not low enough power or high enough precision for an application. The low-speed ECO 3240 may also be coupled to the sleep timer directly and provide the source for a Real Time Clock (RTC). Low-speed ECO 3240 may operate in several power modes, such as high or low, which allows for lower power consumption or greater noise immunity from neighboring circuits, depending on the application requirements. Low-speed ECO 3240 power modes may be set by the CPU in run-time or during development by, for example, setting associated registers. Internal low-speed oscillator (ILO) 3250 provides clock frequencies for low power consumption, including a watchdog timer (WDT) and a sleep timer. In some embodiments, ILO 3250 may generate three different clocks. In other embodiments, ILO 3250 may generate more or less than three clocks. A central timewheel (CTW) of the device may be the free-running counter clocked by the ILO 3250. The CTW may be enabled unless the device is in hibernate mode or when the CPU is stopped during debug-on-chip mode. The CTW may be used to generate periodic interrupts for timing purposes or to wake the system from a lower power mode. The CTW may be reset using firmware by writing to a reset register of the clocking subsystem.

PLL 3225 allows low-frequency, high-accuracy clocks to be multiplied to higher frequencies for applications that require clock frequencies higher than those native to the clocking subsystem 3200. PLL 3225 provides a mechanism for generating clock frequencies based upon a variety of input sources. PLL 3225 comprises input and feedback dividers that supply a plurality of discrete ratios to create almost any desired system clock frequency, and may be configured to use a clock from the IMO 3210, high-speed ECO 3220, or DSI 3230. Clock doubler 3255 may output a clock at twice the frequency of the input clock for simple doubling of clock signals for higher frequency applications. In one embodiment, clock doubler 3255 may be configured to use a clock from IMO 3210, high-speed ECO 3220, or DSI 3230.

System clock MUX 3235 selects and supplies the fastest clock in the system for general system clock requirements and clock synchronization of the device, thereby ensuring that the device is running at its fastest for the selected power mode. If a higher clock source that what is active is available, the system clock MUX 3225 changes the clocking input for the system to the faster clock source. Bus clock divider 3245 uses the system clock MUX 3235 output to generate the system's bus clock used for data transfers and by the CPU. Fully programmable digital clock dividers 3261-3268 may generate digital subsystem clocks for general use in the digital system, as configured by design requirements. Digital subsystem clocks may generate custom clocks derived from any of the clock sources for any purpose. In some embodiments, clocks generated by the digital clock dividers 3261-3268 may be used for baud rate generators, accurate PWM periods, timer clocks, or other digital functions. For applications that require more digital clock dividers than are available, UDBs and fixed function timers, counters or PWMs may generate clocks for use by the digital subsystem. Analog clock dividers 3281-3284 may generate clocks for analog system components that require clocking. Analog clock dividers 3281-3284 may include skew control to ensure that critical analog events do not occur simultaneously with digital switching events, so that analog system noise may be reduced.

Figure 33:
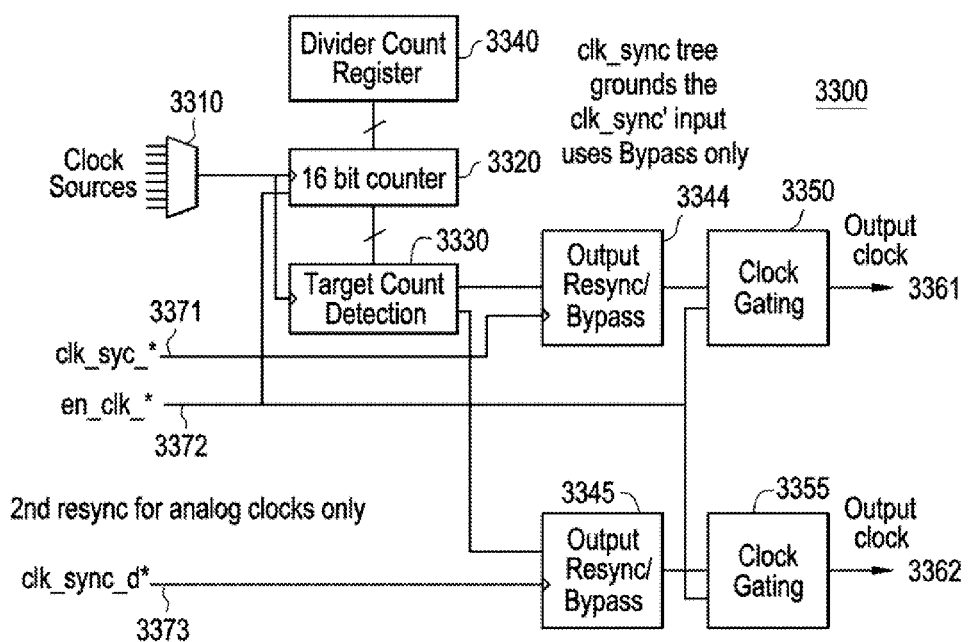
FIG. 33 illustrates a block diagram of a clock divider according to an embodiment.

FIG. 33 illustrates a block diagram of one embodiment of a clock divider 3300 (e.g., digital clock dividers 3261-3268, FIG. 32). Clock sources 3301 may be coupled to the inputs of MUX 3310. The output of MUX 3310 may be coupled to the inputs of the counter block 3320 and target count detection block 3330. Divider count register block 3340 may be coupled to counter block 3320, and counter block 3320 may be coupled to target count detection block 3330. The output of target count detection block 3330 may be coupled to the input of output resync/bypass blocks 3340 and 3345. Clk_sync_* signal 3371 may be coupled to the input of output resync/bypass block 3340. Clk_sync_d* signal 3373 may be coupled to the input of output resync/bypass block 3345. En_clk_* signal 3372 may be coupled to the input of counter block 3320 and clock gating blocks 3350 and 3355. The output of output resync/bypass blocks 3340 and 3345 may be coupled to the inputs of clock gating blocks 3350 and 3355, respectively. Clock gating blocks 3350 and 3355 may output clock signals clk_a* 3361 and clk_ad* 3362, respectively. In one embodiment, digital clock divider 3300 may comprise a multiplexer, a clock divider (which may divide by 2 and higher) that generates clocks with a duty cycle, system clock resynchronization logic, deglitch logic, and the like. In one embodiment, the duty cycle may be approximately 50%. In other embodiments, the duty cycle may be substantially more or less than 50%. The outputs from each digital clock tree may be routed into the DSI and brought back into the clock system as an input, allowing clock chaining.

A USB clock domain shown in FIG. 15 (e.g., IMO 1540) may operate substantially asynchronously from the main clock network shown in FIGS. 32 and 33. Such a configuration allows USB communication to run at the bus frequency without burdening the rest of the system generally or the CPU and clocking subsystem specifically. USB logic may contain a synchronous bus interface to the chip, while running on an asynchronous clock to process USB data. USB logic may require a specific clock frequency, which can be generated from several sources including, for example, the DSI clock though a multiple of the IMO (e.g., 3210, FIG. 32), a DSI signal, or an external crystal oscillator.

Power Management Subsystem

As illustrated in FIG. 1, the power management subsystem 171 may be used to power internal circuits in different power modes and to regulate the external supply. The power management system, with proper control from a power manager, keeps the appropriate domains powered in different power modes to achieve the lowest possible current for required device operation.

Figure 34:
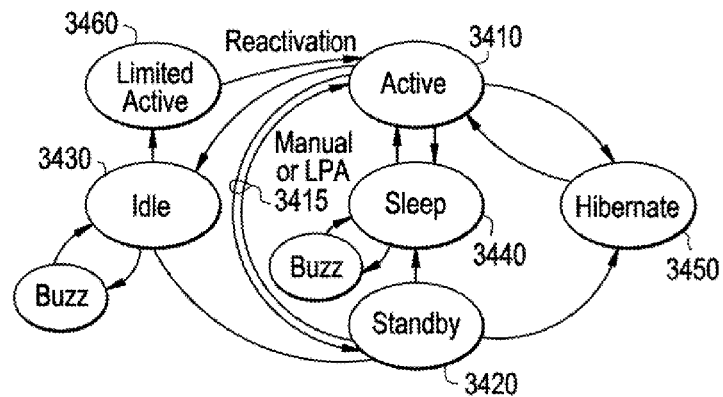
FIG. 34 illustrates a state diagram for power modes that may be implemented by a power management subsystem of a core architecture according to an embodiment.

FIG. 34 illustrates a state diagram for power modes that may be implemented and managed by the power management system. Power modes are entered and exited based on power and processing requirements of the application. Power modes may be controlled by the CPU based on program execution or may be controlled by an external controller through writing to registers within the power subsystem. Active 3410 and standby 3420 modes may be the main processing modes for standard device operation. A hybrid mode called low power active (LPA) 3415 may use the ILO and IMO to enable automatic, duty-cycled alternation between active and standby modes 3410 and 3420. Idle 3430, sleep 3440, and hibernate 3450 may be used when the system is expected to not require active 3410 mode for an extended period of time. Limited active 3460 may be a transitional mode that allows early access to a limited subset of device capabilities and resources, while certain areas of the chip or device are enabled in a startup sequence.

Each power controllable subsystem may be enabled or disabled using appropriate power configuration settings. Power configuration settings may indicate which subsystems are enabled during different modes. In one embodiment, the power configuration settings may include bits for active 3410 and standby 3420 modes, which configure different sets or subsets of subsystems to be enabled. Idle 3430, sleep 3440, and hibernate 3450 modes may disable all subsystems regardless of the configuration settings in one embodiment. In another embodiment, idle 3430, sleep 3440, and hibernate 3450 modes may have still different sets of subsystems enabled. Subsystems may be marked as unused to prevent them from resuming from idle 3430, hibernate 3450, or sleep 3440 mode. This may reduce power overhead of device wakeup by not powering up unused subsystems. Available subsystems may be automatically and dynamically enabled and disabled whenever the configuration settings are updated or a global power mode changes. Global power mode changes may be affected by, for example, a wake up event or register write. A wake up event may automatically return the device to active 3410 mode and enable the CPU, regardless of the configuration settings. Active 3410 mode may be the default global power mode on boot. In other embodiments, a wake up event may automatically return the device to a mode different from active 3410 mode. In such embodiments, the mode may be a transitional mode that is entered long enough to determine the correct power mode.

Hibernate 3450 mode may be used to maintain power to limited static RAM, retention registers, and a bare minimum of logic during low-power domain. The same elements that are maintained in hibernate may be maintained in sleep 3440 mode with the addition of the ILO, low-speed crystal oscillator and the central timewheel. Standby 3420 and LPA 3415 modes may configure the device to have its LDOs ON, but at low frequency or clock-gated. Such a configuration may create low current load on the LDOs, though the LDOs are capable of handling a high-current load instantaneously. In one embodiment, one LDO may be operational, while the other is not, but its operation gated by a wakeup event to the first LDO.

Wakeup events may be configurable and may come from an interrupt, an external wakeup source, an LPA scheduler, a reset, or the like. A wakeup event restores the system t active 3410 mode. Interrupt sources for wakeup events include, but are not limited to: user interrupts, watchdog timer (WDT) and the central timewheel (CTW). User interrupt sources may be programmable in firmware and can be generated from a variety of device peripherals, such as, for example, analog comparators and UDBs. The CTW may provide periodic interrupts to produce wakeup events, poll peripherals or perform real-time functions. External wakeup sources may include, for example, PICUs, comparators and test controller wakeups. An LPA scheduler may issue automatic wakeup events.

Resets may be generated to reset the device to a desired power mode. Reset event sources may include, but are not limited to: dedicated external resets, configurable external resets, precision resets, and a watchdog reset (WDR). Imprecise resets (IRESs) may be disabled during boot, causing them to be unavailable as a valid wakeup source. Other reset sources include, for example, an external reset (XRES), software reset (SRES), and watchdog timer reset (WRES). XRES may be through a general purpose IO pin or a dedicated XRES pin. Such a pin, if configured, may hold the device in reset while in a pin state. In one embodiment, the state that maintains the device in reset is active low. The response to an XRES is the same as a power-on reset (POR). SRES may be initiated by, for example, a bit of a software reset register. The bit of the software reset register may be set directly by the program during operation of indirectly through DMA access. The response to an SRES is the same as a POR. WRES detects when the device program is no longer being executed properly. In one embodiment, the device program runs a function to indicate to the WDT that it is running correctly. Failure to do so within a specified amount of time may indicate faulty operation of the device program and instigates a SRES.

For purposes of illustration and not limitation, Table 1 specifies interrupts, resets, clocks, and wakeup sources that can be used for each power mode according to one embodiment.

TABLE 1

Interrupt and Clock Sources by Power Mode

| Mode | Wake up Source | Reset | Clocks |
| --- | --- | --- | --- |
| Active | External, RTC, CTW, FTW, User, Reset | All | IMO, ILO/ECO, User |
| LPA | External, RTC, CTW, FTW, User, Reset | All | IMO (cycled), ILO/ECO, User |
| Stand by | External, RTC, CTW, FTW, User, Reset | All | IMO (optional) ILO/ECO, User |
| Idle/Sleep | External, RTC, CTW, Reset | External, Hibernate WDR | ILO/ECO |
| Hibernate | External, Reset | External, Hibernate | — |

Figure 35:
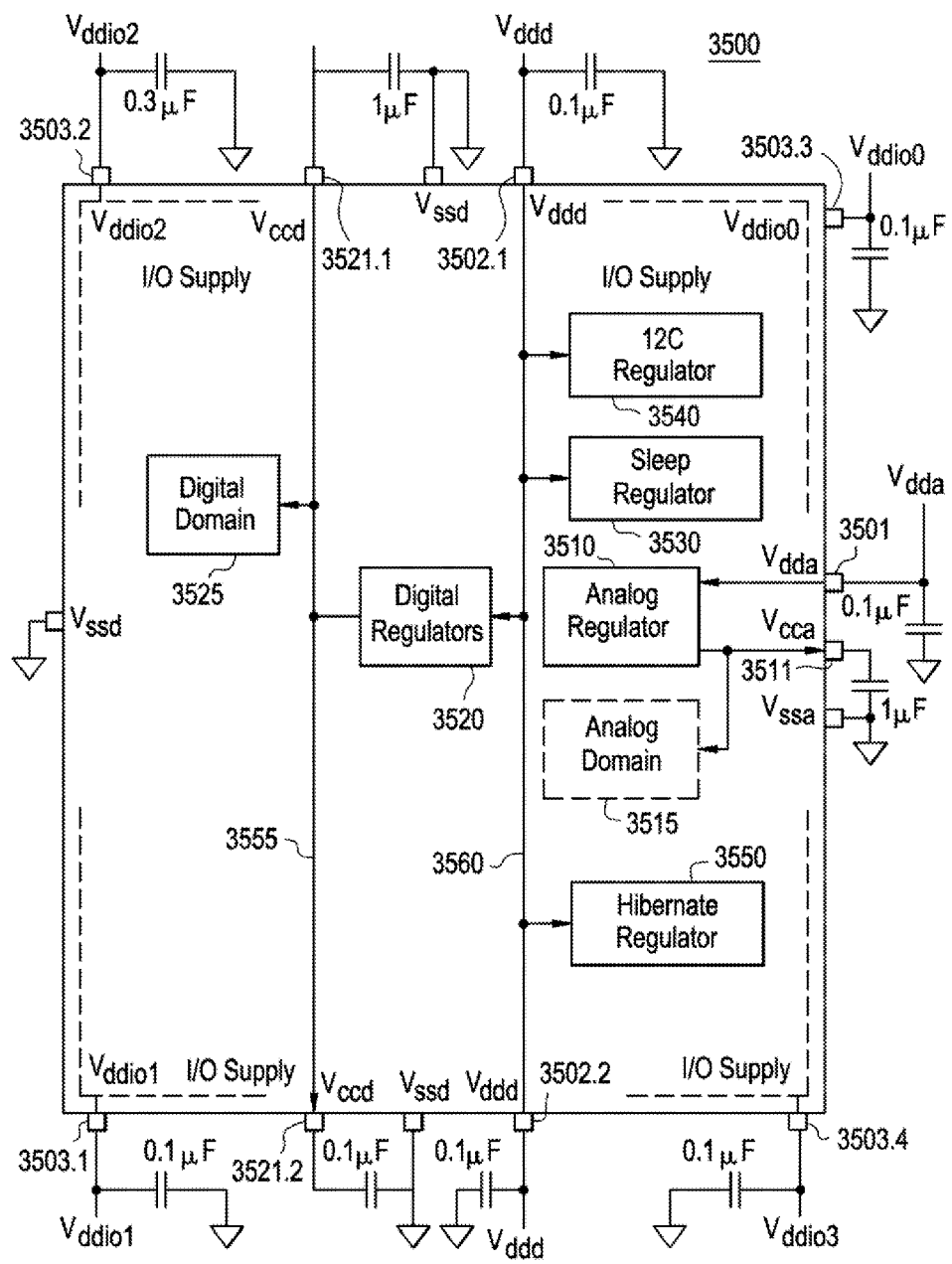
FIG. 35 illustrates a block diagram of a power subsystem of a core architecture according to an embodiment.

FIG. 35 illustrates a block diagram of power management subsystem 3500 from FIG. 1 (power management subsystem 171). Power management subsystem 3500 includes analog, digital and IO supply pins 3501, 3502.1-3502.2, and 3503.1-3504.3, respectively. Analog regulator 3510 may be coupled to analog supply pin 3501 and to analog power output pin 3511. Analog regulator 3510 supplies power to the analog domain 3515. Digital regulator 3520 may be coupled to digital supply pins 3502.1-3502.2 and to digital power output pins 3521.1-3521.2. Digital regulator 3520 supplies power to digital domain 3525 via power supply bus 3555. Digital supply pins 3502.1-3502.2 supply power to sleep regulator 3530, I2C regulator 3540, and hibernate regulator 3550 via power supply bus 3560.

Figure 36:
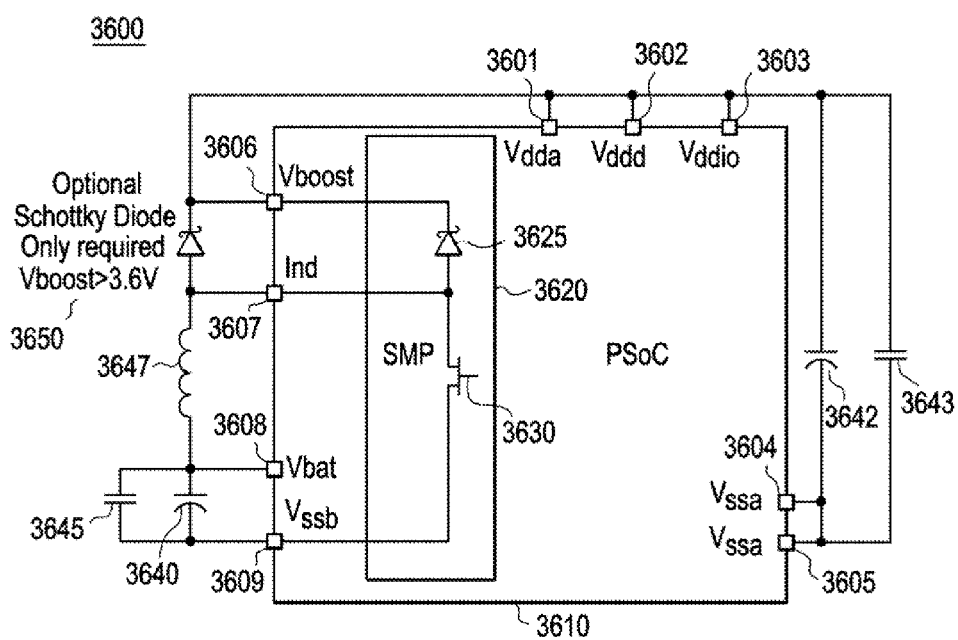
FIG. 36 illustrates a boost converter of a power subsystem according to an embodiment.

FIG. 36 illustrates a boost converter 3600 as part of the power management subsystem (e.g., SMP 175, FIG. 1) according to one embodiment. Though not shown, one of ordinary skill in the art would understand that a buck converter could also be implemented as part of the power management subsystem. Boost converter 3600 may be used to provide power to the system when the available voltage is below the system's operational voltage. Boost converter 3600 includes the device 3610 (e.g., a PSoC® device offered by Cypress Semiconductor Corporation, San Jose, Calif. or the like). Device 3610 may include Vdda pin 3601, Vddd pin 3602, and Vddio pin 3603 which are all coupled to Vboost pin 3606. Capacitor 3642 may be coupled between Vdda pin 3601, Vddd pin 3602, and Vddio pin 3603, collectively, and Vssa pin 3604 and Vssd pin 3605, collectively. Capacitor 3643 may be coupled between Vdda pin 3601, Vddd pin 3602, and Vddio pin 3603, collectively, and Vssd pin 3605. Inductor 3647 may be coupled between Ind pin 3607 and Vbat pin 3608. Battery 3645 and capacitor 3640 may be coupled in parallel between Vbat pin 3608 and Vssb pin 3609. Schottky diode 3625 may be coupled between Vboost pin 3606 and Ind pin 3607 as part of SMP circuit 3620. Vssb pin 3609 may be coupled to one electrode of SMP transistor 3630, which is part of SMP circuit 3620. The input of Schottky diode 3625 may be coupled to a second electrode of SMP 3630. An optional Schottky diode 3650 may be coupled between Vboost pin 3606 and Ind pin 3607 externally to the device 3610 if Vboost is to be greater than a predetermined voltage (e.g., 3.6V or any suitable voltage level).

The boost converter of the core architecture may be used to boost the supply voltage from lower supply levels to the device operational voltage. The boost converter may accept a lower input voltage and produces a selectable output voltage using an external inductor, sourcing enough current to operate the device and other on-board components. In one embodiment, the boost converter may accept voltages between 0.5V and 5.5V, output a user configurable output voltage of 1.8V to 5.0V, and deliver up to 50 mA.

The boost converter may be operated in several modes set by, for example, writing to registers by the CPU or DMA controller. According to one embodiment, the modes may be active and standby. Active mode is the normal mode of operation where the boost regulator actively generates a resultant output voltage. In standby mode, most boost functions are disabled, which may reduce power consumption of the boost circuit. The booster converter may be configured to provide low power, low current regulation in standby mode. In another embodiment, an external 32 kHz crystal (or an external crystal of any suitable frequency) may be used to generate inductor boost pulses on the rising and falling edges of the clock when the output voltage is less than the programmed value.

Input/Output (IO)

Device IOs may possess both analog and digital capabilities and be capable of supporting a number of drive modes. IO may be in one of several categories, including, but not limited to: general purpose IO (GPIO), special IO (SIO) or USB IO (USBIO). GPIO and SIO may provide similar digital functionality, with the primary differences being, for example, analog capability, drive strength, input threshold and output signaling voltage. USBIO may be capable of supporting specific USB functionality and some limited GPIO functionality. All or substantially all IO pins may be available for use as digital inputs and outputs for both the CPU and digital peripherals. In additional, some or all IO may be capable of generating an interrupt. GPIOs may be used for analog input, capacitive sensing and LCD segment drive. SIOs may be used for voltages in excess of the analog supply voltage.

For purposes of illustration and not limitation, GPIO may support the following features:
user programmable port reset state,
separate IP supplies and voltages for up to four groups of IO,
digital peripherals using DSI to connect to pins,
input of output or both the CPU and DMA,
multiple drive modes,
an interrupt source configured as rising edge, falling edge or both edges,
level-sensitive interrupts that may be supported through the DSI,
dedicated port interrupt vector for each port,
slew rate controlled digital output drive mode,
access port control and configuration registers on either port-basis or pin-basis,
separate port-read and -write data registers to avoid read-modify-write errors,
specialized functionality,
LCD segment drive,
capacitive sensing,
analog input and output capability,
continuous clamp current, and
standard drive strength.

Figure 37:
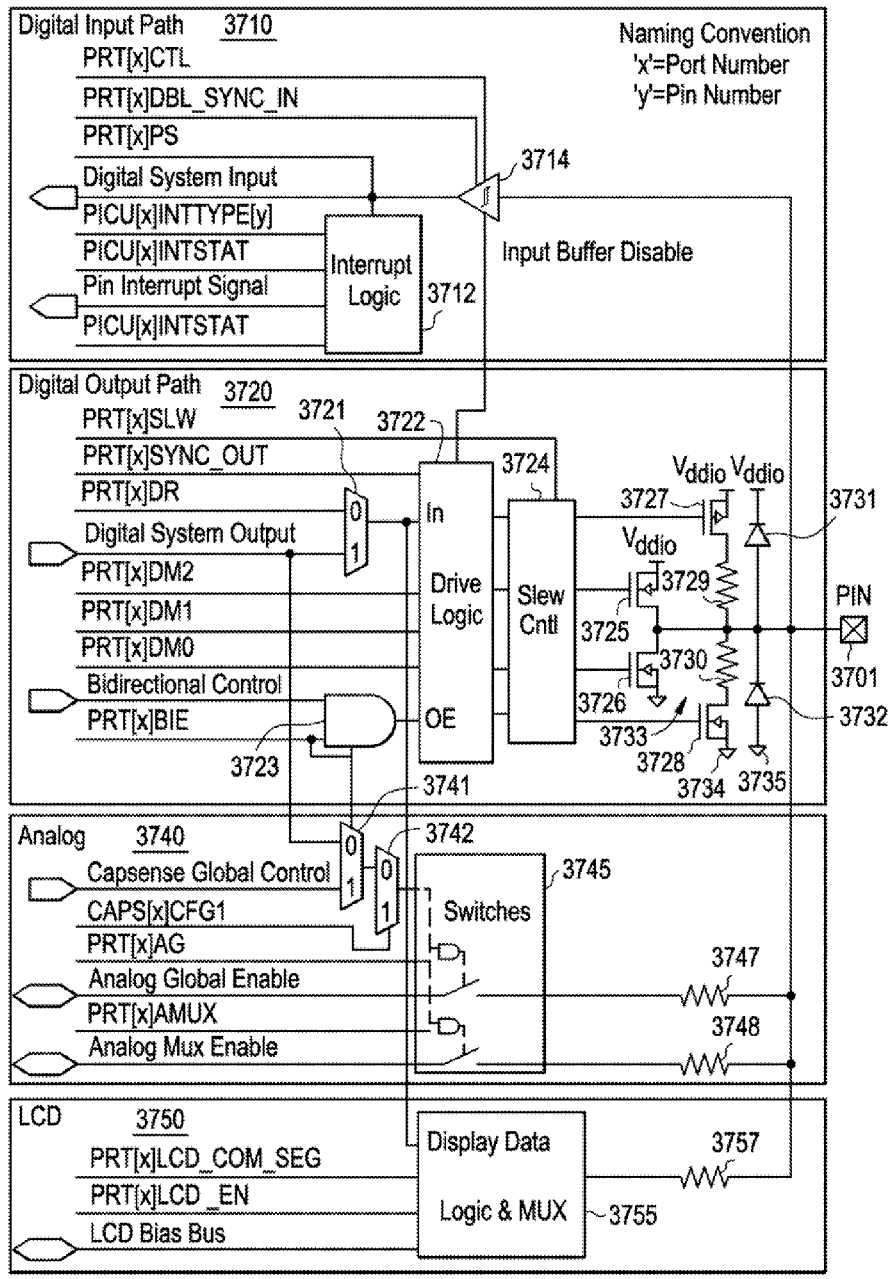
FIG. 37 illustrates a block diagram of a general purpose input/output (GPIO) of core architecture according to an embodiment.

FIG. 37 illustrates a block diagram of a GPIO 3700. GPIO 3700 includes several sections, including, but not limited to: digital input path section 3710, digital output path section 3720, analog section 3740, and LCD section 3750. Digital input path section 3710 may include interrupt logic 3712. Interrupt logic 3712 may have connections to PICU[x]INTTYPE[y], PICU[x]INTSTAT, PRT[x]PS, and PICU[x]INTSTAT signals, as well as to the Pin Interrupt Signal and Digital System Input signals, and Schmitt trigger 3714. PRT[x]CTL, PRT[x]DBL_SYNC_IN, PRT[x]PS, and Digital System Input signals may be coupled to Schmitt trigger 3714. Schmitt trigger 3714 couples to pin 3701 and to drive logic 3722 of digital output path section 3720 for receiving an Input Buffer Disable signal.

Digital output path section 3720 includes signals PRT[x]SLW, PRT[x]SYNC_OUT, PRT[x]DR, PRT[x]BYP, PRT[x]DM2, PRT[x]DM1, PRT[x]DM0 and PRT[x]BIE, as well as connections to the Digital System Output and Bidirectional Control signals. PRT[x]SLW signal may be coupled to slew control 3724. PRT[x]SYNC_OUT signal may be coupled to drive logic 3722. PRT[x]DR and Digital System Output signals may be coupled to inputs of MUX 3721. The output of MUX 3721 may be coupled to the input of drive logic 3722 and to the display data input of logic and MUX block 3755 of LCD section 3750. PRT[x]BYP signal may be coupled to MUX 3721 as a MUX control signal. The Digital System Output signal may be coupled to an input of MUX 3741 of analog section 3740. PRT[x]DM2, PRT[x]DM1, and PRT[x]DM0 signals may be coupled to drive logic 3722. Bidirectional control and PRT[x]BIE signals may be coupled to inputs of AND logic 3723. PRT[x]BIE signal may be coupled to an output of AND logic 3723 and to MUX 3741 as a control signal. The output of AND logic 3723 may be coupled to the OE input of drive logic 3722. Slew control 3724 may be coupled to drive logic 3722 and PRT[x]SLW signal, as well as to gates of transistors 3725-3728. A first terminal of transistor 3725 may be coupled to an IO supply voltage, Vddio. A second terminal of transistor 3725 may be coupled to pin 3701 and a first terminal of transistor 3726. The second terminal of transistor 3726 may be coupled to ground 3733. A first terminal of transistor 3727 may be coupled to the IO supply voltage, Vddio. A second terminal of transistor 3727 may be coupled to pin 3701, the second terminal of transistor 3725, and the first terminal of transistor 3726, all through resistor 3729. The second terminal of transistor 3727 may be coupled to a first terminal of transistor 3728 through resistors 3729 and 3730. The second terminal of transistor 3728 may be coupled to ground 3734. Pin 3701 may be coupled to IO supply voltage, Vddio, through diode 3731, and to ground 3735 through diode 3732.

Analog section 3740 includes MUX 3741. The inputs of MUX3741 may be coupled to the Digital System Output and logic "1" signals, and the output may be coupled to an input of MUX 3742. CapSense Global Control signal may be coupled to an input of MUX 3742. Signal CAPS[x]CFG1 may be coupled to MUX 3742 as a control signal. Analog Global Enable and Analog MUX Enable signals may be coupled to pin 3701 through switches 3745 and resistors 3747 and 3748, respectively. Switches 3745 may be controlled by the output of MUX 3742 ANDed with either signal PRT[x]AG or PRT[x]AMUX for the Analog Global Enable and Analog MUX Enable signals, respectively.

LCD section 3750 includes logic and MUX block 3755 with connections to the output of MUX 3721, signals PRT[x]LCD_COM_SEG and PRT[x]LCD_EN, and the LCD bias bus. Logic and MUX block 3755 may be coupled to pin 3701 through resistor 3757.

For purposes of illustration and not limitation, SIO may support the following features:
user programmable port reset state,
separate IP supplies and voltages for up to, for example, four groups of IO,
digital peripherals using DSI to connect to pins,
input of output or both the CPU and DMA,
multiple drive modes,
an interrupt source configured as rising edge, falling edge or both edges,
level-sensitive interrupts that may be supported through the DSI,
dedicated port interrupt vector for each port,
slew rate controlled digital output drive mode,
access port control and configuration registers on either port-basis or pin-basis,
separate port-read and -write data registers to avoid read-modify-write errors,
specialized functionality,
high drive strength,
hot swap (input voltage tolerance at any operating voltage),
programmable and regulated high input and output drive,
higher over voltage tolerance, and
general purpose comparator.

Figure 38:
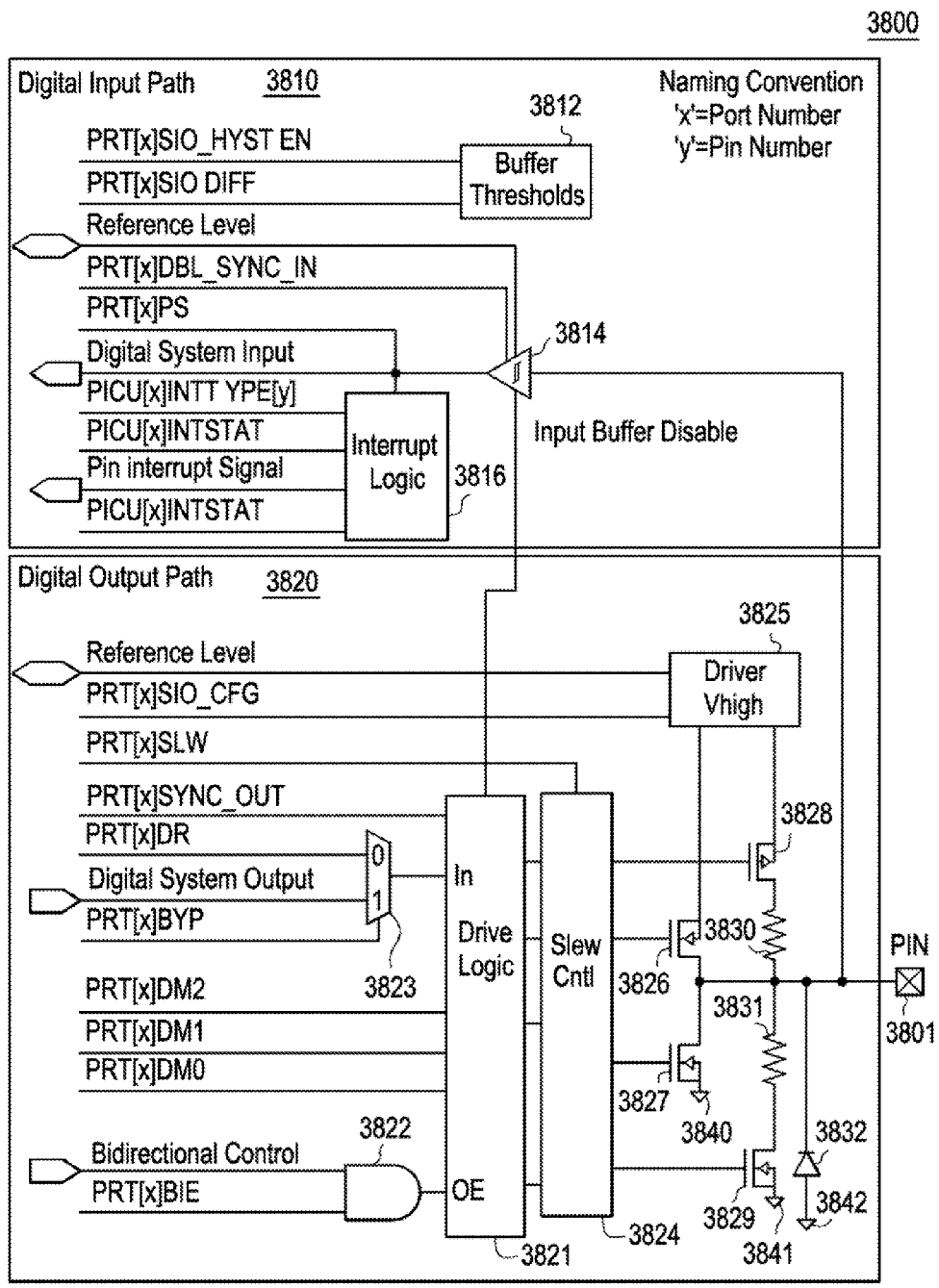
FIG. 38 illustrates a block diagram of a specialized input/output (SIO) of a core architecture according to an embodiment.

FIG. 38 illustrates a block diagram of SIO 3800. SIO 3800 may include digital input path 3810 and digital output path 3820. Digital output path 3810 may include buffer thresholds block 3812, Schmitt trigger 3814, and interrupt logic block 3816. Buffer thresholds block 3812 may be coupled to PRT[x]SIO_HYST_EN, PRT[x]SIO_DIFF, and Reference Level signals. The output of buffer thresholds block 3812 and the PRT[x]DBL_SYNC_IN signal may be coupled to Schmitt trigger 3814. PICU[x]INTTYPE[y], PICU[x]INTSTAT and Pin Interrupt signals may be coupled to interrupt logic block 3816. Interrupt logic block 3816 may be coupled to Schmitt trigger 3814. PRT[x]PS and Digital System Input signals may also be coupled to interrupt logic block 3816 and Schmitt trigger 3814. Schmitt trigger 3814 may be coupled to pin 3801.

Digital output path 3820 may include drive logic block 3821, AND logic 3822, MUX 3823, slew control block 3824, and high-voltage driver 3825. Reference Level and PRT[x]SIO_CFG signals may be coupled to inputs of high-voltage driver 3825. PRT[x]SLW may be coupled to slew control block 3824. PRT[x]DR and Digital System Output signals may be coupled to drive logic block 3821 through MUX 3823, which may be controlled by the PRT[x]BYP signal. Signals PRT[x]DM2, PRT[x]DM1, and PRT[x]DM0 may be coupled to drive logic block 3821. Bidirectional Control and PRT[x]BIE signals may be coupled to drive logic block 3821 through AND logic 3822. Drive logic block 3821 may be coupled to slew control block 3824. Slew control block 3824 may be coupled to gates of transistors 3826-3729. A first terminal of transistor 3826 may be coupled to an output of high-voltage driver 3825, and a second terminal of transistor 3826 may be coupled to pin 3801 and a first terminal of transistor 3827. The second terminal of transistor 3827 may be coupled to ground 3840. A first terminal of transistor 3828 may be coupled to an output of high-voltage driver 3825, and a second terminal of transistor 3828 may be coupled to pin 3801 through resistor 3830 and a first terminal of transistor 3829 through resistors 3830 and 3831. The second terminal of transistor 3829 may be coupled to ground 3841. Pin 3801 may be coupled to ground 3842 through diode 3832.

For purposes of illustration and not limitation, USBIO may support the following features:
Low-, full-, high- or super-speed USB compliance,
high drive strength,
input, output or both for CPU and DMA,
input output or both for digital peripherals,
digital output drive mode, and
pin configuration as rising edge, falling edge, or both edges.

Figure 39:
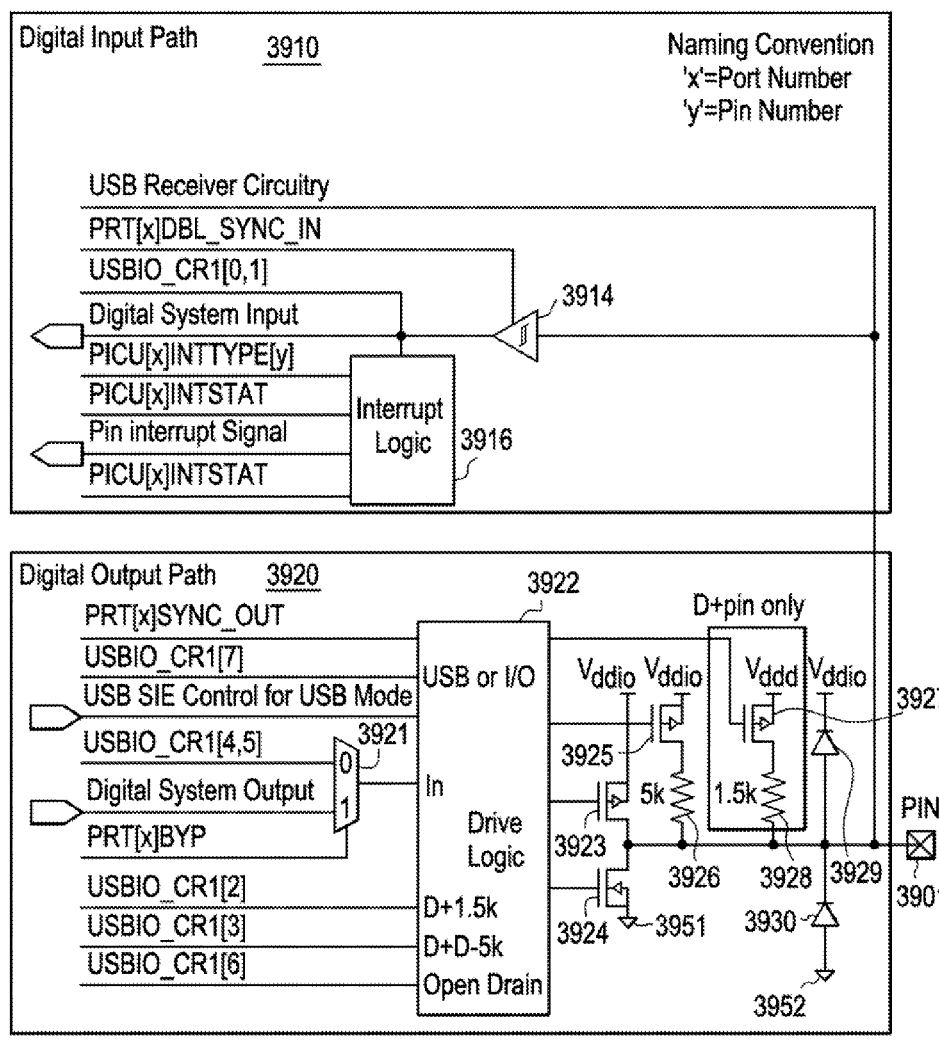
FIG. 39 illustrates a block diagram of a USB input/output (USBIO) of a core architecture according to an embodiment.

FIG. 39 illustrates a block diagram of USBIO 3900. USBIO 3900 may include digital input path 3910 and digital output path 3920. Digital input path 3910 may include Schmitt trigger 2914 and interrupt logic block 3916. USB receiver circuitry may be coupled to pin 3901. Schmitt trigger 3914 may be controlled by the PRT[x]DBL_SYNC_IN signal. Schmitt trigger 3914 comprises an input coupled to pin 3901. The output of Schmitt trigger 3914 may be coupled to the USBIO_CR1[0,1] and Digital System Input signals and interrupt logic block 3916. Interrupt logic block 3916 may also be coupled to PICU[x]INTTYPE[y], PICU[x]INSTAT and Pin Interrupt signals.

Digital output path 3920 may include MUX 3921 and drive logic 3922. The USBIO_CR1[4,5] and Digital System Output signals may be coupled to drive logic 3922 through MUX 3921, which may be controlled by the PRT[x]BYP signal. PRT[x]SYNCH_OUT, USBIO_CR1[7], USBIO_CR1[2], USBIO_CR[3] and USBIO_CR[6] signals may be coupled to drive logic block 3922. USB SIE Control for USB Mode signal may also be coupled to drive logic block 3922. Drive logic block 3922 may be coupled to gates of transistors 3923, 3924, 3925 and 3927. A first terminal of transistor 3923 may be coupled to an IO supply voltage, Vddio. The second terminal of transistor 3923 may be coupled to pin 3901 and to a first terminal of transistor 3924. A second terminal of transistor 3924 may be coupled to ground 3951. A first terminal of transistor 3925 may be coupled to an IO supply voltage, Vddio. A second terminal of transistor 3925 may be coupled to pin 3901 through resister 3926. Pin 3901 may be coupled to an IO supply voltage, Vddio, and ground 3952 through diodes 3929 and 3930, respectively. On the D+ pin of USB devices, transistor 3927 may be coupled between an IO supply voltage, Vddio, and the pin 3901 through resistor 3928.

Each GPIO and SIO may be individually configurable into one of a number of drive modes. These drive modes may include, but are not limited to: high-impedance analog, high-impedance digital, resistive pull up, resistive pull down, open drain drives low, open drain drives high, strong drive, and resistive pull up and down. Pin drive modes may be selected by, for example, configuring the pin drive mode register. FIGS. 40A-40H illustrate simplified pin views based on the aforementioned drive mode settings.

FIG. 40A illustrates a pin configured as high-impedance analog. Pin 4001 is not coupled to DR 4002 or PS 4003. In such a mode, the output driver and the digital input buffer are turned off, which prevents any current from flowing in the IOs digital input buffer due to a floating voltage.

FIG. 40B illustrates a pin 4001 configured as high-impedance digital. Input buffer 4010 is enabled between pin 4001 and PS 4003. DR 4002 is still unconnected.

FIG. 40C illustrates a pin 4001 configured as resistive pull up. Resistor 4040 provides series resistance to Vddio through transistor 4030, while transistor 4035 provides strong drive to ground 4036.

FIG. 40D illustrates a pin 4001 configured as resistive pull down. Resistor 4045 provides series resistance to ground 4036 through transistor 4035, while transistor 4030 provides strong drive to Vddio.

FIG. 40E illustrates a pin 4001 configured as open drain drives low. Transistor 4035 provides strong drive to ground 4036, while the lack of a connection to Vddio provides high impedance to Vddio.

FIG. 40F illustrates a pin 4001 configured as open drain drives high. Transistor 4030 provides strong drive to Vddio, while the lack of a connection to ground 4036 provides high impedance to ground.

FIG. 40G illustrates a pin 4001 configured as strong drive. Transistor 4030 provides strong drive to Vddio, and transistor 4035 provides strong drive to ground 4036. Such a configuration provides strong CMOS output drive in either high or low state. Such a configuration may not be used for input pins under normal circumstances.

FIG. 40H illustrates a pin 4001 configured as resistive pull up and down. Resistor 4040 provides series resistance to Vddio through transistor 4030, while resistor 4045 provides series resistance to ground 4036 through transistor 4035. Such a state is similar to the resistive pull up and resistive pull down states, except that the pin is always in series with a resistor. The high data state is pull up, while the low data state is pull down.

According to an embodiment, pins may be configured through register settings. Registers may also interact with pins. IO registers may be available by port, for example, where each bit of the register corresponds to one port pin. Such a register form is efficient for quickly reconfiguring multiple port pins simultaneously. IP registers may be available by pin, which combines the most commonly used port register bits into a single register for each pin. Such a methodology enables fast configuration changes to individual pins with a single register write.

For example, pins may be high-speed bidirectional capable to provide high impedance digital drive mode for input signals and a second user-selected drive mode such as strong drive for output signals on the same pin, based on the state of an auxiliary control bus signal. The bidirectional capability may be useful for processor busses and communications interfaces such as a SPI slave MISO pin that requires dynamic hardware control of the output buffer. The auxiliary control bus may route a number of UDB or digital-peripherals-generated output enable signals to one or more pins.

For example, GPIO and SIO pins may have fast and slow output slew rate options for strong and open drain drive modes, not resistive drive modes. A slow edge rate option may be used for signals that are not speed critical and provides a signal with reduced EMI. Slew rate may be individually configurable for each pin.

GPIO and SIO pins may be capable of generating interrupts to the system. For example, pins in each port interface to their own port interrupt control unit (PICU) and associated interrupt event. Each pin of a port may be independently configurable to detect rising edge, falling edge, both edge interrupts, or to not generate an interrupt at all. Each time an interrupt event occurs on a pin, its corresponding status bit of an interrupt status register may be set to logic "1," and an interrupt request sent to the interrupt controller, depending on the configured mode for the pin. Each PICU may have its own interrupt vector in the interrupt controller and the pin status register providing determination of the interrupt source down to the pin level. Port pin interrupts may remain active in all sleep modes, allowing the system to wake from an externally generated interrupt. UDBs may provide level-sensitive interrupt capability to the system when required.

GPIO and SIO input buffers may be configurable at the port level for the default CMOS input thresholds or optional LVTTL input thresholds. Input buffers may incorporate Schmitt triggers for input hysteresis or input buffers may be disabled for each drive mode.

Analog connections to GPIO pins may configure GPIO as analog inputs, analog outputs, or both. Each GPIO may connect to one of the analog global busses or to some of the analog MUX busses to connect any pin to any internal analog resource, such as an ADC, comparators, or the like. Some or all pins may provide direct connections to specific analog features, such as the high current DACs, uncommitted opamps, or the like. Additionally, all GPIO may be used to create capacitive sensing (CapSense™) channels. GPIO may also be used to generate segment and common drive signals for direct glass drive of LCD glass.

SIO pins may provide regulated high output levels for interface to external signals that are lower in voltage than the SIO's respective Vddio. SIO pins may be individually configurable to output either the standard Vddio or the regulated output, which is based on an internally generated reference. A voltage DAC (VDAC) may be used to generate an internally regulated reference.

SIO pins may support standard CMOS and LVTTL input levels as well as differential mode with programmable levels. SIO pins may be grouped into pairs, each pair sharing a reference generator block which may be used to set the digital input buffer reference level for interface to external signals that differ in voltage from Vddio. The reference may set the pins' voltage threshold for a high logic level. In some embodiments, available input thresholds may be, for example, (0.5*Vddio), (0.4*Vddio), and (0.3*Vddio). A VDAC may generate the reference voltage.

The adjustable input level of SIOs may be used to construct a comparator. Thresholds for the comparator constructed from the adjustable input level of an SIO may be provided by the SIOs reference generator. The reference generator may have the option to set the analog signal routed through the analog global line as the threshold for the comparator. Hysteresis may be enabled for the input buffer to increase the noise immunity of the comparator.

"Hot Swap" capability may be supported by SIO pins to enable them to plug into applications without loading the signals that are connected to the SIO pins, even when no power is applied to the system. Such a capability allows the system to maintain a high impedance load to an external drive device, while also preventing the system from being powered through a GPIO pin's protection diode when the system is unpowered.

IO pins may provide over-voltage tolerance at any suitable operating Vdd. Such a capability may allow a connection to a bus, such as, for example, I2C, where different devices are running from different supply voltages. The system may be configured to be open drain, drives low mode for an SIO pin. Such a configuration allows an external pull up to pull the I2C bus voltage above the system pin supply.

IOs may be default reset to high impedance analog drive mode and may be reprogrammable on a port-by-port or pin-by-pin basis. IOs may be reset as high impedance analog, pull down or pull up based on the application requirements. Port reset configuration data may be stored in special nonvolatile registers to ensure correct operation. The stored reset data may be automatically transferred to the port reset configuration registers at PPOR release IO pins may retain their state in low power mode until the system is awakened and changed or reset. The system may be awaked through an interrupt due to the pins ability to run normally at low power modes.

Pins may have additional functionality beyond that of GPIO, SIO and USBIO pins. For purposes of illustration and not limitation, additional digital functionality may include:
  for a 4-33 MHz crystal oscillator,
  support for a 32.768 kHz crystal oscillator,
  wake from sleep on I2C address match,
  JTAG interface,
  SWD interface,
  SWV interface, and
  external reset (XRES).

For purposes of illustration and not limitation, additional analog functionality may include:
  opamp inputs and outputs,
  high current DAC (IDAC) outputs, and
  external reference inputs.

CPU Subsystem

Referring to FIG. 1, core architecture 100 may include a CPU subsystem 140. The CPU subsystem 140 may comprise the system controller. The CPU subsystem 140 may control, for example, digital, analog, mixed-signal, communication functions of the system and other like functionality by, for example, writing to registers, generating interrupts, configuring interconnects, executing device programs stored in memory, and the like. For purposes of illustration and not limitation, the CPU subsystem 140 may comprise the following features:
  single-cycle 8051 CPU or other suitable processor,
  flash memory, EEPROM, SRAM, and/or other suitable types of memory (discussed in the Memory Subsystem section),
  a direct memory access (DMA) controller,
  a peripheral HUB (PHUB), and
  an external memory interface (EMIF, discussed in the Memory Subsystem section).

The CPU subsystem 140 may support a plurality of addressing modes including, but not limited to: direct addressing, indirect addressing, register addressing, register specific instructions, immediate constants, indexed addressing and bit addressing. For direct addressing, the operand may be specified by a direct address field and only internal RAM and SFRs may be accessed. For indirect addressing, the instruction may specify the register that contains the address of the operand. Two registers may then be used to specify the address, while the data pointer register (DPTR) may be used to specify a new address. For register addressing, certain instructions may access one of a plurality of registers in a specified register bank. In such applications, these instructions may be more efficient due to the lack of an address field requirement. For register specific instructions, some instructions may be specific to certain registers. For immediate constants, some instructions may carry the value of the constants directly instead of an address. For indexed addressing, the DPTR may be used as the base and an accumulator as an offset to read program memory. For bit addressing, the oper- and may be one of a number of bits. In one embodiment, the number of bits for bit addressing may be 256. In another embodiment the number of bits may be more or less than 256.

The CPU subsystem 140 may be optimized for bit handling and Boolean operations. The types of instructions supported may include, but are not limited to: arithmetic instructions, logical instructions, data transfer instructions, Boolean instructions, and program branching instructions. Arithmetic instructions may support the direct, indirect, register, immediate constant, and register specific instructions addressing modes. Arithmetic modes may be used for addition, subtraction, multiplication, division, increment, and decrement operations. Logical instructions may perform Boolean operations, such as, for example, AND, OR, XOR on bytes, rotate of accumulator content, and sap of nibbles in an accumulator. The Boolean operations on the bytes may be performed on a bit-by-bit basis. Data transfer instructions may be one of plurality of types including, but not limited to, core RAM, xdata RAM, and look-up tables (LUTs). Core RAM transfer functions may include, for example, transfer between any two core RAM locations or SFRs, and may use direct, indirect, register and immediate addressing modes. Xdata RAM transfer functions may include, for example, only the transfer between the accumulator and the xdata RAM location, and may only use indirect addressing. The LUT transfer function may involve nothing but the read of program memory using indexed addressing mode. Boolean instructions may include a plurality of bit operations such as, for example, move, set clear, toggle, OR and AND instructions, and conditional jump instructions. Program branching instructions may include, for example, conditional and unconditional jump instructions to help modify the program execution flow.

Figure 41:
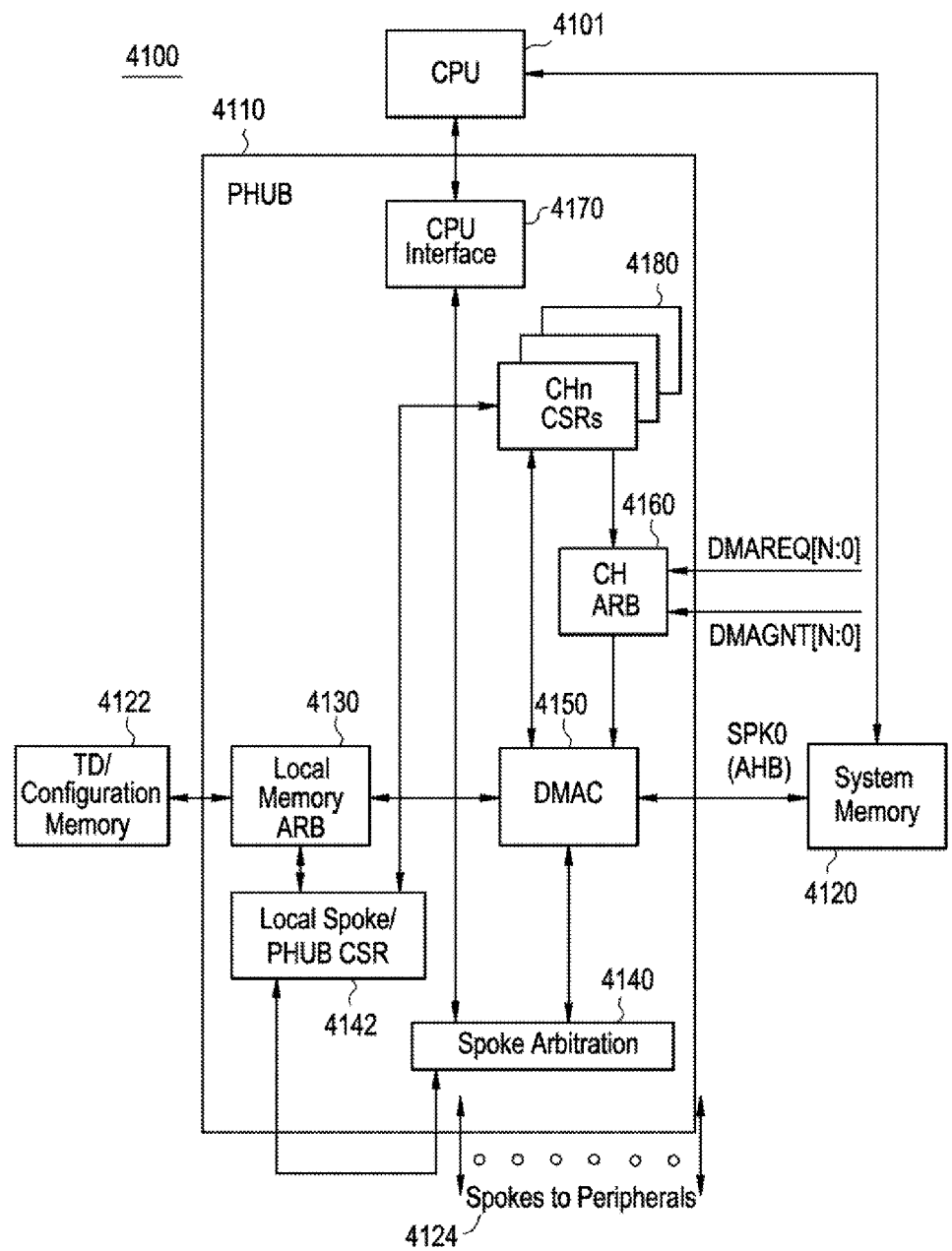
FIG. 41 illustrates a block diagram of a peripheral HUB (PHUB) according to an embodiment.

FIG. 41 illustrates a block diagram 4100 of a peripheral HUB (PHUB) 4110 (e.g., 143, FIG. 1). The PHUB 4110 may provide connections to the system for the CPU (141, FIG. 1) and the DMA controller (144, FIG. 1) for configuration of system and subsystem elements, routing of signals throughout the system (from analog to digital subsystems, vice versa and to GPIO), and the like. PHUB 4110 may be coupled to a TD/Configuration Memory block 4122, system memory 4120, CPU 4101, and a plurality of spokes to peripherals 4124. PHUB 4110 may include a CPU interface block 4170 coupled to CPU 4101. PHUB 4110 may include a spoke arbitration block 4140 coupled to the CPU interface 4170, plurality of spokes to peripherals 4124, DMA controller (DMAC) block 4150, and a local spoke/PHUB CSR block 4142 through a PHUB-external connection. Local spoke/PHUB CSR block 4142 may also be coupled to CHn CSR blocks 4180 and local memory ARB block 4130, which may be coupled to TD/configuration memory block 4122 and DMAC block 4150. DMAC block 4150 may be coupled to spike arbitration block 4140, local memory ARB block 4130, CHn CSR blocks 4180, CH ARB block 4160, and system memory 4120. CHn CSR blocks 4180 may be coupled to CH ARB block 4160. The CH ARB block 4160 may be coupled to signals DMAREQ[N:0] and DMAGNT[N:0].

The PHUB 4110 may be a programmable and configurable central hub within the core architecture that ties the various on-chip system elements together using standard AMBA AHB. The PHUB 4110 may use, for example, a multilayer AHB architecture to allow for simultaneous AMBA-Lite style mastering. The PHUB 4110 may be configured in a number of ways by, for example, writing to PHUB configuration registers to suit the needs of the particular core architecture in an application. The PHUB 4110 may include a direct memory access controller (DMAC, 144, FIG. 1) that may be programmed to transfer data between system elements without burdening the CPU. The PHUB 4110 may include logic that performs arbitration between DMAC and the CPU for access to the peripheral spokes of PHUB 4110.

Referring to FIG. 1, CPU subsystem 140 may include an interrupt controller (e.g., 142) to implement interrupt priorities and associated interrupt address vectors (IAVs). The interrupt controller may provide a mechanism for any hardware resource to change program execution to a new address, independent of the current task being executed by the CPU. Interrupts may have programmable priority, which may be level-based. In one embodiment, there may be 8 levels assignable to any interrupt, wherein level 0 is the highest priority and level 8 is the lowest. In other embodiments there may be more or less than eight levels, and level 0 can be considered either the highest or lowest priority (depending upon the particular application). Interrupts may be maskable. In one embodiment, if two interrupts have the same priority level, the interrupt with a smaller index value would be the winner. An example of such a scenario would be if two interrupts (e.g., int_in[5] and int_in[6]) each have a priority level of 3. In such a scenario, the smaller-indexed interrupt (i.e., int_in[5]) will be the serviced interrupt.

Programming and Debug Subsystem

Referring to FIG. 1, the core architecture 100 may include extensive support for programming, testing, debugging, and tracing hardware and firmware. The programming and debug subsystem 145 may include a variety of interfaces including, but not limited to, JTAG, serial wire debug (SWD), serial wire viewer (SWV), and the like. In one embodiment, JTAG and SWD may support all available programming and debug features of the device, while SWV may support a subset of available features. JTAG may also support standard JTAG scan chains for board-level test and chaining multiple JTAG devices to a single JTAG connection. Debug-on-chip may support full device debugging in the final system using the standard production device, and may not require special interfaces, debugging pods, simulators or emulators. A software development and programming environment, such as, for example, the PSOC® Creator IDE offered by Cypress Semiconductor Corporation (San Jose, Calif.), may be used to provide integrated programming and debug support.

The JTAG interface may be used for programming the flash memory, debugging, IO scan chains, JTAG device chaining, and the like. The SWD interface may provide an alternative to the JTAG interface. For example, the SWD interface may require two pins rather than the four or five needed for JTAG. SWD may provide all or substantially all of the programming and debugging features of JTAG at the same speed.

For purposes of illustration and not limitation, JTAG and SWD interfaces may be used to support the following debug features:
  halt and single-step the CPU,
  view and change CPU and peripheral registers and RAM addresses,
  multiple program address breakpoints,
  memory access breakpoints (break on reading or writing any memory address and data value),
  break on a sequence of breakpoints,
  debugging at full CPU speed, and
  debug operations while device is in reset or in low-power modes.

For purposes of illustration and not limitation, JTAG and SWD interfaces may be used to support the following trace features:
  trace of program counter (PC), accumulator register (ACC) and one SFR/core RAM register,
  trace depth up to, for example, 1000 instructions if all registers are traced, or, for example, 2000 instructions if only the PC is traced,
  program address trigger to start tracing,
  trace windowing (e.g., only trace when PC is within a given range), and
  multiple modes for handing trace buffer full, continuous (overwriting the oldest trace data), or break when trace buffer is full.

The SWV interface may be closely associated with the SWD interface, but may also be used independently. SWV may be used for application debug when it is helpful for the firmware to output data similar to "printf" debugging on personal computers. The SWV interface may be used for data monitoring and can be implemented using only one pin. The SWV interface may output data in, for example, standard UART format or Manchester encoded format.

In one embodiment, debugging for the core architecture may be completed when the device is in power-down mode or in other low-power modes. In such an embodiment, some logic remains on at all times (functional or debug), which includes the debug interface and a small portion of the Power Manage (PM Always-On) that monitors the power down status and has the ability to wake-up the chip. The debug interface may allow a debugging software interface to communicate to the logic that is always on and issue commands to read the device's power mode status, wake-up the device, or reset the device. In another embodiment, a watchdog reset blocker may be used rather than forcing a reset. In such cases, the designer has the option to halt the CPU first in any power mode.

Figure 42:
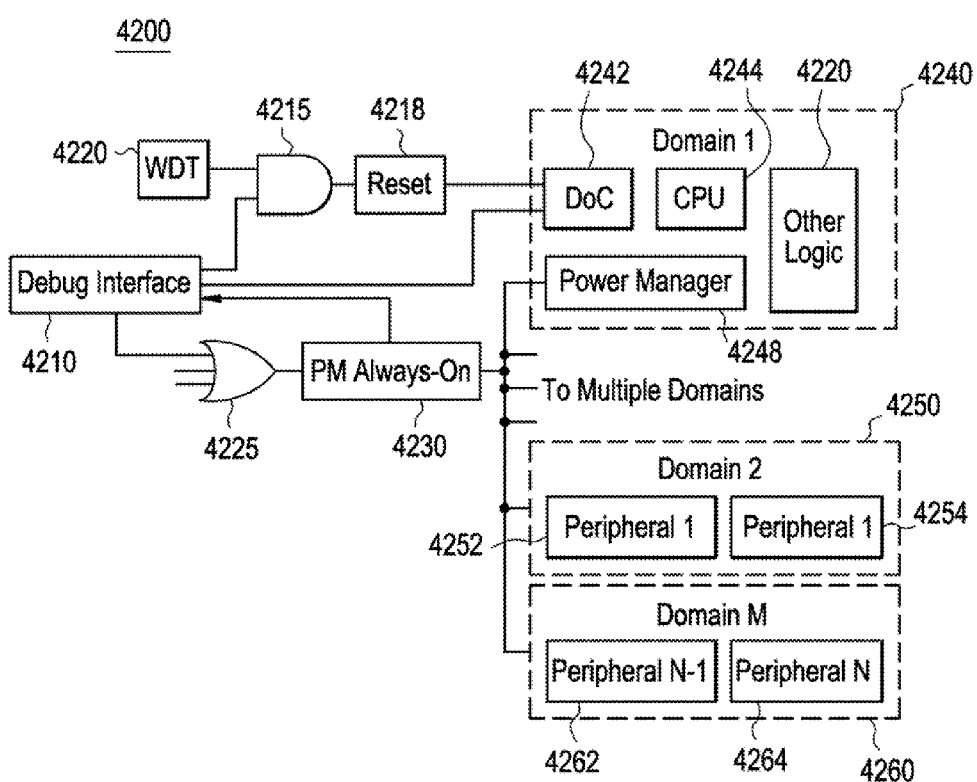
FIG. 42 illustrates one embodiment of low-power and power-down debugging according to an embodiment.

FIG. 42 illustrates one embodiment of a debug subsystem 4200. Debug interface 4210 may be coupled to an input of AND logic block 4215. Watchdog Timer (WDT) 4220 may also be coupled to an input of AND logic block 4215. The output of AND logic block 4215 may comprise a reset signal 4218 for the device. Such a signal allows the debug system to stop a reset event from the WDT 4220 until after debugging is complete. Debug interface 4210 may be coupled to an input of OR logic block 4225 along with appropriate device signals. The output of OR logic block 4225 may be coupled to power manager (PM) always-on block 4230. An output of PW always-on block 4230 may coupled back to debug interface 4210, and to the debug-on-chip (DOC) block 4242 and multiple domains. Debug subsystem 4200 may also include at least one domain (e.g., Domain 1, Domain 2, ..., Domain M, where M may be any suitable number). Domain 1 4240 includes DOC block 4242, CPU 4244, a power manager 4248, as well as other suitable logic elements 4220. The power manager 4248 may be used to power specific parts of the device for the purposes of debugging those parts without powering up the entire device. Debug subsystem 4200 may include additional domains (e.g., Domain 2 4250 through Domain M 4260). Each domain may comprise multiple peripherals (e.g., peripherals 4252 and 4254 for Domain 2, and peripherals 4262 and 4264 for Domain M). While two additional domains 4250 and 4260 are illustrated, one of ordinary skill in the art would recognize that there may be more or less than two domains or even no additional domains. Furthermore, while two peripherals per domain are illustrated, a skilled artisan would recognize that there may be more or less than two peripherals in a single domain.

While debugging the device in normal mode, the selected debug interface may connect to a set of pins and the core logic. One of these pins may serve as a clock, while the additional pins may be used for data input, data output, control signals. An external device may connect to these pins, requiring merely signal generation capabilities, which may be used to send read or write commands to the selected debug interface. In most cases, such commands may then be passed on to the Debug-On-Chip (DoC), which may be used to override the CPU and gain access to the rest of the device. In some cases, the command stops at the debug interface when accessing its local registers. The debug interface contains the local register for interacting with the Power Manager (PM). The bit fields may include, but are not limited to:

RESET—used to reset the chip to a known state,
WAKE_UP—used to wake up the all domains from a low power mode,
CPU_CLK_IND—CPU clock indication, indicates if the CPU clock is running, and
PM_STATUS [N:0]—Power Manager status, indicates which power domains are on or off.

The bit fields listed above can be accessed in any low power mode, even when the CPU is powered down. When the CPU is powered up, so is the DoC. In such a mode, breakpoints and trace may be utilized and internal CPU registers, such as the PC and the accumulator, may be accessed. Examples of other logic that could exist in other domains include, but are not limited to, a USB block, an I2C block, programmable digital blocks, programmable analog blocks, and the like. Such a capability allows a firmware designer to debug power saving implementations of the device in-system and to monitor the power saving implementations.

In another embodiment, more and different chip status bits or options may be added to the debug interface, which is always-on, thereby relaying more or different information when all or substantially all of the core logic is asleep.

Debuging in low-power modes and even in power-down mode provides the ability to observe which power domains are turned off, measure current consumption in the multiple low powers modes when debugging, and use the collected data as measurement of how the part will perform in these low power modes when in functional mode. Additionally, it may be possible to wake-up or reset the part from the debug interface when the part is in a low power mode. Conventional methods require the part to be power cycled or the use of an external reset pin.

Figure 43:
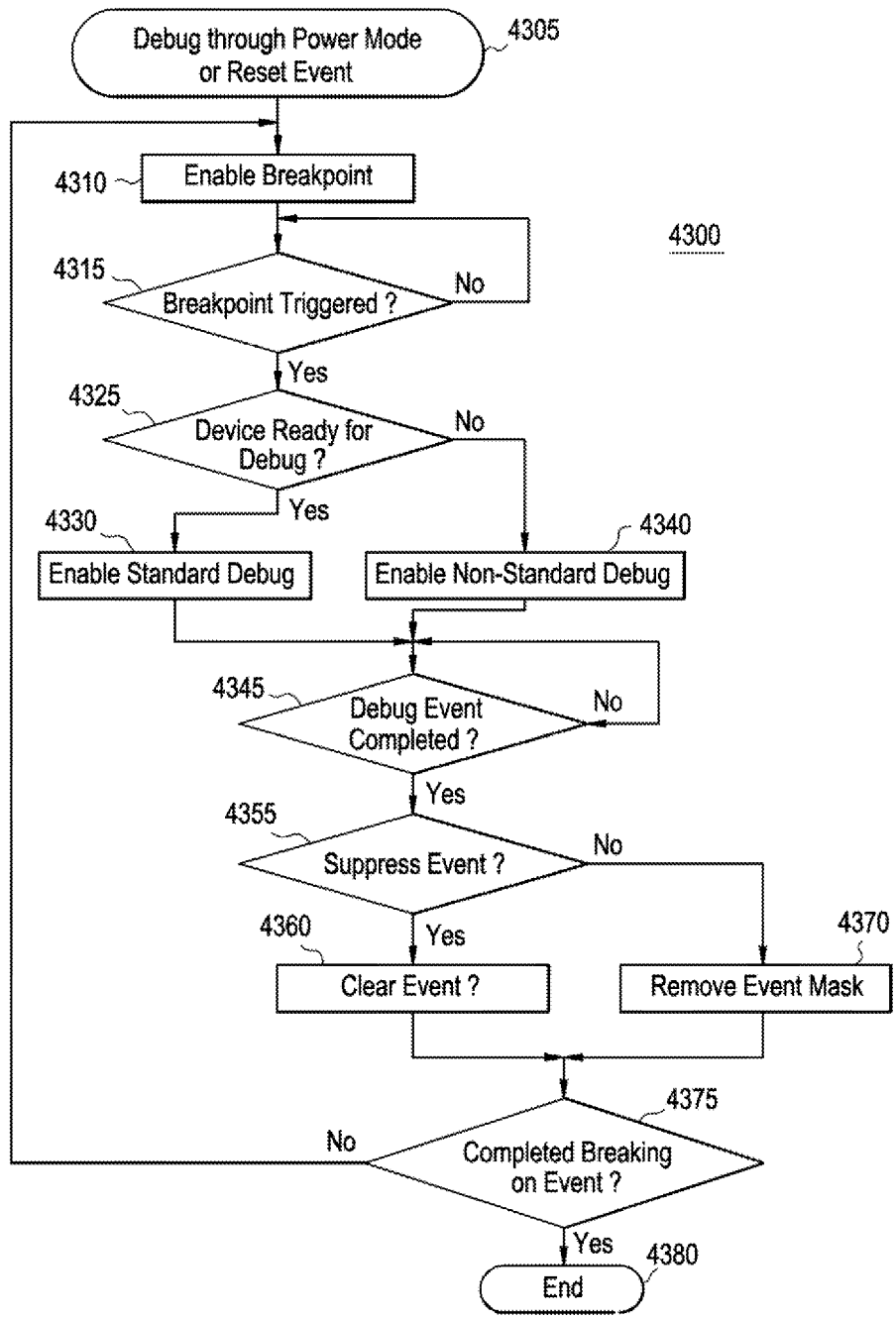
FIG. 43 illustrates one embodiment of a method for debugging a device according to an embodiment.

FIG. 43 illustrates one embodiment for a method 4300 of debugging a system. A debug through power mode or reset event command is received in block 4305. A break point is then enabled in block 4310. The break point may be enabled on the desired power mode or on a reset event. The event may be masked by the enable break point of block 4310. The break point is monitored and its triggered status detected in decision block 4315. If the break point is not triggered, decision block 4315 is repeated. If the break point is determined to be triggered by decision block 4315, the device's debug readiness is monitored in decision block 4325. If the device is determined to be ready to enter a debug mode in decision block 4325, a standard debug is enabled in block 4330. If the device is determined not to be ready to enter a debug mode in decision block 4325, a non-standard debug mode is enabled in block 4340. A non-standard debug mode may query the device's power mode and wake up the device if an appropriate power mode is not running. The non-standard debug mode may then wake up the device and halt the CPU to suspend device operation during debugging. The non-standard debug mode may then ready a debug-on-chip section to execute the debug.

After a non-standard debug is enabled in block 4340 or the standard debug is enabled in block 4330, the debug event is monitored in decision block 4345. If a debug event is not completed in decision block 4345, the debug event continues to be monitored. If the debug event is completed, the device is then monitored to suppress an event in decision block 4355. If an event is to be suppressed in decision block 4355, the event is cleared in block 4360. If the event is not to be suppressed in decision block 4355, the mask from block 4310 is removed and the normal result from the event is executed in block 4370. The device is then monitored to determine if the break point may be removed on execution or clearing of the event in decision block 4375. If the break point is determined not to be removed in decision block 4375, the break point is monitored again starting in block 4310. If the break point is to be removed in decision block 4375, debugging is ended in block 4380.

In some embodiments, the reset that triggers the debug operation in block 4305 may be passed to the device through the debug interface after completion of the debug event. Such functionality allows the device to be debugged in its current state and then be reset after debug is completed. The reset may cause the device to enter a different power mode or to execute commands that may mask the state of the device before the reset event was triggered and debug mode was enabled.

Self-Modulated Voltage Reference

A programmable PSoC chip having a core architecture such as core architecture 100 may be used to implement an external reference voltage. One embodiment of a programmable device used to implement the external reference voltage may include fewer or no analog outputs, as compared to a programmable device having core architecture 100. In one embodiment, the programmable device may include a microcontroller.

Figure 44A:
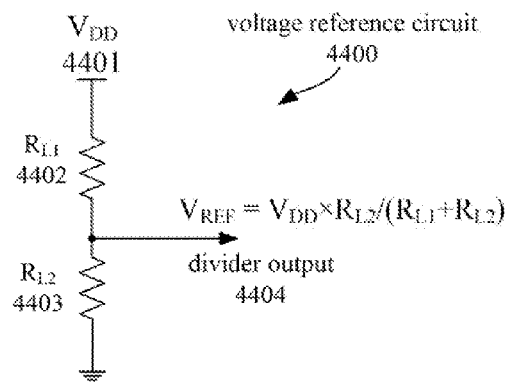
FIG. 44A illustrates an embodiment of a voltage reference circuit.

A programmable device, such as a PSoC chip may have a supply voltage that can be used as a reference voltage or to obtain another voltage reference. A resistive divider method is one method for obtaining a reference voltage from the supply voltage as shown in FIG. 44A. FIG. 44A illustrates a voltage reference circuit 4400, which generates an output voltage $V_{REF}$ at divider output 4404, based on a supply voltage $V_{DD}$ 4401. The divider divides $V_{DD}$ 4401 using divider resistors $R_{L1}$ 4402 and $R_{L2}$ 4403. The generated reference voltage $V_{REF}$ is equal to $V_{DD} \times R_{L2}/(R_{L1}+R_{L2})$. This basic circuit has no control loop and may result in a reference voltage that is directly proportional to the supply voltage variations.

Figure 44B:
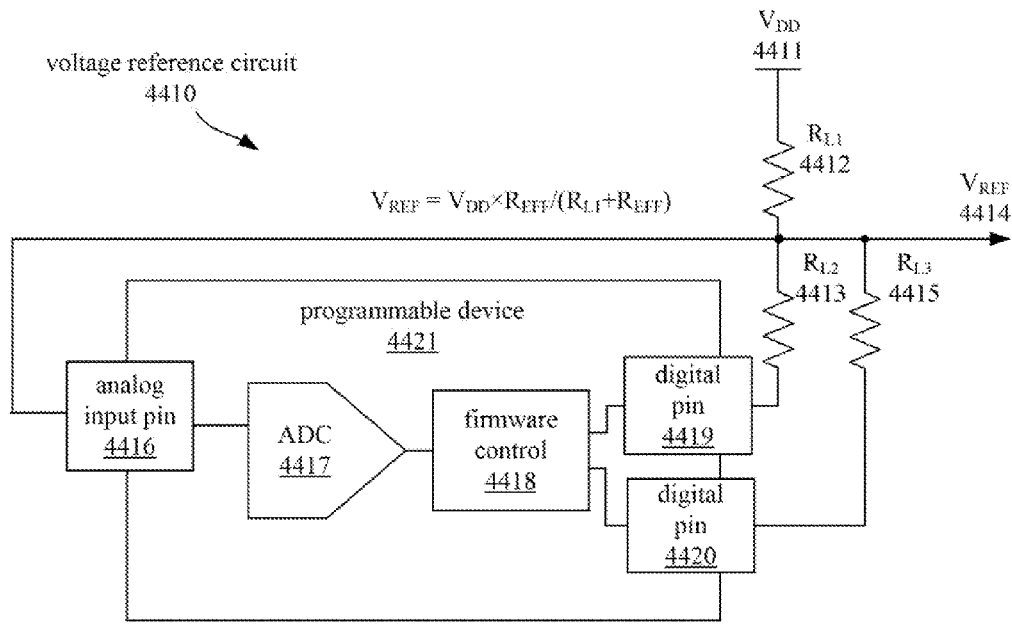
FIG. 44B illustrates an embodiment of a voltage reference circuit.

To regulate the voltage or to obtain different voltages, a control loop may be added to this circuit, as shown in FIG. 44B. FIG. 44B illustrates a voltage reference circuit 4410 including a programmable device 4421. In circuit 4410, the reference voltage $V_{REF}$ can be measured and the divider resistance can be adjusted to maintain the required reference value. One end of each of the resistors $R_{L2}$ 4413 and $R_{L3}$ 4415 is connected to the $V_{REF}$ node 4414 and the other end of each of the resistors $R_{L2}$ 4413 and $R_{L3}$ 4415 is controlled through the digital pins 4419 and 4420. The pins 4419 and 4420 can be either grounded or left at high Z. If the pin 4419 or 4420 is grounded, the corresponding resistor $R_{L2}$ 4413 or $R_{L3}$ 4415 is added into the effective resistance calculation. If the pin 4419 or 4420 is at high Z, the corresponding resistor $R_{L2}$ 4413 or $R_{L3}$ 4415 is effectively disconnected from the divider. The reference voltage $V_{REF}$ is obtained based on the effective resistance of resistors in parallel ($R_{EFF}$), as shown in Equation 1 below.

$$V_{REF} = V_{DD} \times \frac{R_{EFF}}{(R_{EFF} + R_{L1})} \quad \text{(Equation 1)}$$

When the application is not using the reference voltage, the pins 4419 and 4420 can be kept at high Z, thus saving power. The resolution of control can be increased by increasing the number of control resistors such as $R_{L2}$ 4413 and $R_{L3}$ 4415, which in turn increase the number of digital pins used, to form a resistive chain control. The concept of resistive chain control can be used to regulate the reference voltage, or it can also be used to obtain different reference voltages at different times. To regulate the voltage, this type of control works when the variation in the reference voltage is slower than the delay of the control.

Figure 45A:
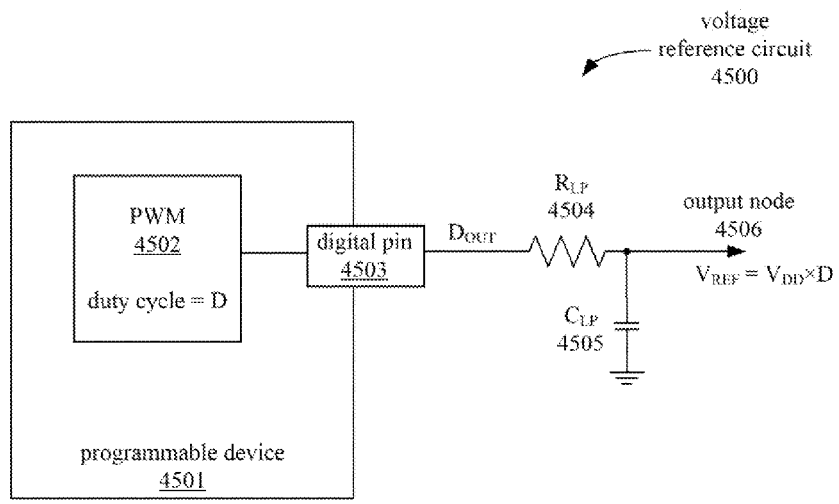
FIG. 45A illustrates an embodiment of a voltage reference circuit.

A pulse width modulator coupled with a digital-to-analog converter (PWM-DAC) is one method, illustrated in FIG. 45A, for obtaining a programmable reference voltage at a digital pin. In FIG. 45A, the output of PWM 4502 is a digital signal Dour which is output from digital pin 4503 and low pass filtered by a RC network (resistor $R_{LP}$ 4504 and capacitor $C_{LP}$ 4505) to obtain the average DC value at output node 4506. The cut-off frequency of the low pass filter may be chosen such that it is much lower than the frequency output of the PWM 4502, to ensure as close to a DC value as possible.

The reference voltage obtained by this method is a function of supply voltage ($V_{DD}$) and duty cycle (D) of PWM 4502 as shown in Equation 2 below. For example, if the supply voltage $V_{DD}$ is 5V, and the duty cycle D is 50%, then the reference voltage $V_{REF}$ is 2.5V.

$$V_{REF} = V_{DD} \times D \quad \text{(Equation 2)}$$

Figure 45B:
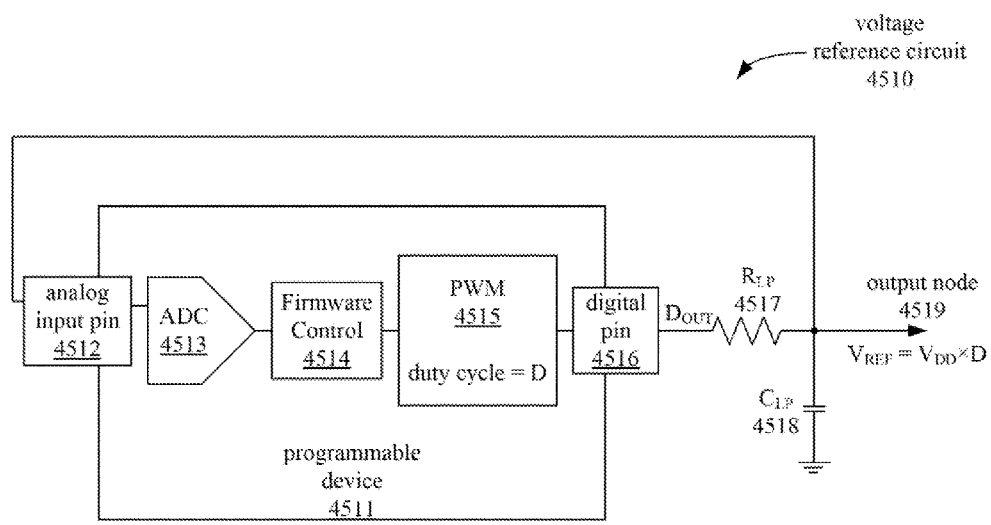
FIG. 45B illustrates an embodiment of a voltage reference circuit.

The pulse width can be varied to change $V_{REF}$, but the illustrated PWM-DAC method is an open loop system and the accuracy of $V_{REF}$ may be affected by variations in the supply voltage $V_{DD}$. Because an accurate supply voltage may not be available in low cost systems, a circuit such as voltage reference circuit 4510, illustrated in FIG. 45B, may use a closed loop system formed by using an ADC 4513 and firmware control 4514. The reference voltage $V_{REF}$ is applied to analog input pin 4512 and measured using the ADC 4513 and the duty cycle of PWM 4515 is adjusted by the firmware control 4514 to output a pulse-width modulated signal $D_{OUT}$ at digital pin 4516. The signal $D_{OUT}$ is filtered by the RC low pass filter comprised of resistor $R_{LP}$ 4517 and capacitor $C_{LP}$ 4518 to generate the reference voltage $V_{REF}$ at output node 4519. The feedback loop of this voltage reference circuit 4510 reduces the dependency of the output reference voltage $V_{REF}$ on the supply voltage, but adds latency and uses more resources in the system as compared to voltage reference circuit 4500.

Figure 46A:
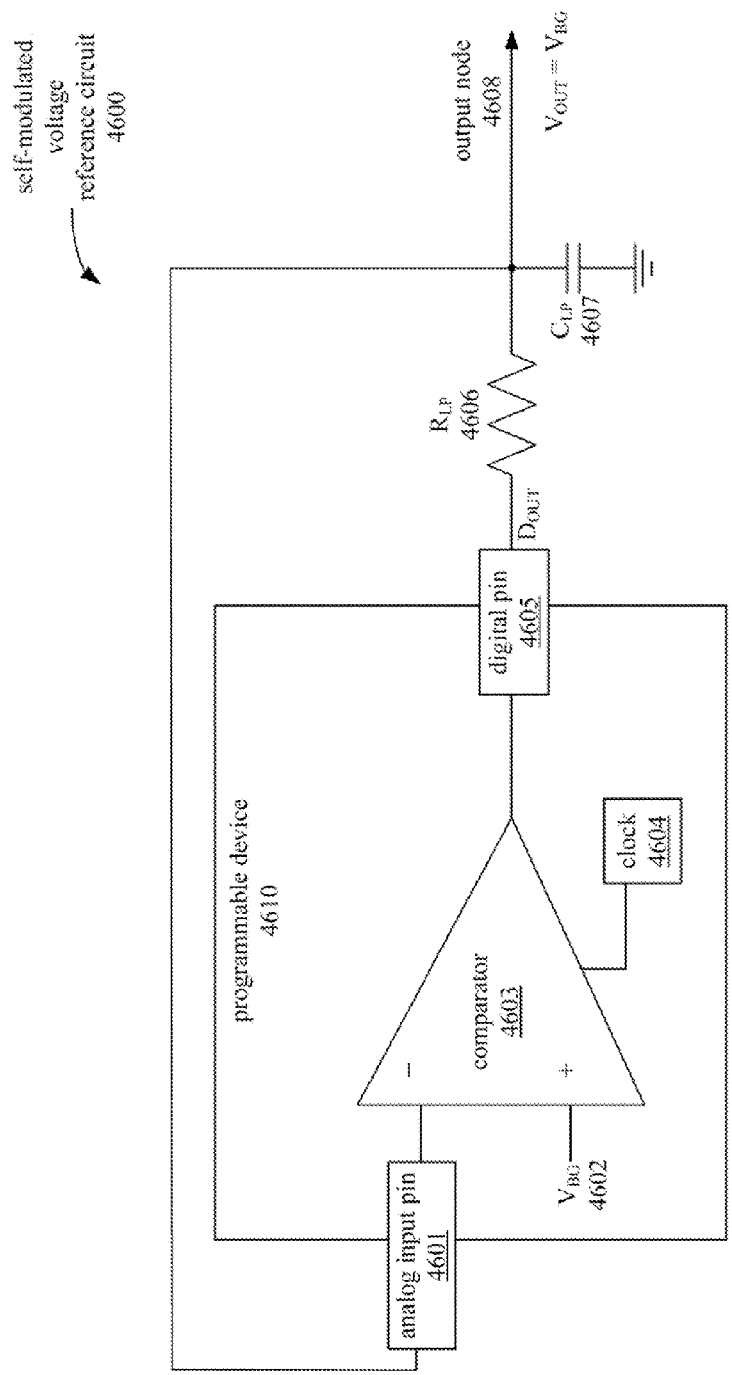
FIG. 46A illustrates a self-modulated voltage reference circuit according to an embodiment.

In one embodiment, the self modulated voltage reference circuit 4600 illustrated in FIG. 46A may be implemented in a programmable device such as a PSoC chip having a core architecture 100. Alternatively, the circuit 4600 may be implemented in a programmable device having a core architecture similar to architecture 100 but having fewer analog outputs, or no analog outputs. For example, the programmable device 4610 may be a CY8C21123 PSoC chip manufactured by Cypress Semiconductor Corporation of San Jose, Calif. Regardless of the presence of absence of analog outputs, a chip in which the circuit 4600 is implemented may have an internal reference voltage $V_{BG}$ which is used by the circuit 4600. In one embodiment, the circuit 4600 allows the internal reference voltage $V_{BG}$ to be accessed via an external digital pin 4605. In an alternative embodiment, the circuit 4600 may be implemented using a fixed-function (i.e., not programmable) device. In one embodiment, the voltage reference circuit 4600 may be implemented in a microcontroller unit (MCU) with an integrated comparator. In an embodiment, the voltage $V_{BG}$ may be any kind of reference voltage and is not limited to an internal bandgap voltage.

The voltage reference circuit operates using the Pulse Density Modulation (PDM) principle, where the density of a digital signal is the percentage of time the signal is high. In contrast with Pulse Width Modulation (PWM), the width of each pulse may be relatively constant. The density of a PDM signal may be considered as the percentage of ones in a stream of ones and zeroes comprising the digital PDM signal.

The circuit 4600 uses a synchronous comparator 4603 in the programmable device 4610, and an external low pass filter comprised of a resistor-capacitor (RC) network. The synchronous comparator 4603 is clocked using clock source 4604. In one embodiment, the RC network may include a resistor $R_{LP}$ 4606 and a capacitor $C_{LP}$ 4607. The output of the low pass filter at the output node 4608 is the feedback, and is applied through analog input pin 4601 to the negative input of comparator 4603. The comparator with this feedback operates similarly as an operational amplifier in voltage follower mode. The output of the voltage follower will change, so as to keep its two inputs at the same level. If the voltage $V_{REF}$ on the positive input is higher than the voltage $V_{BG}$ 4602 on the negative input, the output is high. The high output will cause the output of the low pass filter to drift higher, eventually making the negative input to the comparator 4603 higher than the positive input. When the negative input is higher, the output remains low, which will pull the negative input lower. Thus the percentage of time that the signal is high (i.e. the density of the signal), changes to keep the voltages $V_{REF}$ and $V_{BG}$ at the two inputs at the same value. In steady state operation, the circuit 4600 modulates the output voltage $D_{OUT}$ at digital pint 4605 so that its density results in $V_{REF}=V_{BG}$ an the output 4608 of the low pass filter. In one embodiment, since the comparator 4603 is clocked by clock source 4604, its output is a well-defined synchronous digital signal that is low-pass filtered to obtain the reference voltage.

In one embodiment, the comparator 4603 in the above-described self-modulator configuration can be used as a buffer when both inputs of the comparator 4603 are accessible externally. In one embodiment, the circuit 4600 operating in buffer mode may have the internal reference voltage $V_{BG}$ replaced with an external input voltage (not illustrated).

In one embodiment, the load drive capability of the self-modulating circuit may be obtained by considering an ideal comparator. With regard to circuit 4600 illustrated in FIG. 46A, for example, the feedback resistor (such as low pass filter resistor $R_{LP}$ 4606) determines the drive capacity of the circuit 4600. Since the output $V_{OUT}$ changes to maintain the two inputs to the comparator 4603 at the same value, the constraint on the resistance $R_{LOAD}$ of a load connected to output node 4608 may be given by Equation 3 below, where $V_{SUPPLY}$ is the supply voltage and $V_{BG}$ is the internal reference voltage $V_{BG}$ 4602 of the programmable device 4600.

$$\frac{V_{SUPPLY} \times R_{LOAD}}{(R_{LOAD} + R_{LP})} > V_{BG} \quad \text{(Equation 3)}$$

Figure 46B:
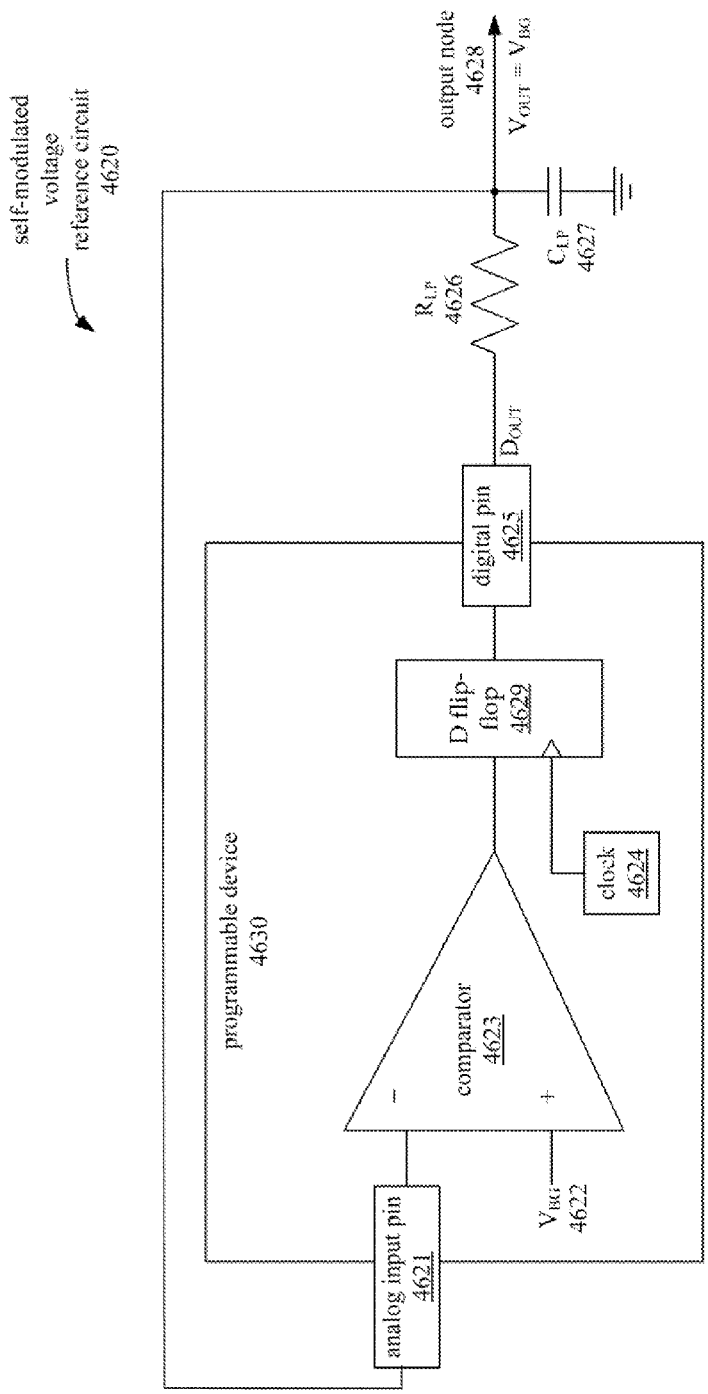
FIG. 46B illustrates a self-modulated voltage reference circuit according to an embodiment.

While self-modulated voltage reference circuit 4600 includes a comparator 4603 that is synchronous to clock 4604, alternative embodiments may include a comparator that is not clocked. FIG. 46B illustrates a self-modulated voltage reference circuit 4620 implemented using a programmable device 4650. Similar to voltage reference circuit 4600, voltage reference circuit 4620 includes a comparator 4623 that compares signals received from an analog input pin 4621 and internal voltage reference $V_{BG}$ 4622. The output of comparator 4623 is connected to an input of D flip-flop 4629, which is clocked by clock source 4624. The output of D flip-flop 4629 is thus a synchronous PDM signal that is output through digital pin 4625 and filtered by an RC network including $R_{LP}$ 4626 and $C_{LP}$ 4627 to generate an output voltage $V_{OUT}$ equal to $V_{BG}$ at output node 4628.

Figure 46C:
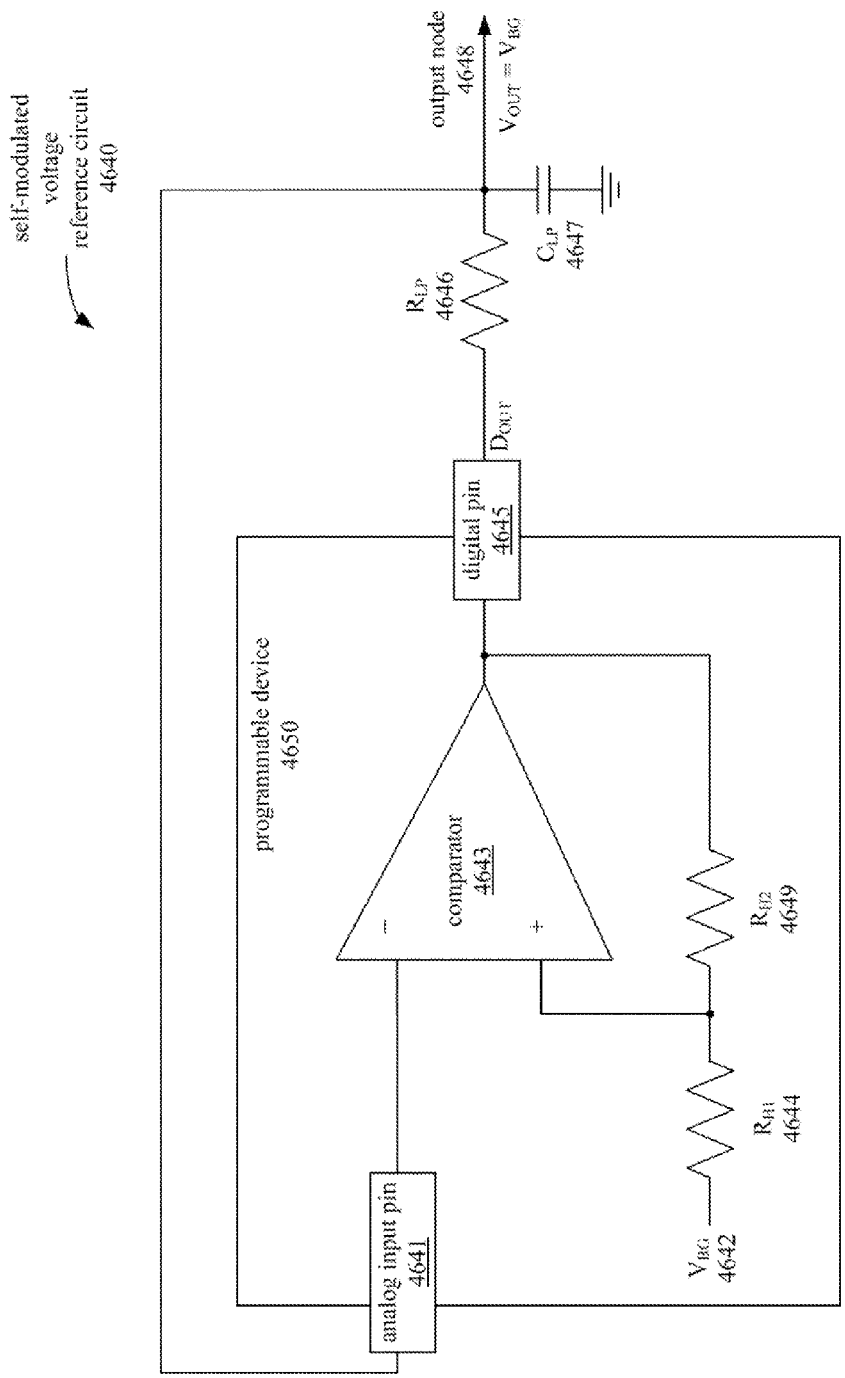
FIG. 46C illustrates a self-modulated voltage reference circuit according to an embodiment.

FIG. 46C illustrates an embodiment of a self-modulated voltage reference circuit 4640 having a comparator 4643 with hysteresis added by a hysteresis network including resistors $R_{H1}$ 4644 and $R_{H2}$ 4649. Resistor $R_{H1}$ 4644 is connected between the internal voltage reference $V_{BG}$ 4642 and the positive input of comparator 4643, while resistor $R_{H2}$ 4649 is connected between the positive input of comparator 4643 and the output of comparator 4643. In one embodiment, the amount of hysteresis is determined by the ratio of the resistors $R_{H1}$ 4644 and $R_{H2}$ 4649. In one embodiment, the added hysteresis reduces the frequency at which the comparator 4643 toggles its output. The output of comparator 4643 is applied to digital pin 4645 and filtered by an RC network including $R_{LP}$ 4646 and $C_{LP}$ 4647 to generate an output voltage $V_{OUT}$ equal to $V_{BG}$ at output node 4648.

In one embodiment, a voltage reference circuit that generates a reference voltage $V_{REF}$ that his higher or lower than the internal reference voltage $V_{BG}$ may be implemented by including an attenuator in the voltage reference circuit. In one embodiment, if the attenuator is added on the output, then a reference voltage less the internal reference voltage $V_{BG}$ may be obtained. In an alternative embodiment, an attenuator is used to attenuate the feedback, so that a reference voltage $V_{REF}$ that is greater than the internal reference voltage $V_{BG}$ may be obtained. The attenuation can be analog domain or in the density domain.

Figure 47:
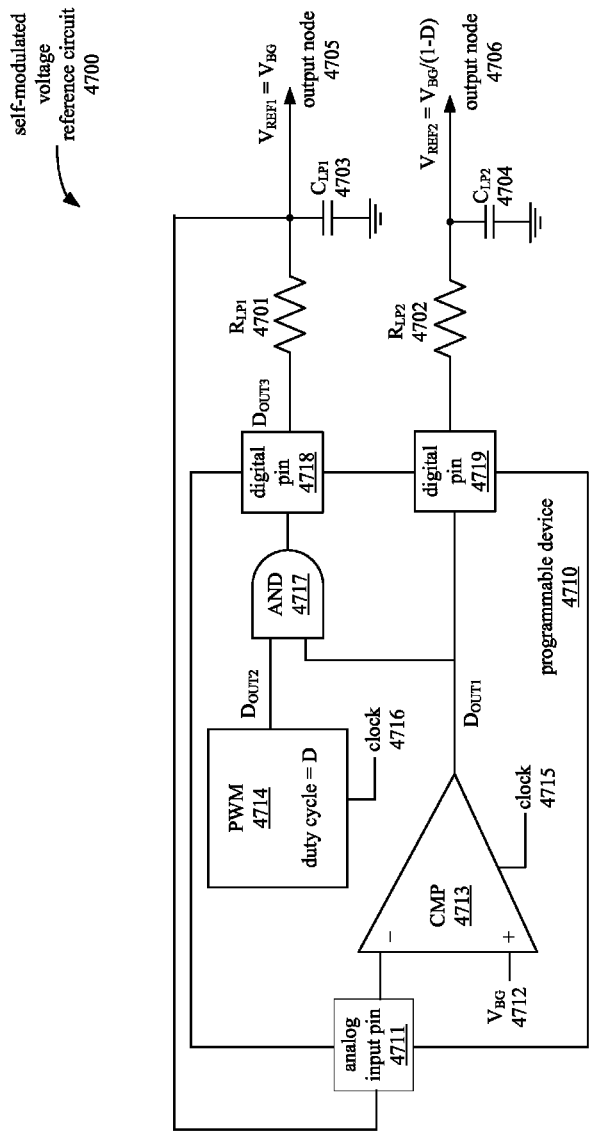
FIG. 47 illustrates a self-modulated voltage reference circuit according to an embodiment.

In one embodiment, a reference voltage $V_{REF2}$ higher than the internal reference voltage $V_{BG}$ may be obtained by using a circuit such as self-modulated voltage reference circuit 4700, illustrated in FIG. 47. Circuit 4700 is implemented using a programmable device 4710 which includes a synchronous comparator 4713 and a pulse width modulator 4714 clocked by clock sources 4715 and 4716, respectively. The outputs of the PWM 4714 and the comparator 4713 are connected to the inputs of AND gate 4717, which has an output connected to digital pin 4718. The output of comparator 4713 is also connected to digital pin 4719. The voltage from digital pin 4718 is filtered by a low pass filter comprising $R_{LP1}$ 4701 and $C_{LP1}$ 4703 to generate a filtered reference voltage $V_{REF1}$ at output node 4705. The voltage from digital pin 4719 is filtered by a low pass filter comprising $R_{LP2}$ 4702 and $C_{LP2}$ 4704 to generate a filtered output reference voltage $V_{REF2}$ at output node 4706.

In one embodiment, since the self-modulating circuit 4700 generates a PDM signal, additional circuitry may be added for density modulation. In one embodiment, a density modulator (such as PWM 4714) may be connected to an AND gate 4717 situated between the output of the comparator 4713 and the feedback signal path passing through digital pin 4718, a low pass filter comprising $R_{LP1}$ 4701 and $C_{LP1}$ 4703; and analog input pin 4711, as shown in FIG. 47.

In one embodiment, the AND gate 4717 receives as input a pulse-width modulated signal $D_{OUT2}$ generated by the PWM 4714 and a PDM signal $D_{OUT1}$ generated by comparator 4713. The AND gate 4717 thus outputs a high signal when both $D_{OUT1}$ and $D_{OUT2}$ are high.

For example, if the output $D_{OUT2}$ of PWM 4714 has a duty cycle D of 50%, the effective pulse density (i.e., density of ones) at the output of the AND gate 4717 is 50% of the pulse density of $D_{OUT1}$. This will cause the voltage $V_{REF1}$ at the negative input to be low for double the time, and thus doubling the output density of the comparator 4713. Thus, the pulse density of at the output of the comparator 4713 changes based on the duty cycle D of the PWM 4714. This digital density signal $D_{OUT3}$ is low pass filtered by the RC network comprising $R_{LP1}$ 4701 and $C_{LP1}$ 4703 to obtain a DC value that depends on the internal bandgap reference voltage $V_{BG}$ and the duty cycle D of the PWM 4714 as shown in Equation 4 below. Note that since the pulse density of $D_{OUT2}$ cannot be less than zero, $V_{REF2}$ cannot be less than $V_{BG}$.

$$V_{REF2} = \frac{V_{BG}}{(1-D)} \quad \text{(Equation 4)}$$

Figure 48:
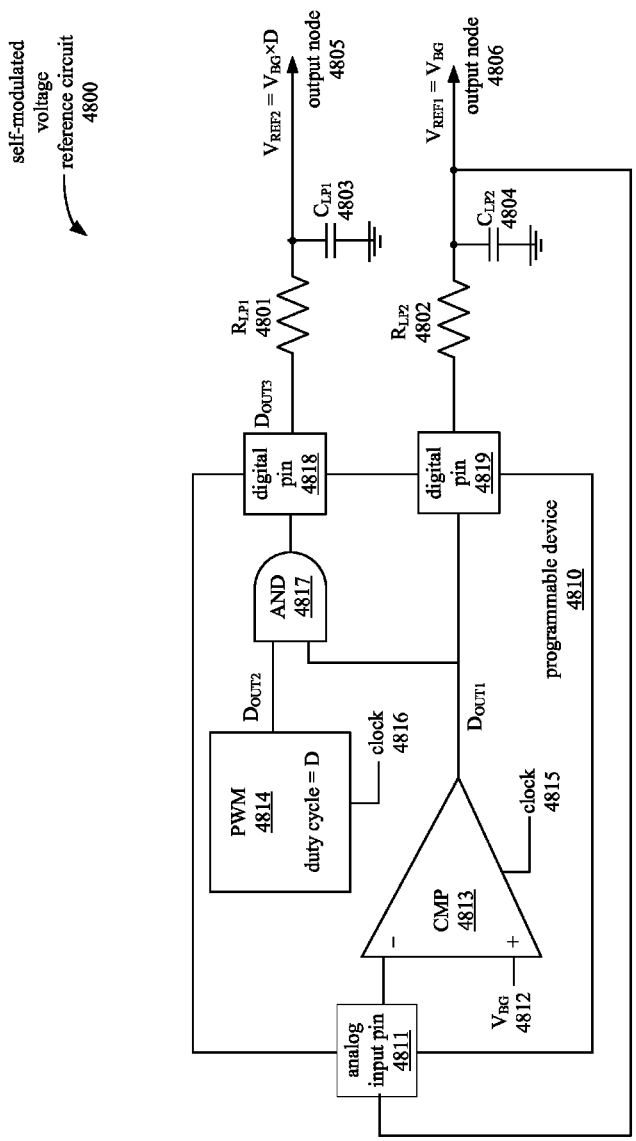
FIG. 48 illustrates a self-modulated voltage reference circuit according to an embodiment.

In one embodiment, the self-modulated voltage reference circuit 4800 illustrated in FIG. 48 may be used to generate an output reference voltage $V_{REF2}$ that is lower than the internal reference voltage $V_{BG}$. Circuit 4800 is implemented using a programmable device 4810 which includes a synchronous comparator 4813 and a pulse width modulator 4814 clocked by clock sources 4815 and 4816, respectively. The outputs of the PWM 4814 and the comparator 4813 are connected to the inputs of AND gate 4817, which has an output connected to digital pin 4818. The output of comparator 4813 is also connected to digital pin 4819. The voltage from digital pin 4818 is filtered by a low pass filter comprising $R_{LP1}$ 4801 and $C_{LP1}$ 4803 to generate a filtered reference voltage $V_{REF2}$ at output node 4805. The voltage from digital pin 4819 is filtered by a low pass filter comprising $R_{LP2}$ 4802 and $C_{LP2}$ 4804 to generate a filtered output reference voltage $V_{REF1}$ at output node 4806.

In one embodiment, a density modulator (such as PWM 4814) may be connected to AND gate 4817 situated between the output of the comparator 4813 and the digital pin 4818, which is further connected to a low pass filter comprising $R_{LP1}$ 4801 and $C_{LP1}$ 4803. In one embodiment, the AND gate 4817 receives as input a pulse-width modulated signal $D_{OUT2}$ generated by the PWM 4814 and a PDM signal $D_{OUT1}$ generated by comparator 4813. The AND gate 4817 thus outputs a high signal when both $D_{OUT1}$ and $D_{OUT2}$ are high.

For example, if the output $D_{OUT2}$ of PWM 4814 has a duty cycle D of 50%, the effective pulse density (i.e., density of ones) at the output of the AND gate 4817 is 50% of the pulse density of $D_{OUT1}$. This will cause the voltage $D_{OUT3}$ at digital pin 4818 to be low twice the amount of time, as compared to the output voltage $D_{OUT1}$ of comparator 4813.

The digital density signal $D_{OUT3}$ is low pass filtered by the RC network comprising $R_{LP1}$ 4801 and $C_{LP1}$ 4803 to obtain a DC value that depends on the internal bandgap reference voltage $V_{BG}$ and the duty cycle D of the PWM 4814 as shown in Equation 5 below. Note that since the pulse density of $D_{OUT2}$ cannot be greater than one, $V_{REF2}$ cannot be greater than $V_{BG}$.

$$V_{REF2} = V_{BG} \times D \quad \text{(Equation 5)}$$

In one embodiment, an analog attenuator such as a resistive divider circuit may be used in a self-modulated voltage reference circuit to generate an external reference voltage other than the internal reference voltage.

Figure 49:
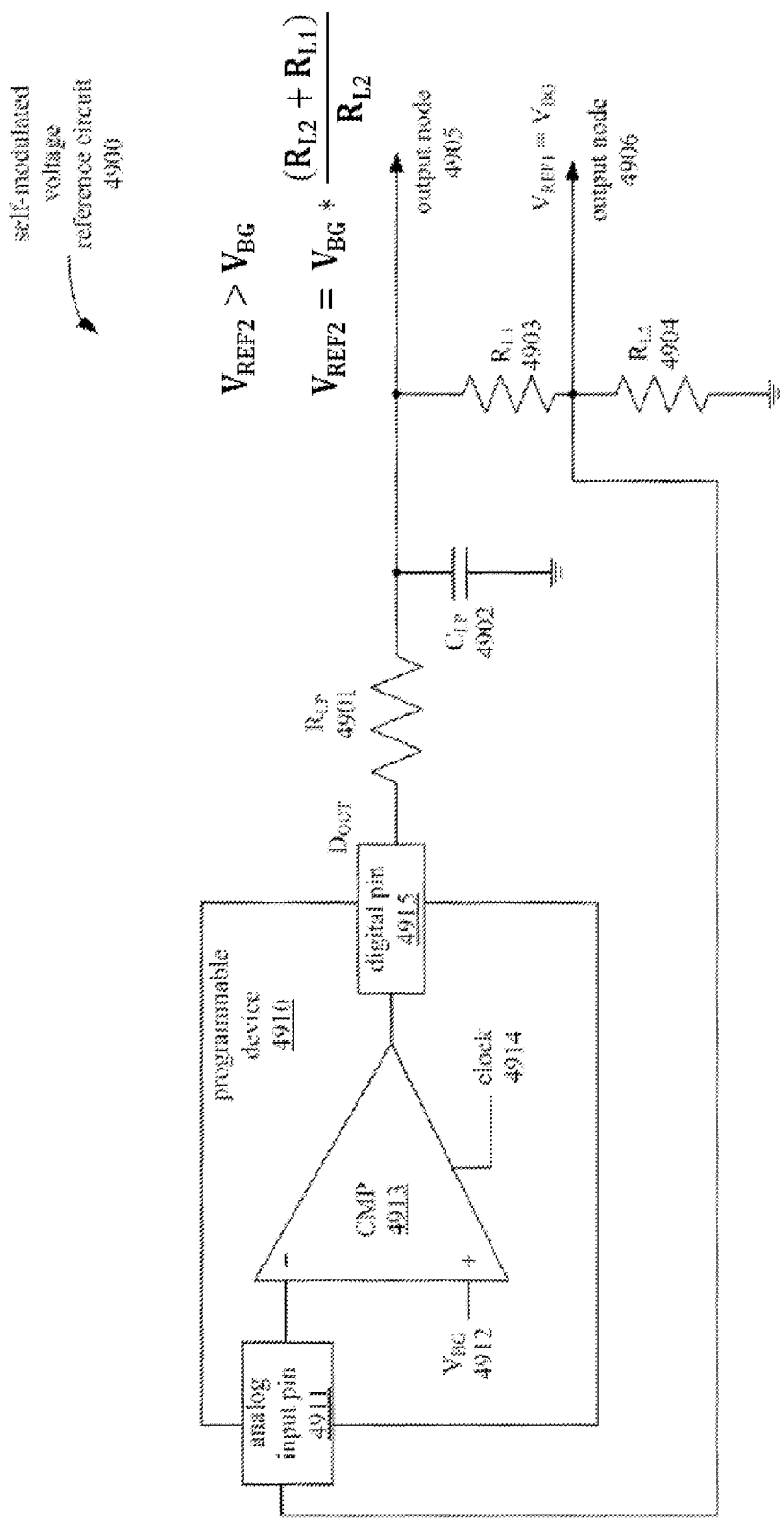
FIG. 49 illustrates a self-modulated voltage reference circuit according to an embodiment.

FIG. 49 illustrates a self-modulated voltage reference circuit 4900 that obtains an output reference voltage $V_{REF2}$ that is higher than the internal reference voltage $V_{BG}$.

Circuit 4900 is implemented using a comparator block 4913 of a programmable device 4910. Comparator 4913 operates synchronously with clock source 4914. Analog input pin 4911 is connected to a negative input of the comparator 4913, while an internal reference voltage $V_{BG}$ 4912 is connected to the positive input of comparator 4913. The output Dour of comparator 4913 is connected to digital pin 4915. $D_{OUT}$ is a digital PDM signal that is filtered by a low pass filter. In one embodiment, the low pass filter is a RC network including resistor $R_{LP}$ 4901 and capacitor $C_{LP}$ 4902. These components operate in similar fashion as the corresponding components in voltage reference circuit 4600 illustrated in FIG. 46A.

The circuit 4900 also includes an attenuator that, in one embodiment, includes a resistive divider formed from resistors $R_{L1}$ 4903 and $R_{L2}$ 4904. The output node 4906 of the resistive divider has a voltage $V_{REF1}$ that is attenuated as compared to $V_{REF2}$ at output node 4905. Since the voltage $V_{REF1}$ is applied to analog input pin 4911 as a feedback voltage, the comparator 4913 outputs a signal $D_{OUT}$ to maintain $V_{REF1}$ close to $V_{BG}$. $V_{REF2}$ is therefore maintained at a voltage higher than $V_{BG}$. The value of reference voltage $V_{REF2}$ is shown in Equation 6 below.

$$V_{REF2} = V_{BG} \times \frac{(R_{L2} + R_{L1})}{R_{L2}} \quad \text{(Equation 6)}$$

Figure 50:
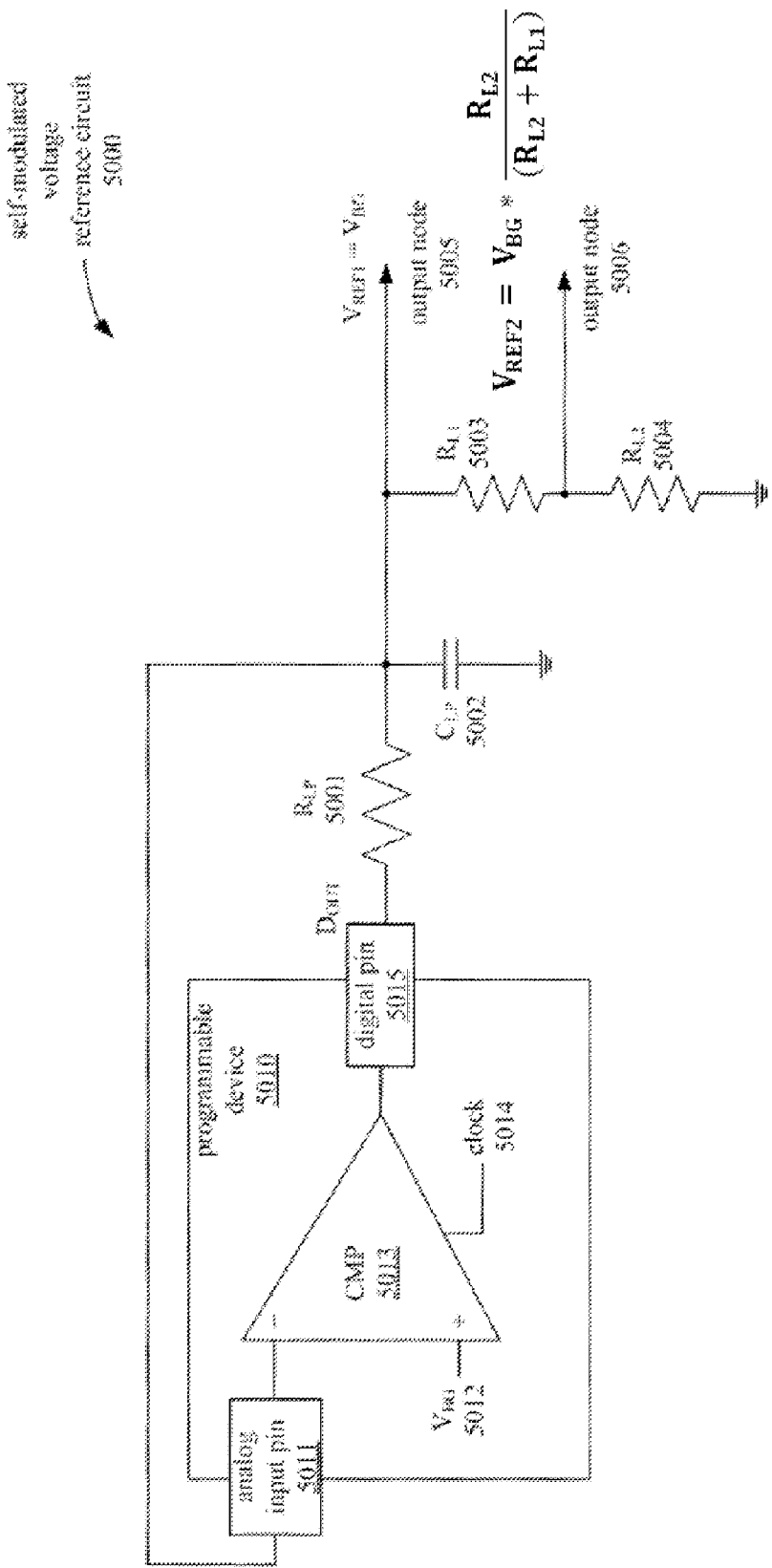
FIG. 50 illustrates a self-modulated voltage reference circuit according to an embodiment.

FIG. 50 illustrates a self-modulated voltage reference circuit 5000 that obtains an output reference voltage $V_{REF2}$ that is lower than the internal reference voltage $V_{BG}$.

Circuit 5000 is implemented using a comparator block 5013 of a programmable device 5010. Comparator 5013 operates synchronously with clock source 5014. Analog input pin 5011 is connected to a negative input of the comparator 5013, while an internal reference voltage $V_{BG}$ 5012 is connected to the positive input of comparator 5013. The output $D_{OUT}$ of comparator 5013 is connected to digital pin 5015. Dour is a digital PDM signal that is filtered by a low pass filter. In one embodiment, the low pass filter is a RC network including resistor $R_{LP}$ 5001 and capacitor $C_{LP}$ 5002. These components operate in similar fashion as the corresponding components in voltage reference circuit 4600 illustrated in FIG. 46A.

Circuit 5000 also includes an attenuator to reduce the output reference voltage. In one embodiment, the attenuator may be implemented using a resistive divider comprised of resistors $R_{L1}$ 5003 and $R_{L2}$ 5004. The resistive divider generates an output reference voltage $V_{REF2}$ that is less than $V_{REF1}$. The reference voltage is obtained as shown in Equation 7 below.

$$V_{REF2} = V_{BG} \times \frac{R_{L2}}{(R_{L2} + R_{L1})} \quad \text{(Equation 7)}$$

In one embodiment, the low pass filter used to obtain the DC voltage reference $V_{OUT}$, $V_{REF1}$, or $V_{REF2}$ from the digital signal $D_{OUT}$, $D_{OUT1}$, or $D_{OUT3}$ determines the settling time and accuracy of the output voltage reference signal. In one embodiment, the pole of the low pass filter may be chosen based on the frequency of the PWM (in the case of the PWM-DAC method illustrated in FIG. 45A) or based on the comparator clock frequency for the self-modulating method illustrated in FIGS. 46-50. Considering $F_{CLK}$ as the internal clock frequency, the requirement for the low pass filter is given in Equation 8 below:

$$R_{LP} \times C_{LP} >> \frac{1}{(2 \times \pi \times F_{CLK})} \quad \text{(Equation 8)}$$

In one embodiment, the comparators 4603, etc may be implemented using comparator blocks such as comparator blocks 1831-1834 of core architecture 100, as illustrated in FIGS. 1 and 18. The comparator blocks may be connected to pins or other blocks such as PWM blocks via one or more programmable interconnects such as programmable interconnects 150 or 152, illustrated in FIG. 1.

Figure 51:
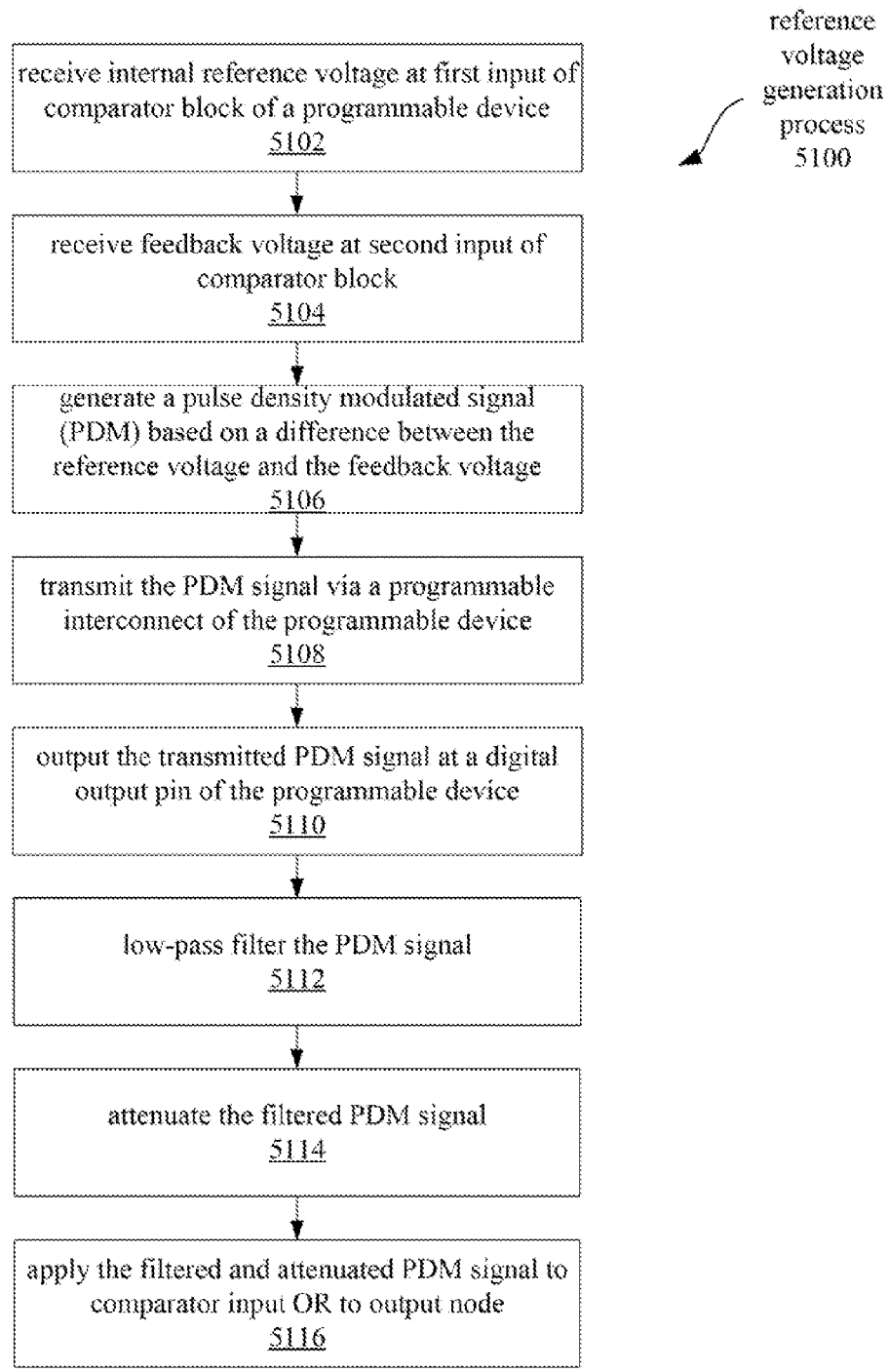
FIG. 51 is a flow diagram illustrating an embodiment of a method of generating a voltage reference.

FIG. 51 is a flow diagram illustrating a reference voltage generation process 5100. In one embodiment, a self-modulated voltage reference circuit as illustrated in FIGS. 46-50 may generate an output reference voltage by performing a process similar to process 5100.

Process 5100 begins at block 5102, where the voltage reference circuit receives an internal reference voltage at a first input of a comparator block of a programmable device. For example, in voltage reference circuit 4600, the comparator 4603 may receive an internal reference voltage $V_{BG}$ 4602 at its positive input. From block 5102, process 5100 continues at block 5104.

At block 5104, the voltage reference circuit receives a feedback voltage at a second input of the comparator block. For example, in the circuit 4600, comparator 4603 receives a voltage Vow as a feedback voltage at its negative input. In one embodiment, the feedback voltage is received via an analog input pin such as analog input pin 4601. From block 5104, process 5100 continues at block 5106.

At block 5106, the voltage reference circuit generates a pulse density modulated (PDM) signal based on a difference between the reference voltage and the feedback voltage. For example, in circuit 46, the comparator 4603 generates a PDM output signal $D_{OUT}$ based on the voltages $V_{OUT}$ and $V_{BG}$ at its inputs. In one embodiment, the PDM signal output from comparator 4603 is synchronous with clock 4604. From block 5106, process 5100 continues at block 5108.

At block 5108, the voltage reference circuit transmits the PDM signal via a programmable interconnect of the programmable device. For example, the comparator 4603 may transmit the PDM signal $D_{OUT}$ to digital pin 4605 through a programmable interconnect such as analog interconnect 150 illustrated in FIG. 1. In FIG. 46A, the programmable interconnect may be represented by the connection between comparator 4603 and digital pin 4605. From block 5108, process 5100 continues at block 5110.

At block 5110, the voltage reference circuit outputs the transmitted PDM signal at a digital output pin of the programmable device. For example, in circuit 4600, the PDM signal $D_{OUT}$ is applied to digital pin 4605, from which $D_{OUT}$ is accessible outside the programmable device 4610. From block 5110, process 5100 continues at block 5112.

At block 5112, the voltage reference circuit low-pass filters the PDM signal. For example, in circuit 4600, the PDM signal Dow is filtered by a low pass filter comprised of an RC network. In one embodiment, the RC network includes a resistor $R_{LP}$ 4606 and a capacitor $C_{LP}$ 4607. As illustrated in FIG. 46A, the output of the low pass filter is the output node 4608 between $R_{LP}$ 4606 and $C_{LP}$ 4607. From block 5112, process 5100 continues at block 5114.

At block 5114, the voltage reference circuit attenuates the filtered PDM signal. In one embodiment, the attenuation of the PDM signal occurs after the PDM signal is output at a digital pin. For example, with regard to circuit 4900 of FIG. 49, the signal $D_{OUT}$ that is output at digital pin 4915 is low pass filtered, then attenuated using a resistive divider comprised of $R_{L1}$ 4903 and $R_{L2}$ 4904. In an alternative embodiment, the PDM signal $D_{OUT}$ is attenuated before being output at a digital pin. For example, with regard to circuit 4700 of FIG. 47, the PDM signal $D_{OUT1}$ output from the comparator 4713 is attenuated by an attenuator comprising PWM 4714 and AND gate 4717. The PWM 4714 and AND gate may be used to reduce the density of pulses in the PDM signal $D_{OUT1}$. In one embodiment, the attenuated PDM signal DOUT2 is then low pass filtered by a low pass filter as described at block 5112. From block 5114, process 5100 continues at block 5116.

At block 5116, the voltage reference circuit applies the filtered and attenuated PDM signal to a comparator input or to an output node. For example, circuit 4700 applies the filtered and attenuated PDM signal $V_{REF1}$ to a comparator input. Specifically, circuit 4700 applies $V_{REF1}$ to analog input 4711 connected to the negative input of comparator 4713. Alternatively, a circuit may apply the filtered and attenuated PDM signal to an output node. For example, circuit 4800 applies the attenuated and filtered voltage $V_{REF2}$ to output node 4805.

As described above, embodiments of a self-modulated voltage reference circuit may be used to obtain analog voltage reference values from programmable devices having limited analog output capability. Such embodiments can also be used in systems that have analog capabilities already used for other purpose. Various embodiments may also be combined with attenuators to obtain reference voltages having values other than that of an internal voltage reference.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit, comprising:
    a digital output pin of a programmable device;
    a comparator block within the programmable device, wherein the comparator block is configured to output a signal based on a difference between a first input of the comparator block and a second input of the comparator block;
    an internal reference voltage source that is internal to the the programmable device and that provides an internal reference voltage, wherein the internal reference voltage source is coupled with the first input of the comparator block;
    an analog input pin of the programmable device, wherein the analog input pin is coupled with a second input of the comparator block; and
    a feedback network coupled between the digital output pin and the analog input pin and configured to apply at the analog input pin a voltage that is approximately equal to the internal reference voltage, wherein the feedback network comprises an external filter.

2. The circuit of claim 1, further comprising a programmable interconnect within the programmable device, wherein the programmable interconnect is coupled with the digital output pin, and wherein the comparator block is coupled with the programmable interconnect.

3. The circuit of claim 2, wherein the programmable interconnect is further configured to connect the analog input pin with the second input of the comparator block.

4. The circuit of claim 1, wherein the programmable device comprises a microcontroller.

5. The circuit of claim 1, wherein the external filter comprises a low pass filter.

6. The circuit of claim 1, wherein the external filter comprises a resistor-capacitor (RC) network.

7. The circuit of claim 1, further comprising an attenuator coupled with the output of the comparator block, wherein the attenuator is configured to attenuate the output reference voltage.

8. The circuit of claim 7, wherein the attenuator comprises a divider network, wherein the divider network is configured to attenuate the output reference voltage by dividing an output voltage of the external filter.

9. The circuit of claim 1, further comprising an attenuator coupled with the output of the comparator block, wherein the attenuator is configured to attenuate a feedback voltage.

10. The circuit of claim 9, wherein the attenuator comprises a divider network, and wherein the divider network is configured to attenuate the feedback voltage by dividing an output voltage of the external filter and applying the divided output voltage to the analog input pin.

11. The circuit of claim 1, further comprising a clock source coupled with the comparator block, wherein the comparator is configured to operate synchronously with the clock source.

12. The circuit of claim 1, further comprising a hysteresis network coupled with the comparator, wherein the hysteresis network is configured to add hysteresis to an output of the comparator block.

13. The circuit of claim 1, wherein the signal is a pulse density modulated (PDM) signal.

14. The circuit of claim 1, wherein the signal is a pulse width modulated (PWM) signal.

15. A method, comprising:
receiving an internal reference voltage of a programmable device at a first input of a comparator block of the programmable device, wherein the internal reference voltage is received from an internal reference voltage source that is internal to the programmable device;
receiving a feedback voltage at a second input of the comparator block;
generating a signal based on a difference between the reference voltage and the feedback voltage;
outputting the signal at a digital output pin of the programmable device; and
filtering the signal to generate an output reference voltage, wherein filtering the signal comprises applying the feedback voltage to the second input of the comparator block through a feedback network comprising an external filter, wherein the feedback voltage is approximately equal to the internal reference voltage.

16. The method of claim 15, further comprising transmitting the signal via a programmable interconnect of the programmable device.

17. The method of claim 16, wherein the programmable interconnect is further configured to connect an analog input pin with the second input of the comparator block.

18. The method of claim 15, wherein filtering the signal comprises applying the signal to a low pass filter.

19. The method of claim 15, wherein filtering the signal comprises applying the signal to a resistor-capacitor (RC) network.

20. The method of claim 15, wherein the output reference voltage is lower than the internal reference voltage.

21. The method of claim 20, wherein generating the output reference voltage comprises attenuating the output reference voltage.

22. The method of claim 20, wherein generating the output reference voltage comprises dividing the output reference voltage using a resistive divider.

23. The method of claim 15, wherein the output reference voltage is higher than the internal reference voltage.

24. The method of claim 23, wherein generating the output reference voltage comprises attenuating the signal.

25. The method of claim 23, wherein generating the output reference voltage comprises dividing the signal to generate the feedback voltage and applying the feedback voltage to an analog input pin that is coupled to the second input of the comparator block.

26. The method of claim 15, further comprising a clock source coupled with the comparator block, wherein the comparator is configured to operate synchronously with the clock source.

27. The method of claim 15, further comprising adding hysteresis to an output of the comparator block.

28. The method of claim 15, wherein the signal is a pulse density modulated (PDM) signal.

* * * * *